(12) United States Patent
Watanabe et al.

(10) Patent No.: US 9,570,500 B2
(45) Date of Patent: Feb. 14, 2017

(54) SOLID-STATE IMAGING DEVICE, METHOD OF MANUFACTURING THE SAME, AND ELECTRONIC APPARATUS

(71) Applicant: Sony Corporation, Tokyo (JP)

(72) Inventors: Kazufumi Watanabe, Tokyo (JP); Yasushi Maruyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/942,691

(22) Filed: Nov. 16, 2015

(65) Prior Publication Data

US 2016/0079300 A1    Mar. 17, 2016

Related U.S. Application Data

(60) Continuation of application No. 14/563,036, filed on Dec. 8, 2014, which is a division of application No. (Continued)

(30) Foreign Application Priority Data

Feb. 10, 2009 (JP) ................................. 2009-028822
Jun. 22, 2009 (JP) ................................. 2009-148088

(51) Int. Cl.
*H01L 27/146* (2006.01)
*H04N 5/359* (2011.01)
(Continued)

(52) U.S. Cl.
CPC ..... *H01L 27/14645* (2013.01); *H01L 27/1463* (2013.01); *H01L 27/1464* (2013.01);
(Continued)

(58) Field of Classification Search
USPC .. 348/222.1, 273, 294, 308, 340; 250/208.1; 257/291, 292, 432
See application file for complete search history.

(56) References Cited

U.S. PATENT DOCUMENTS 7,116,880 B1 * 10/2006 Liu ..................... G02B 6/122
385/129
7,223,960 B2 * 5/2007 Mouli ............... H01L 27/14621
250/208.1
(Continued)

FOREIGN PATENT DOCUMENTS

JP    S60-233851    11/1985
JP    S61-133660    6/1986
(Continued)

OTHER PUBLICATIONS

Official Action (no English translation available) for Japanese Patent Application No. 2014-077135 mailed Oct. 20, 2015, 5 pages.
(Continued)

*Primary Examiner* — Twyler Haskins
*Assistant Examiner* — Akshay Trehan
(74) *Attorney, Agent, or Firm* — Sheridan Ross P.C.

(57) ABSTRACT

A solid-state imaging device includes: a pixel region in which a plurality of pixels composed of a photoelectric conversion section and a pixel transistor is arranged; an on-chip color filter; an on-chip microlens; and a multilayer interconnection layer in which a plurality of layers of interconnections is formed through an interlayer insulating film. The solid-state imaging device further includes a light-shielding film formed through an insulating layer in a pixel boundary of a light receiving surface in which the photoelectric conversion section is arranged.

30 Claims, 36 Drawing Sheets

Related U.S. Application Data

12/699,488, filed on Feb. 3, 2010, now Pat. No. 8,928,784.

(51) Int. Cl.
  *H01L 31/0216* (2014.01)
  *H01L 31/18* (2006.01)
  *H01L 21/78* (2006.01)

(52) U.S. Cl.
  CPC .. *H01L 27/14612* (2013.01); *H01L 27/14621* (2013.01); *H01L 27/14623* (2013.01); *H01L 27/14627* (2013.01); *H01L 27/14629* (2013.01); *H01L 27/14636* (2013.01); *H01L 27/14685* (2013.01); *H04N 5/359* (2013.01); *H01L 21/7806* (2013.01); *H01L 27/14632* (2013.01); *H01L 27/14687* (2013.01); *H01L 31/02162* (2013.01); *H01L 31/1804* (2013.01); *Y02P 70/521* (2015.11)

(56) References Cited

U.S. PATENT DOCUMENTS

| | | | |
|---|---|---|---|
| 7,741,666 B2* | 6/2010 | Nozaki | H01L 27/1464 257/292 |
| 2005/0077588 A1* | 4/2005 | Kasuga | H01L 27/14843 257/432 |
| 2005/0139828 A1* | 6/2005 | Maruyama | H01L 27/14625 257/59 |
| 2005/0179053 A1* | 8/2005 | Ezaki | H01L 27/14603 257/189 |
| 2006/0121727 A1 | 6/2006 | Metz et al. | |
| 2006/0226428 A1* | 10/2006 | Mouli | H01L 27/14632 257/59 |
| 2007/0045513 A1* | 3/2007 | Lee | H01L 27/1464 250/208.1 |
| 2007/0096176 A1* | 5/2007 | Mouli | H01L 27/1463 257/291 |
| 2007/0210395 A1* | 9/2007 | Maruyama | H01L 27/14609 257/431 |
| 2008/0128845 A1 | 6/2008 | Hwang | |
| 2009/0078973 A1* | 3/2009 | Hsu | H01L 27/1464 257/292 |
| 2009/0200590 A1* | 8/2009 | Mao | H01L 27/1464 257/292 |
| 2010/0013973 A1* | 1/2010 | Adkisson | H04N 5/37452 348/308 |

FOREIGN PATENT DOCUMENTS

| | | |
|---|---|---|
| JP | 2004-281499 | 10/2004 |
| JP | 2005-101864 | 4/2005 |
| JP | 2007-258684 | 10/2007 |
| JP | 2008-182185 | 8/2008 |
| JP | 2008-300614 | 12/2008 |
| JP | 2009-088030 | 4/2009 |
| JP | 2009-088430 | 4/2009 |
| JP | 2009-522814 | 6/2009 |
| JP | 2011-003860 | 1/2011 |
| KR | 10-2007-0088378 | 8/2007 |
| WO | WO 2007/127607 | 11/2007 |

OTHER PUBLICATIONS

Official Action (no English translation available) for Japanese Patent Application No. 2015-083988 mailed Apr. 26, 2016, 6 pages.
Official Action (with English translation) for Korean Patent Application No. 10-2010-0005089 mailed Mar. 16, 2016, 13 pages.
Official Action (with English translation) for Korean Patent Application No. 10-2010-0005089 mailed Nov. 16, 2016, 9 pages.
Official Action (with English translation) for Korean Patent Application No. 10-2016-0128967 mailed Nov. 16, 2016, 12 pages.
Official Action (no English translation available) for Japanese Patent Application No. 2015083988 mailed Nov. 29, 2016, 13 pages.

* cited by examiner

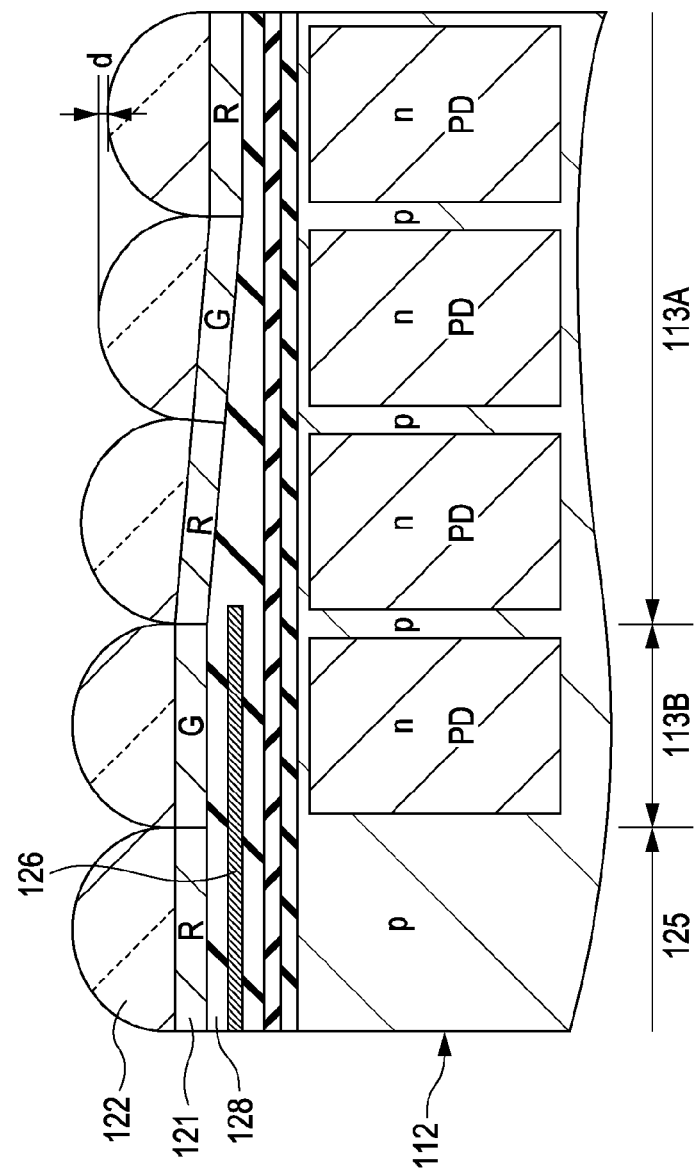

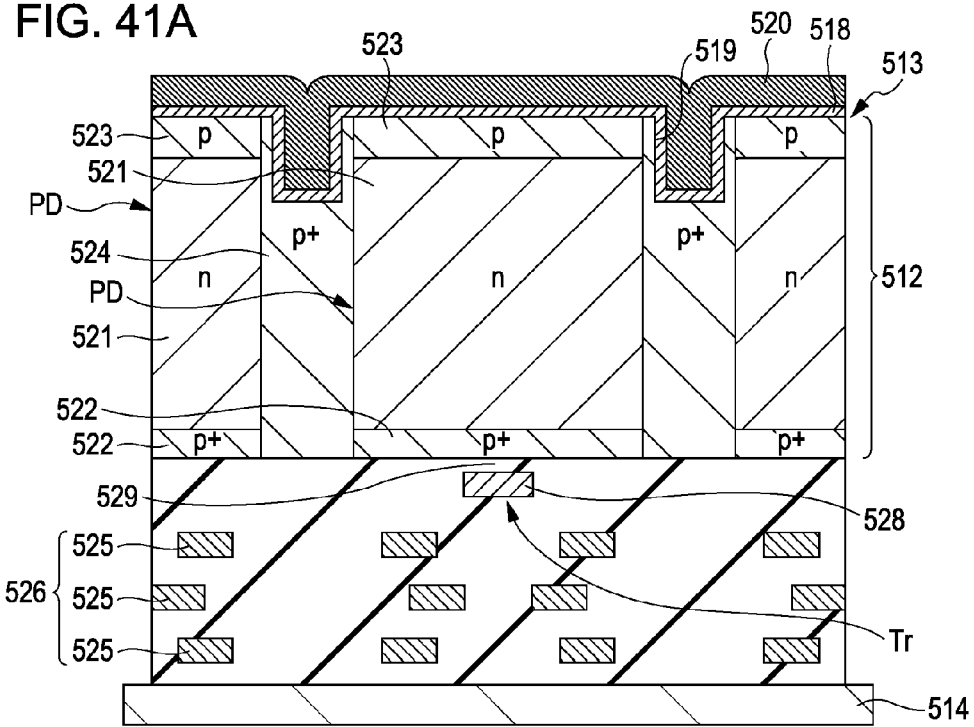
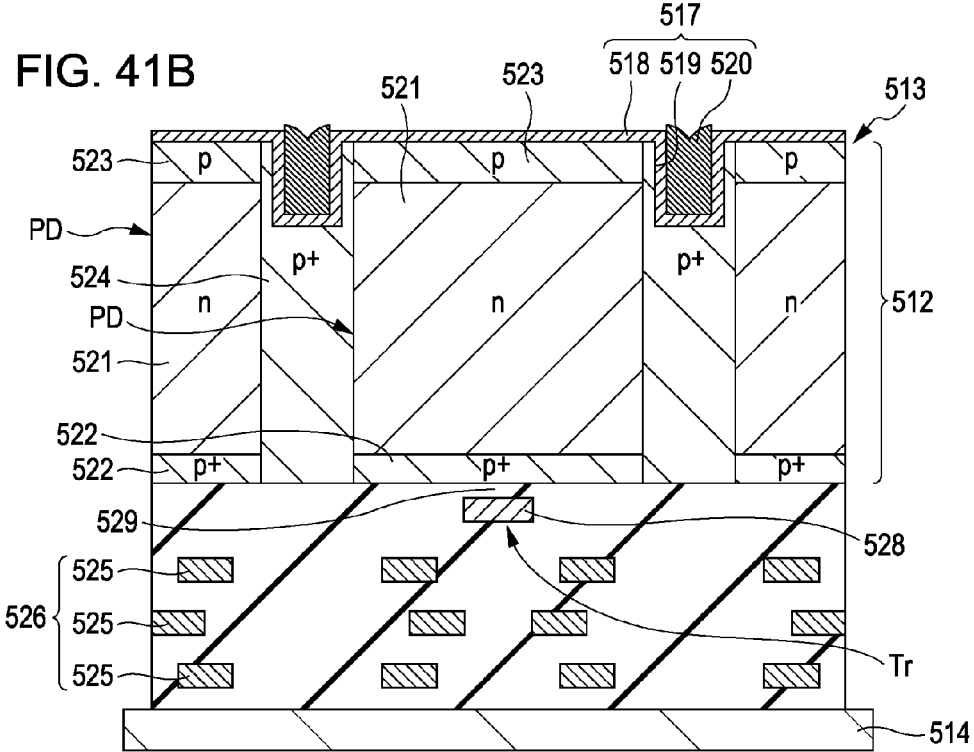

SOLID-STATE IMAGING DEVICE, METHOD OF MANUFACTURING THE SAME, AND ELECTRONIC APPARATUS

CROSS-REFERENCE TO RELATED APPLICATIONS

This application is a continuation of U.S. patent application Ser. No. 14/563,036, filed Dec. 8, 2014, which is a division of U.S. patent application Ser. No. 12/699,488, filed Feb. 3, 2010, now U.S. Pat. No. 8,928,784, which claims priority to Japanese Patent Application Nos. JP 2009-028822 and JP 2009-148088, filed in the Japan Patent Office on Feb. 10, 2009 and Jun. 22, 2009, respectively, the entire disclosures of which are hereby incorporated herein by reference.

BACKGROUND OF THE INVENTION

1. Field of the Invention

The invention relates to a solid-state imaging device, a method of manufacturing the same, and an electronic apparatus such as a camera including the solid-state imaging device.

2. Description of the Related Art

A digital video camera or digital still camera which is for use by consumers has called for high resolution power to transmit details of a photographic subject and a reduced-size device with a regard to portability. In addition, in order to realize these demands, development on a reduction in the pixel size while maintaining the image capturing property has been performed in regard to a solid-state imaging device (image sensor). However, in recent years, in addition to existing demands for high resolution and reduction in size, demand has been increasing for improvement in low luminance for photographic subjects or high-speed image capturing and the like. In order to realize these, expectation has increased for improvement in comprehensive image quality starting from the SN ratio in the solid-state imaging device.

The CMOS solid-state imaging device is categorized into a front-illuminated device shown in FIG. 5 and a back-illuminated device shown in FIG. 6. The front-illuminated solid-state imaging device 111 includes a pixel region 113 where a plurality of unit pixels 116 composed of photodiode PDs, which become a photoelectric conversion section, and a plurality of pixel transistors, are formed in plural number on a semiconductor substrate 112, as shown in the schematic configuration diagram of FIG. 5. The pixel transistor (not shown) represents a gate electrode 114 in FIG. 5, representing schematically the presence of the pixel transistor. Each of the photodiodes PD is isolated by an element isolation region 115 formed of an impurity diffused layer. A multilayer of interconnection layers 119, in which a plurality of interconnections 118 is disposed through an interlayer insulating film 117, is formed on the surface side of a semiconductor substrate 112 where the pixel transistor is formed. The interconnection 118 is formed in other parts than those corresponding to the position of the photodiode PD. On the multilayer of the interconnection layers 119, an on-chip color filter 121 and an on-chip microlens 122 are formed in this order through a planarization film 120. The on-chip color filter 121 is constituted by arranging each color filter of, for example, red (R), green (G) and blue (B). In the front-illuminated solid-state imaging device 111, the light L is incident from the side of the substrate surface, on which the multilayer of the interconnection layers 119 is formed, using this substrate surface as a light receiving surface 123.

A back-illuminated type solid-state imaging device 131 includes the pixel region 113 where a plurality of unit pixels 116 composed of the photodiodes PD, which become a photoelectric conversion section, and a plurality of pixels transistors are formed in plural number on the semiconductor substrate 112, as shown in the schematic configuration diagram of FIG. 6. The pixel transistor (not shown) is formed on the surface side of the substrate, and represents a gate electrode 114 in FIG. 6, representing schematically the presence of the pixel transistor. Each of the photodiodes PD is isolated by the element isolation region 115 formed of an impurity diffused layer. The multilayer of the interconnection layers 119, in which a plurality of interconnections 118 is disposed through the interlayer insulating film 117, is formed on the surface side of the semiconductor substrate 112 where the pixel transistor is formed. In the back-illuminated device, the interconnection 118 can be formed regardless of the position of the photodiode PD. On the other hand, an insulating layer 128, the on-chip color filter 121 and the on-chip microlens 122 are formed in this order on the backside of the semiconductor substrate 112 to which the photodiode PD faces. In the back-illuminated solid-state imaging device 131, the light L is incident from the substrate backside, which is the side opposite to the substrate surface on which the multilayer of the interconnection layers 119 and the pixel transistor are formed, using this substrate backside as a light receiving surface 132. Since the light L is incident to the photodiode PD with no restriction of the multilayer of the interconnection layers 119, apertures of the photodiode PD can be broadly taken, and high sensitivity can be achieved.

The present applicants have succeeded in the development of experimental production of a back-illuminated CMOS solid-state imaging device that improves sensitivity, which is one of the main elements for high image quality and noise reduction rate by changing the basic structure of pixels to the back-illuminated type without losing the advantages of low power consumption and high speed that the CMOS solid-state imaging device has. This developed back-illuminated CMOS solid-state imaging device has 5 million effective pixels, each pixel size being 1.75 µm×1.75 µm, and is driven at a rate of 60 frames per second.

In the front-illuminated device of a related art, the interconnection 118 or the pixel transistor on the surface side of a substrate, where the photodiodes PD are formed, hinders the incident light collected with an on-chip microlens, which is an issue in reduction of pixel size and variation of incident angle. In comparison to this, in the back-illuminated device, applying the light from the backside inverted from the silicon substrate allows an increase in the amount of the light incident to unit pixels while also suppress sensitivity reduction in regard to angle variation of incident light with no influence of the interconnection 118 or the pixel transistor.

The back-illuminated CMOS solid-state imaging device is disclosed, for example, in Japanese Unexamined Patent Application Publication Nos. 2003-31785, 2005-353631, 2005-353955, and 2005-347707. In addition, a technique of using hafnium oxide (HfO$_2$) as an antireflection film used in the back-illuminated CMOS solid-state imaging device is disclosed in Japanese Unexamined Patent Application Publication No. 2007-258684.

Solid-state imaging devices are largely divided into a CCD (Charge Coupled Device) type solid-state imaging device and a CMOS (Complementary Metal Oxide Semiconductor) type solid-state imaging device.

In these solid-state imaging devices, the light-receiving portion composed of photodiodes is formed for each pixel.

In the light-receiving portion, signal charges are generated by photoelectric conversion by incident light to the light-receiving portion. In the CCD type solid-state imaging device, signal charges generated in the light-receiving portion are transferred to a charge transfer portion that has the CCD structure and output in the output portion as converted to pixel signals. On the other hand, in the CMOS type solid-state imaging device, signal charges generated in the light-receiving portion are amplified for each pixel and the amplified signals are output as pixel signals by signal ray.

In such solid-state imaging device, there are problems that aliasing is generated in a semiconductor substrate by tilted incident light or incident light diffusely reflected in the upper portion of the light-receiving portion, and optical noise such as smear, flare is generated.

Japanese Unexamined Patent Application Publication No. 2004-140152 mentioned below describes the constitution of the CCD type solid-state imaging device that allows the suppression of smear generation by forming a light-shielding film, which is formed in the upper portion of the charge transfer portion, to be buried in the groove portion that is formed in the interface between the light-receiving portion and the read gate portion. Since the CCD type solid-state imaging device in Japanese Unexamined Patent Application Publication No. 2004-140152 is constituted to form the light-shielding film in the groove portion formed using the LOCOS oxide film, it is difficult to form the light-shielding film deep in the substrate, and not possible to completely prevent incidence of tilted light, which is a cause of smear. In addition, since the pixel area is reduced in proportion to the burying depth of the light-shielding film, it is practically difficult to bury deep the light-shielding film.

In recent years, a back-illuminated solid-state imaging device has been proposed, in which the light is applied from the side opposite to the side of the substrate on which the interconnection layer is formed (see Japanese Unexamined Patent Application Publication No. 2004-71931 described below). In the back-illuminated solid-state imaging device, the light application side does not include the interconnection layer, the circuit element and the like, and thereby the aperture rate of the light-receiving portion formed on the substrate can be enhanced. Furthermore, since the incident light is incident to the light-receiving portion with no reflecting to the interconnection layer and the like, sensitivity is improved.

Even in such a back-illuminated solid-state imaging device, there is a concern about optical noise due to tilted light, and thus a light-shielding film is preferably formed between the light-receiving portions of the backside of the substrate, which becomes the light application side. In this case, a layer, that has the light-shielding film on the backside of the substrate that becomes the light application side, may be considered to be formed as one layer. However, the distance between the substrate and the on-chip lens side is lengthened in proportion to the height of the light-shielding film, and thus deterioration of light-collecting property may occur. When the light-collecting property is deteriorated, problems may occur such that the tilted light transmitted through a color filter of other pixels is incident to the light-receiving portion of different pixels from the pixels, and color mixing and sensitivity reduction are also generated.

Meanwhile, it has been found that in the back-illuminated CMOS solid-state imaging device, the light-collecting structure made of only the on-chip microlens 122 has following problems remarkably that may happen.

(1) It is very difficult to completely suppress optical color mixing with adjacent pixel. It may not be a problem in use such as monitoring, cellular phone, but color mixing has to be further reduced in use of audio/video (AV) (camcorder, digital still camera and the like).

(2) A light-shielding film is provided in the effective pixel peripheral portion to prevent noise in the peripheral circuit region and determine optical black level. However, the light-collecting state changes in the effective pixel peripheral portion by level difference of the light-shielding film, and thus uniform optical property is not realized. That is, as shown in FIG. 4, the light-shielding film 126 is formed through the insulating film 127 from optical black level region (so-called optical black region) 113B outside the effective pixel region 13A to the peripheral circuit section 125. On top of this, the on-chip color filter 121 and the on-chip microlens 122 are formed. At this time, height difference d of the lens surface of the on-chip microlens 122 occurs by the level difference by presence or absence of the light-shielding film 126, in the peripheral portion of the effective pixel region 113A and the central part in the inside thereof. The light-collecting state changes due to this height difference d, and the peripheral portion becomes dark in comparison to the brightness of the central part of the effective pixel region, and thus uniform optical property is not obtained. So-called sensitivity unevenness happens.

(3) Reflection happens by the on-chip microlens 122 or the on-chip color filter 121 in photographing using high-intensity light source. Diffracted light is reflected to the seal glass and the like on the package of the solid-state imaging device, and further incident thereto, and color mixing happens uniformly to the RGB pixel. By this color mixing, streaky image defect of Mg color (hereinafter, called as flare of Mg color) happens in a radial fashion from the high-intensity light source, which is unique in the back-illuminated solid-state imaging device.

Specifically, the problems will be described using the green pixel 151G and the red pixel 151R of FIG. 3 A. The light L that is incident to the on-chip microlens 122 of the green pixel 151G, is incident to the photodiode PD of the green pixel through the green filter 121G. However, some tilt light La is incident to the photodiode PD of the red pixel 151R that is adjacent to the pixel boundary. This is shown with simulation of the light intensity when the light of 550 nm wavelength is incident to two pixels of the green pixel and the red pixel of FIG. 3 B. In FIG. 3 B, the regional part A represents a part where the light intensity is strong, the light-colored regional part B represents a part where the light intensity is weak, and the heavy-colored regional part (streaky part) C represents a part where the light intensity is almost absent. The fine periodical streak pattern shows the progress of the light wave surface. If the light is looked at, which is incident to the photodiode PD under the light receiving surface 153, it is found that weak light is incident to the photodiode PD of the red pixel 151R, and color mixing happens in the region D shown in the round shape near the pixel boundary.

On the other hand, as shown in FIG. 1, a seal glass 135 is disposed through a space 134 in the window of the incident light side of the package (not shown) where the back-illuminated CMOS solid-state imaging device 131 is stored. Furthermore, an optical low-pass filter 136 is disposed on this seal glass 135 through the space 134, and an infrared cutoff filter 137 is disposed on this through the space 134. Furthermore, a camera lens 138 is disposed on the upper side. The incident light L1, which transmits the camera lens 138 and incident to the solid-state imaging device 131, is reflected partially at each medium interface of the solid-state image capturing element 131. The incident light L1 is mainly reflected at the lens surface of the on-chip microlens 122, and the silicon surface that becomes the light receiving surface. The on-chip microlens 122 is periodically arranged, and thus diffraction phenomenon occurs. The reflected and diffracted light L2, which has been reflected in the solid-state imaging device 131, is reflected in various angles such as nearly vertical reflection, distant-direction reflection. The light L2 is reflected at the seal glass 135, the optical low-pass filter 136 and the infrared cutoff filter 137, and is incident again to the solid-state imaging device 131 as re-incident light L3. Among them, the light diffracted at great angle is reflected at the seal glass 135, and incident again to the solid-state imaging device 131, which becomes Mg flare 141 in a radial fashion shown in FIG. 2 (see the circular frame E). The white streak (white flare) 142 in a radial fashion occurs due to the iris in camera lens side, and is a phenomenon that also occurs in the front-illuminated solid-state imaging device, and cause no such uncomfortable feeling. However, Mg flare 141, which is unique in the back-illuminated solid-state imaging device, is noticeable in comparison to the back green, for example, when photographing is taken for sunbeams streaming through leaves, and becomes problems.

Happening of this Mg flare 141 is due to the treatment of the white balance in the process of the signal processing for uniform spectroscopic characteristics of red (R), green (G) and blue (B). Although color mixing is performed for each pixel to be equal by re-incidence of the diffracted light, Mg flare happens since signals of red (R) and blue (B) come to have greater gain in comparison to that of green (G), and thus are emphasized with the white balance treatment.

In the back-illuminated solid-state imaging device, Mg flare may happen by above-described optical color mixing and reflected light by leakage of incident light to adjacent pixel. However, optical color mixing to adjacent pixel may happen also in the front-illuminated solid-state imaging device.

SUMMARY OF THE INVENTION

Under the reflection of above-described points, the invention is to provide a solid-state imaging device, a method of manufacturing the same, and an electronic apparatus, which improve image quality by reduction of optical color mixing and/or Mg flare.

The invention is to provide a back-illuminated solid-state imaging device and a method of manufacturing the same, which improves light-collecting property, and suppresses optical noise such as flare or smear. In addition, the invention provides an electronic apparatus including the solid-state imaging device.

According to an embodiment of the present invention, there is provided an solid-state imaging device including: a pixel region in which a plurality of pixels composed of a photoelectric conversion section and a pixel transistor is arranged; an on-chip color filter; an on-chip microlens; and a multilayer interconnection layer in which a plurality of layers of interconnections is formed through an interlayer insulating film. The solid-state imaging device further includes a light-shielding film formed through an insulating layer in a pixel boundary of a light receiving surface in which the photoelectric conversion section is arranged.

The solid-state imaging device according to the invention includes the light-shielding film formed in the pixel boundary of the light receiving surface, in which the photoelectric conversion section is arranged, through the insulating layer, therefore, the light which is not collected by the on-chip microlens is prevented from entering the adjacent pixel by the light-shielding film. In addition, the incidence of the diffracted light on the effective pixel is suppressed by this light-shielding film of the pixel boundary.

According to another embodiment of the present invention, there is provided a method of manufacturing a solid-state imaging device including the steps of: forming an antireflection film on a backside used as a light receiving surface of a semiconductor substrate in which a plurality of pixels composed of a photoelectric conversion section and a pixel transistor is formed; and forming a light-shielding film selectively in a portion corresponding to a pixel boundary on the antireflection film. After that, the method according to the invention includes the steps of: forming a planarization film on the antireflection film that includes the light-shielding film; and forming an on-chip color filter and an on-chip microlens sequentially on the planarization film.

In the method of manufacturing the solid-state imaging device according to the invention, since the antireflection film is formed on the backside used as the light receiving surface of the semiconductor substrate, and the light-shielding film is selectively formed in a portion corresponding to the pixel boundary on the antireflection film, it is possible to form the light-shielding film in a position close to the light receiving surface. The incidence of the light which is not collected by the on-chip microlens is suppressed from entering the adjacent pixel by this light-shielding film, and also the incidence of the diffracted light on the effective pixel is suppressed. Since the antireflection film is formed on the light receiving surface, reflection from the light receiving surface of the backside of the semiconductor substrate is suppressed. Since the planarization film is formed on the antireflection film including the light-shielding film, the problem of level difference of the on-chip microlens in the effective pixel region is resolved.

According to another embodiment of the present invention, there is provided a method of manufacturing a solid-state imaging device including the steps of: forming an antireflection film on a backside used as a light receiving surface of a semiconductor substrate in which a plurality of pixels composed of a photoelectric conversion section and a pixel transistor is formed; and forming an insulating film on the antireflection film. After that, the method according to the invention includes the steps of: forming a light-shielding film selectively in a portion corresponding to a pixel boundary on the insulating film; and forming a planarization film on the antireflection film that includes the light-shielding film; and forming an on-chip color filter and an on-chip microlens sequentially on the planarization film.

In the method of manufacturing the solid-state imaging device according to the invention, the insulating film is formed on the antireflection film, and the light-shielding film is selectively formed in a portion corresponding to the pixel boundary on this insulating film. A film thickness of the insulating film is sufficiently thick compared to a film thickness of the antireflection film, even though the insulating film is more or less cut due to selective processing of the light-shielding film, spectroscopic sensitivity characteristics are not affected to a great extent. Since the light-shielding film is formed a position close to the light receiving surface, the light which is not collected by the on-chip microlens is suppressed from being incident on the adjacent pixel, and also the incidence of the diffracted light on the effective pixel is suppressed. Since the antireflection film is formed on the light receiving surface, reflection from the light receiving surface of the backside of the semiconductor substrate is suppressed. Since the planarization film is formed on the antireflection film including the light-shielding film, the problem of level difference of the on-chip microlens in the effective pixel region is resolved.

According to another embodiment of the present invention, there is provided a solid-state imaging device including: a pixel region in which a plurality of pixels composed of a photoelectric conversion section and a pixel transistor is arranged; an on-chip color filter; and an on-chip microlens having an antireflection film on a lens plane of a surface thereof. Further, the solid-state imaging device includes a multilayer interconnection layer in which a plurality of layers of interconnections is formed through an interlayer insulating film. In the solid-state imaging device, the pixel transistor and the multilayer interconnection layer are configured as a back-illuminated type formed in a side opposite to a light receiving surface in which the photoelectric conversion section is arranged.

In the solid-state imaging device according to the invention, since the antireflection film is formed along the lens plane of the surface of the on-chip microlens in the back-illuminated type, the reflected light from the surface of the on-chip microlens is reduced, and the intensity of the diffracted light is reduced.

According to another embodiment of the present invention, there is provided a solid-state imaging device including: a pixel region in which a plurality of pixels composed of a photoelectric conversion section and a pixel transistor is arranged; an on-chip color filter formed in a light receiving surface of the pixel region; and an on-chip microlens formed on the on-chip color filter. Further, the solid-state imaging device includes: a transparent planarization film, which is uniformly and continuously formed on each of the on-chip microlenses corresponding to a plurality of pixels; and a multilayer interconnection layer in which a plurality of layers of interconnections is formed through an interlayer insulating film. In the solid-state imaging device, the pixel transistor and the multilayer interconnection layer are configured as a back-illuminated type formed in a side opposite to the light receiving surface of the pixel region.

In the solid-state imaging device according to the invention, since the planarization film is formed uniformly and continuously on each of the on-chip microlenses corresponding to a plurality of pixels, the problem of periodic concavity and convexity in the on-chip microlens is solved, and generation of the diffracted light is suppressed. Herewith, the incidence of the diffracted light on the effective pixel is suppressed.

According to another embodiment of the present invention, there is provided an electronic apparatus including: a solid-state imaging device, an optical system that leads incident light to the solid-state imaging device, and a signal processing circuit that processes an output signal of the solid-state imaging device. The solid-state imaging device includes: a pixel region in which a plurality of pixels composed of a photoelectric conversion section and a pixel transistor is arranged; an on-chip color filter; and an on-chip microlens. Further, the solid-state imaging device includes: a multilayer interconnection layer in which a plurality of layers of interconnections is formed through an interlayer insulating film; and a light-shielding film formed through an insulating layer in a pixel boundary of a light receiving surface in which the photoelectric conversion section is arranged.

The electronic apparatus according the invention includes the solid-state imaging device having the light-shielding film in the pixel boundary according to the invention. Therefore, in the solid-state imaging device, it is possible to prevent the light which is not collected by the on-chip microlens from entering the adjacent pixel, and to block the incidence of the diffracted light on the effective pixel.

In order to address the above-identified and other problems, the solid-state imaging device according to the invention includes a substrate, an interconnection layer, and a light-shielding portion. A plurality of light-receiving portions is formed in the substrate, and the backside of the substrate is used as a light illumination surface. In addition, the interconnection layer is formed in surface side of the substrate. In addition, the light-shielding portion is formed between the adjacent light-receiving portions, and is constituted by a trench portion formed in a desired depth from the backside of the substrate, and a light-shielding film buried within the trench portion.

In the solid-state imaging device according to the invention, a plurality of light-receiving portions formed in the substrate is isolated by the light-shielding portion formed by burying the trench portion, which is formed in a desired depth from the backside of the substrate, with the light-shielding film. For this reason, when the oblique light enters from the backside of the substrate used as a light illumination surface, the oblique incident light is shielded by the light-shielding portion. Herewith, the incidence of the oblique light on the light-receiving portion formed in the substrate is suppressed.

Further, according to another embodiment of the present invention, there is provided a method of manufacturing a solid-state imaging device including the steps of: first, forming a plurality of light-receiving portions and a desired impurity region in a surface region of a substrate in which an etching stopper layer is formed in a backside region thereof; and next, forming an interconnection layer, which is composed of a plurality of layers of interconnections formed through an interlayer insulating film, in a surface side of the substrate. Next, the method includes the step of thinning the substrate from the backside of the substrate. In the thinning step, etching is performed up to the etching stopper. Next, the method includes the step of forming a trench portion that reaches a desired depth from the backside of the substrate passing through the substrate. Next, the method includes the step of forming a burying film in a trench portion formed in the substrate, and thinning the substrate by using the burying film as a stopper. Next, the method includes the step of burying a light-shielding film in the trench portion, after the burying film is removed.

In the method of manufacturing the solid-state imaging device according to the invention, the optical lens, the above-mentioned solid-state imaging device, and the signal processing circuit are included.

With the solid-state imaging device according to the invention, the incidence of the light on the adjacent pixel is suppressed by the light-shielding film of the pixel boundary, to thereby allow optical color mixing to be reduced. In addition, the incidence of the diffracted light on the effective pixel is suppressed by the light-shielding film of the pixel boundary, to thereby allow generation of Mg flare to be reduced. Therefore, it is possible to achieve improvement in an image quality by reduction in optical color mixing and/or reduction in Mg flare.

With the method of manufacturing the solid-state imaging device according to the invention, it is possible to manufacture a solid-state imaging device capable of achieving improvement in an image quality by reduction in optical color mixing and/or reduction in Mg flare.

With the solid-state imaging device according to the invention, in the back-illuminated device, the antireflection film is formed in the surface of the on-chip microlens, and the intensity of the diffracted light is reduced by reducing the reflected light from the on-chip microlens, to thereby allow generation of Mg flare to be reduced, and to allow improvement in an image quality to be achieved.

With the solid-state imaging device according to the invention, in the back-illuminated device, the planarization film is uniformly and continuously formed on each of the on-chip microlenses, and the incidence of the diffracted light on the effective pixel is suppressed, to thereby allow generation of Mg flare to be reduced, and to allow improvement in an image quality to be achieved.

With the electronic apparatus according to the invention, in the solid-state imaging device, optical color mixing can be reduced, and Mg flare can be reduced, to thereby allow a high-quality image to be obtained.

According to the invention, it is possible to improve flare characteristics or smear characteristics, and to obtain a solid-state imaging device in which color mixing or blooming is suppressed. In addition, an electronic apparatus, in which improvement in an image quality is achieved, is obtained by using such a solid-state imaging device.

BRIEF DESCRIPTION OF THE DRAWINGS

FIG. 4 is an explanatory diagram illustrating that the difference in a lens height of an on-chip microlens of an effective pixel region is generated in the back-illuminated solid-state imaging device of the related art;

FIGS. 41A and 41B are manufacturing process diagrams of the solid-state imaging device according to the sixteenth embodiment;

DESCRIPTION OF THE PREFERRED EMBODIMENTS

Figure 1:
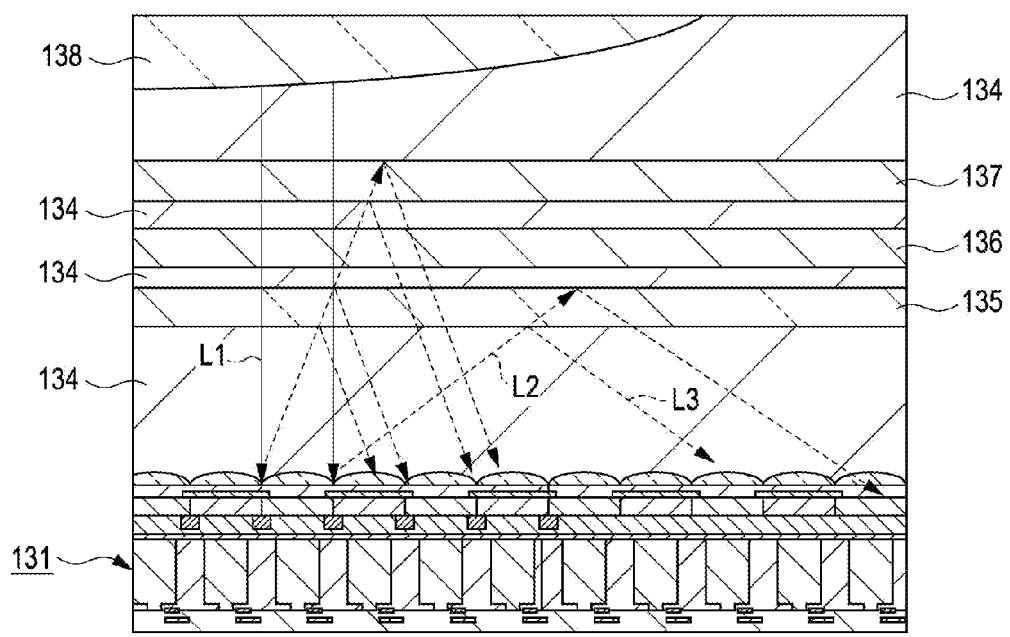
FIG. 1 is an explanatory diagram illustrating of a reflection state of incident light in a back-illuminated solid-state imaging device of the related art.
Figure 2:
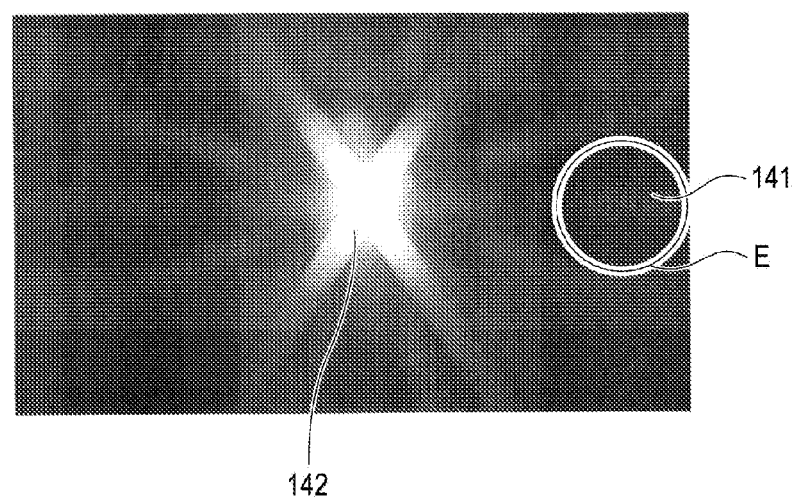
FIG. 2 is an explanatory diagram illustrating a state where Mg flare is generated in the back-illuminated solid-state imaging device of the related art.
Figure 3A:
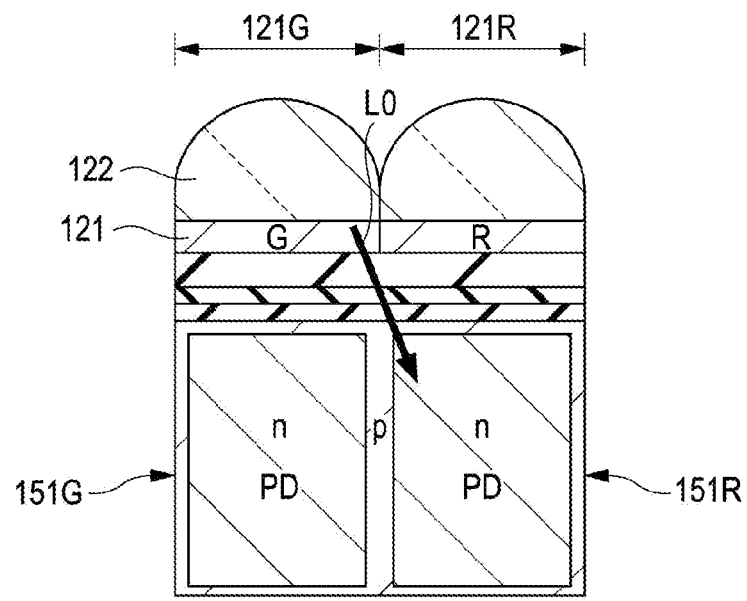
FIGS. 3A and 3B are explanatory diagrams illustrating generation of optical color mixing in an adjacent pixel of the back-illuminated solid-state imaging device of the related art.
Figure 3B:
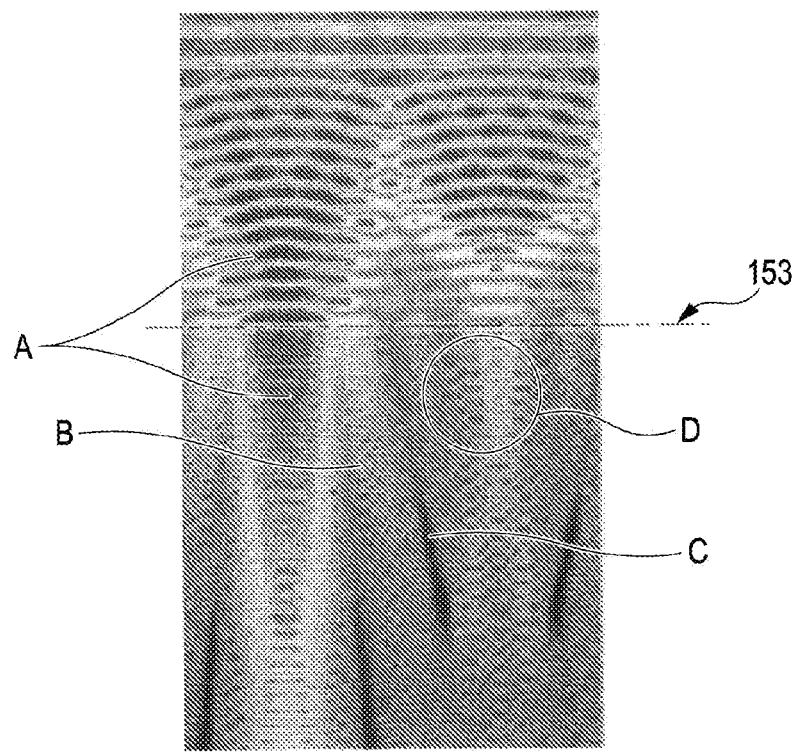
Figure 5:
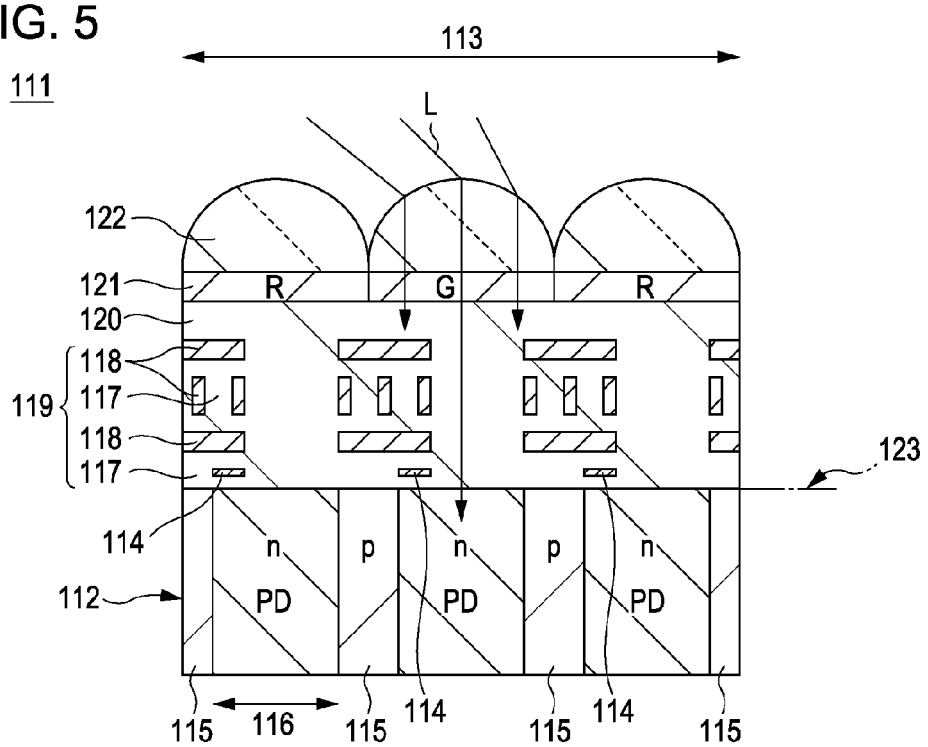
FIG. 5 is a schematic diagram illustrating a front-illuminated solid-state imaging device of the related art.
Figure 6:
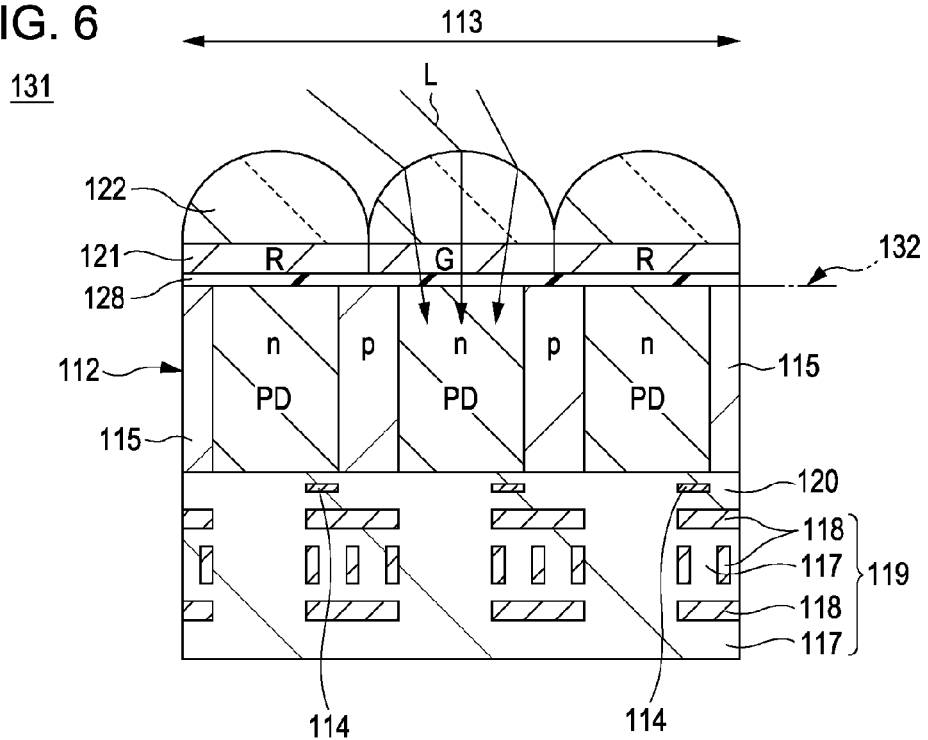
FIG. 6 is a schematic diagram illustrating the back-illuminated solid-state imaging device of the related art.

Hereinafter, best mode for carrying out the invention (hereinafter, referred to as the embodiment) will be described.

The description is performed in the following order.
1. Schematic Configuration Example of CMOS Solid-State Imaging Device
2. First Embodiment (Configuration Example of Solid-State Imaging Device and Example of Method of Manufacturing the Same)
3. Second Embodiment (Configuration Example of Solid-State Imaging Device and Example of Method of Manufacturing the Same)
4. Third Embodiment (Configuration Example of Solid-State Imaging Device)
5. Fourth Embodiment (Configuration Example of Solid-State Imaging Device)
6. Fifth Embodiment (Configuration Example of Solid-State Imaging Device)
7. Sixth Embodiment (Configuration Example of Solid-State Imaging Device)
8. Seventh Embodiment (Configuration Example of Solid-State Imaging Device)
9. Eighth Embodiment (Configuration Example of Solid-State Imaging Device)
10. Ninth Embodiment (Configuration Example of Solid-State Imaging Device)
11. Tenth Embodiment (Configuration Example of Solid-State Imaging Device)
12. Eleventh Embodiment (Configuration Example of Solid-State Imaging Device)
13. Twelfth Embodiment (Configuration Example of Solid-State Imaging Device)
14. Thirteenth Embodiment (Configuration Example of Solid-State Imaging Device)
15. Fourteenth Embodiment (Configuration Example of Solid-State Imaging Device)
16. Fifteenth Embodiment (Configuration Example of Electronic Apparatus)

In addition, a solid-state imaging device, a method of manufacturing the same, and an example of an electronic apparatus according to the embodiments of the invention will be described in the following order with reference to FIGS. 7, 31 to 43. However, the invention is not limited to the following examples.

17. Sixteenth Embodiment (Solid-State Imaging device)
17.1 Configuration of the Whole Solid-State Imaging device
17.2 Partial Configuration
17.3 Method of Manufacturing Solid-State Imaging device
18. Seventeenth Embodiment (Solid-State Imaging device)
19. Eighteenth Embodiment (Electronic Apparatus)

Although improvement of the image quality is contrived by reduction in optical color mixing and/or reduction in Mg flare in the solid-state imaging device according to the embodiment of the invention, a method of reducing Mg flare will be set forth prior to the description of the embodiments.

The intensity of Mg flare 141 unique to the back-illuminated solid-state imaging device generally has the following relationship as a result of the analysis.

Mg flare intensity=intensity of incident light×reflectance of image sensor tilt×reflectance of seal glass and the like×sensitivity of image sensor tilt.

Therefore, the method of reducing Mg flare is mainly considered in three ways. A: a method of suppressing generation of diffracted light L2 by devising a pixel structure. B: a method of forming an antireflection film on an interface of seal glass and the like. C: a method of reducing diffracted light L3 which is re-reflected from the seal glass and the like and comes back by devising the pixel structure.

Since Method B is not a wafer manufacturing process of an image sensor, but is a method for a package side, the price of the image sensor rises significantly. However, this leads to a great advantage for the trend to reduction in retail price of a recent digital video camera or digital still camera which is for use by consumers.

Method A is a method for a wafer manufacturing process of an image sensor, and price rise is relatively slight. Method A is substantive in a sense that generation source of diffracted light is suppressed, and there is an advantage of improvement in sensitivity by setting a film forming condition properly. However, there is no effect of reduction with respect to optical color mixing which is a problem generated in a back-illuminated solid-state imaging device for a digital video camera or digital still camera which is for use by consumers.

Method C is a method for a wafer manufacturing process of an image sensor similar to Method A, and this leads to a great advantage for no price rise in the embodiments of the invention. Method C is a method where the amount of generation of the diffracted light and seal glass reflectance are all varied, but is effective in settling Mg flare by suppressing image sensor tilt sensitivity greatly taken in the back-illuminated solid-state imaging device. In addition, simultaneously, it is also effective in optical color mixing which is a problem generated in the back-illuminated solid-state imaging device for a digital video camera or digital still camera which is for use by consumers. The light-shielding film is configured to be capable of being maintaining excellencies in optical characteristics (high sensitivity and low shading) expected as an optical back-illuminated solid-state imaging device and to sufficiently suppress Mg flare and optical color mixing by setting an aperture design properly.

The embodiments of the back-illuminated solid-state imaging device as described below are on the basis of Method A and/or Methods B and C with respect to reduction in Mg flare.

1. Schematic Configuration Example of CMOS Solid-State Imaging Device

Figure 7:
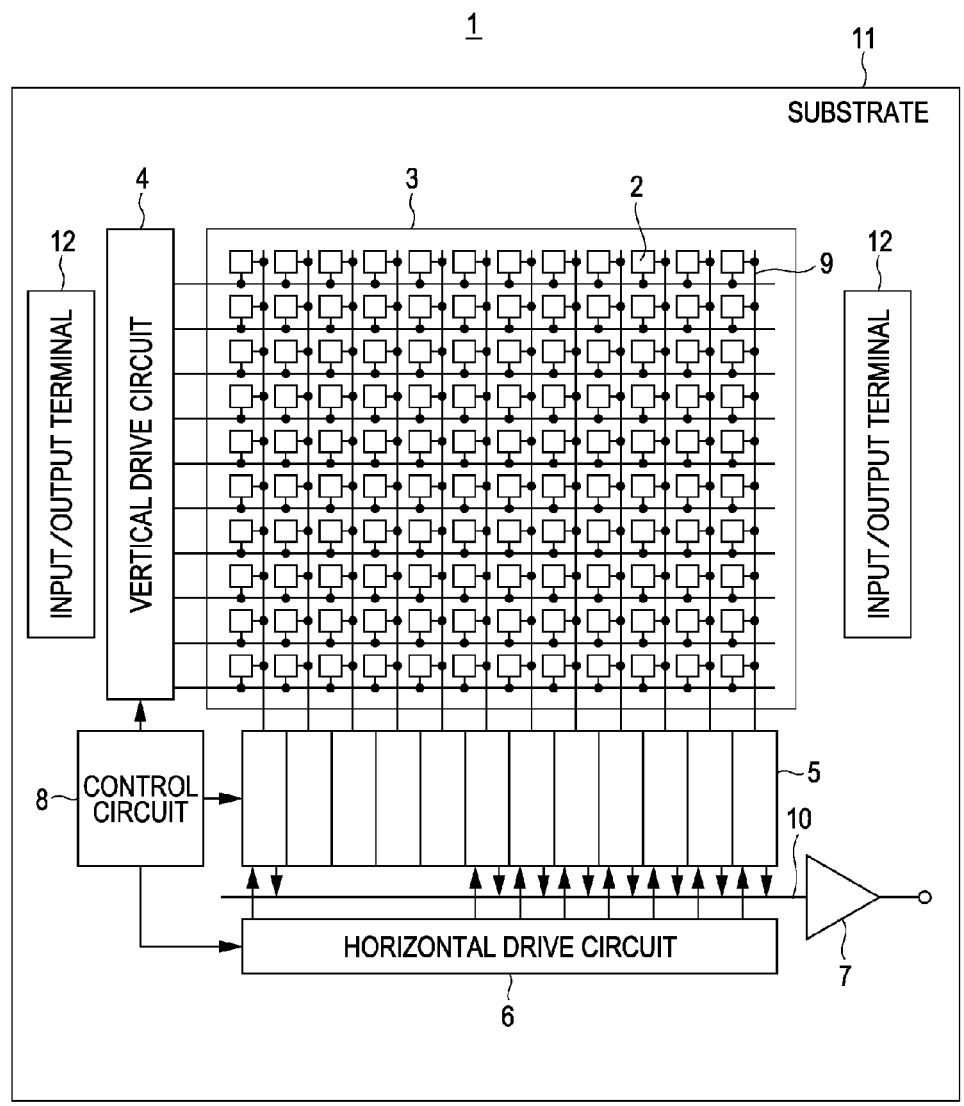
FIG. 7 is a schematic configuration diagram illustrating an example of a CMOS solid-state imaging device applied to the present invention.

FIG. 7 shows a schematic configuration of an example of the CMOS solid-state imaging device applied to each embodiment of the invention. As shown in FIG. 7, the solid-state imaging device 1 according to the example includes a pixel region (so-called image capturing region) 3 in which pixels 2 including a plurality of photoelectric conversion elements in a semiconductor substrate 11, for example, a silicon substrate are regularly two-dimensionally arranged, and a peripheral circuit section. The pixels 2 include for example photodiodes which are the photoelectric conversion elements, and a plurality of pixel transistors (so-called MOS transistors). A plurality of pixel transistors is capable of being constituted by three transistors of for example a transfer transistor, a reset transistor and an amplifying transistor. Besides, it is also possible to be constituted by four transistors by adding a selective transistor. An equivalent circuit of the unit pixel is similar to the ordinary, therefore the detailed description thereof will be omitted. The pixels 2 may be also configured to be a shared pixel structure. This pixel shared structure is constituted by a plurality of photodiodes, a plurality of transfer transistors, one floating diffusion being shared, and another pixel transistor being shared one by one.

As in the following, embodiments of the present invention include back-illuminated solid-state imaging devices 21, 51, 57, 59, 63, 67, 71, 74, 77, 79, 81, and 83, a semiconductor substrate 22, a substrate surface 22A, a substrate backside 22B, a photodiode PD, a pixel transistor Tr, a light receiving surface 34, an antireflection film 36, a light-shielding film 39, a planarization film 41, an on-chip color filter 42, an on-chip microlens 43, and front-illuminated solid-state imaging devices 85 and 89.

The peripheral circuit section includes a vertical drive circuit 4, a column signal processing circuit 5, a horizontal drive circuit 6, an output circuit 7, and a control circuit 8.

The control circuit 8 receives data for giving instructions on input clock and operation mode, and also outputs data such as internal information of the solid-state imaging device. That is, the control circuit 8 generates a clock signal or a control signal which is a reference of operation of the vertical drive circuit 4, the column signal processing circuit 5 and the horizontal drive circuit 6 and the like on the basis of a vertical synchronization signal, a horizontal synchronization signal and a master clock. These signals are then input to the vertical drive circuit 4, the column signal processing circuit 5 and the horizontal drive circuit 6 and the like.

The vertical drive circuit 4 is constituted by, for example, a shift register, selects a pixel drive interconnection, supplies a pulse for driving the pixels to the selected pixel drive interconnection, and drives the pixels in row unit. That is, the vertical drive circuit 4 selectively scans each pixel 2 of the pixel region 3 in a row unit in a sequential vertical direction, and supplies a pixel signal to the column signal processing circuit 5, which is based on a signal charge generated in response to the amount of light received at, for example, the photodiode used as a photoelectric conversion element of each pixel 2 through a vertical signal line 9.

The column signal processing circuits 5 is disposed, for example, for each column of the pixel 2, and performs signal processing such as denoising for each pixel column with respect to a signal output from the pixels 2 for one row. That is, the column signal processing circuit 5 performs signal processing such as CDS, signal amplification, or AD conversion for removing fixed pattern noise unique to the pixel 2. In an output stage of the column signal processing circuit 5, a horizontal selective switch (not shown) is provided connected between a horizontal signal line 10 and the output stage.

The horizontal drive circuit 6 is constituted by, for example, shift registers, and sequentially outputs horizontal scan pulses, so that the horizontal drive circuit selects each of the column signal processing circuits 5 in order, and then outputs pixel signals from each of the column signal processing circuits 5 to the horizontal signal line 10.

The output circuit 7 performs signal processing for signals sequentially supplied from each of the column signal processing circuits 5 through the horizontal signal line 10, and outputs the signals. For example, there may be cases where only buffering is performed, and may also be cases where black level adjustment, column variation correction, various types of digital signal processing and the like are performed. An input and output terminal 12 exchanges signals with the outside.

2. First Embodiment

Configuration Example of Solid-State Imaging Device

Figure 8:
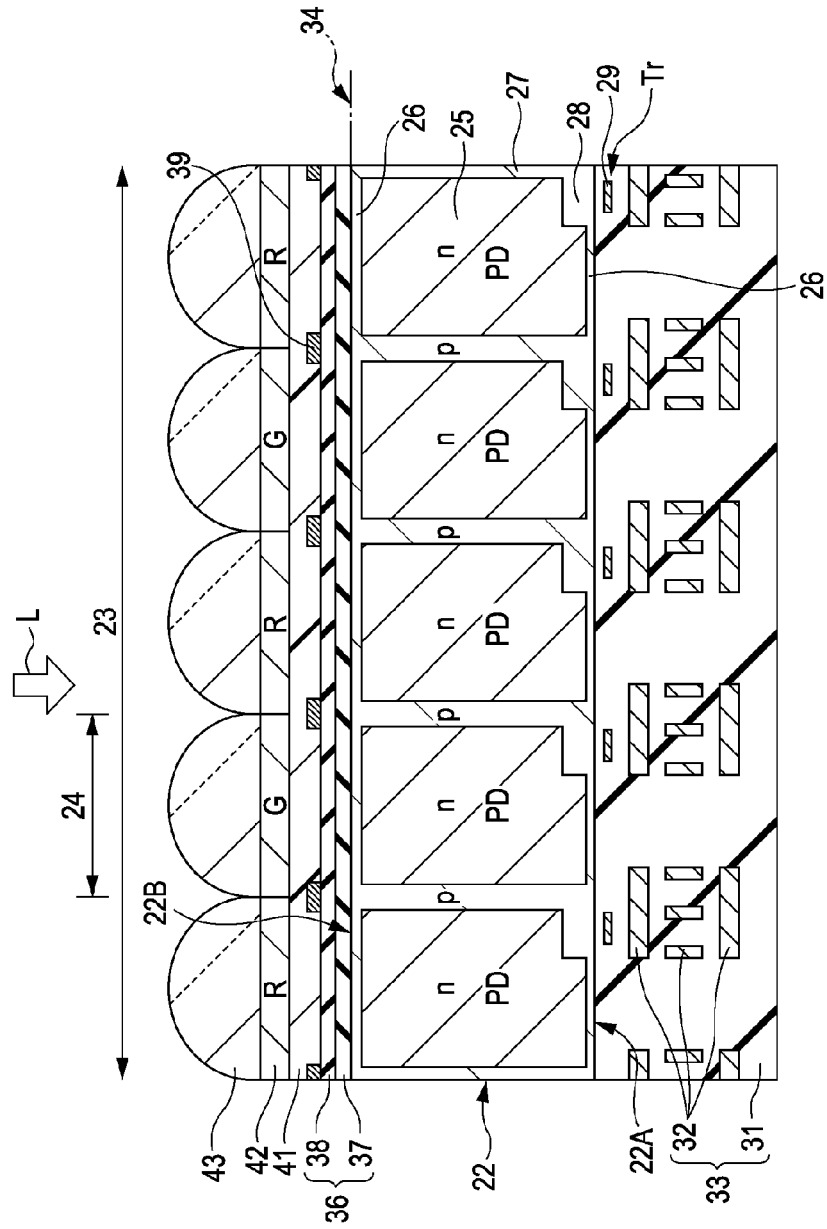
FIG. 8 is a partial configuration diagram illustrating a back-illuminated solid-state imaging device according to a first embodiment of the invention.

FIG. 8 shows the first embodiment of the solid-state imaging device according to the invention. The solid-state imaging device according to the embodiment is a back-illuminated CMOS solid-state imaging device. The solid-state imaging device 21 according to the first embodiment forms, for example, a pixel region (so-called image capturing region) 23 in which a plurality of pixels is arranged in a semiconductor substrate 22 made of silicon, and a peripheral circuit section (not shown) disposed in a periphery of the pixel region 23. A unit pixel 24 is constituted by a photodiode PD used as a photoelectric conversion section and a plurality of pixel transistors Tr. The photodiode PD is formed so as to extend over the whole region in a thickness direction of the semiconductor substrate 22, and is configured as a p-n junction type photodiode composed of a first conductivity type, which is an n-type semiconductor region 25 in the example, and a second conductivity type facing both sides of the substrate, which is a p-type semiconductor region 26 in the example. The p-type semiconductor region facing both sides of the substrate further includes a hole charge accumulation region for suppressing dark current.

Each of the pixels 24 composed of the photodiode PD and the pixel transistor Tr is isolated by an element isolation region 27. The element isolation region 27 is formed and, for example, grounded by the p-type semiconductor region. The pixel transistor Tr forms a n-type source region and a drain region, which are not shown, in a p-type semiconductor well region 28 formed on a surface 22A side of the semiconductor substrate 22, and forms a gate electrode 29 on the substrate surface between both regions through a gate insulating film. In the same drawing, a plurality of pixel transistors is shown as represented by one pixel transistor Tr, and is schematically indicated by the gate electrode 29.

So-called multilayer interconnection layers 33, where a plurality of layers of interconnections 32 is disposed through an interlayer insulating film 31, are formed on the surface 22A of the semiconductor substrate 22. Since the sides of the multilayer interconnection layers 33 are configured so that light is not incident, it is possible for a layout of the interconnections 32 to be freely set up.

An insulating layer is formed on a substrate backside 22B used as a light receiving surface 34 of the photodiode PD. This insulating layer is formed by an antireflection film 36 in the example. The antireflection film 36 is formed by a multilayer film having a different refractive index, and is formed by a two-layer film made of a hafnium oxide (HfO$_2$) film 38 and a silicon oxide film 37 in the example.

In the embodiment, a light-shielding film 39 is formed at a pixel boundary on this antireflection film 36, that is, a portion corresponding to the pixel boundary. This light-shielding film 39 may be a light-shielding material. Meanwhile, it is preferable to form the light-shielding film with a film of metal, for example, aluminum (Al), or tungsten (W), or copper (Cu) as a material which has strong light-shielding properties, and is capable of being processed with good accuracy using microfabrication, for example, etching.

A planarization film 41 is formed on the antireflection film 36 including the light-shielding film 39, and an on-chip color filter 42 and an on-chip microlens 43 thereon are sequentially formed on this planarization film 41. The on-chip microlens 43 is formed by, for example, organic materials such as resin. The planarization film 41 may be formed by, for example, organic materials such as resin. As an on-chip color filter, for example, a color filter of Bayer array is used. The light L enters from the substrate backside 22B, and is collected by the on-chip microlens 43 and then received in each of the photodiodes PD.

With the back-illuminated solid-state imaging device 21 according to the first embodiment, since the light-shielding film 39 is formed in the pixel boundary very close to the light receiving surface 34, light travelling to an adjacent pixel is shielded without being collected by the on-chip microlens 43. That is, it is possible to prevent the light from being incident on the adjacent pixel by the light-shielding film 39 of the pixel boundary, and to reduce optical color mixing. In addition, even though the light is incident on the solid-state imaging device 21 disposed within a package, and then diffracted light partially reflected is re-reflected by the seal glass to thereby be incident on the solid-state imaging device 21, incidence of the diffracted light is prevented by the light-shielding film 39 of the pixel boundary. Since the incidence of this diffracted light is blocked, in particular, it is possible to reduce Mg flare when photographing using high-intensity light source.

Figure 9A:
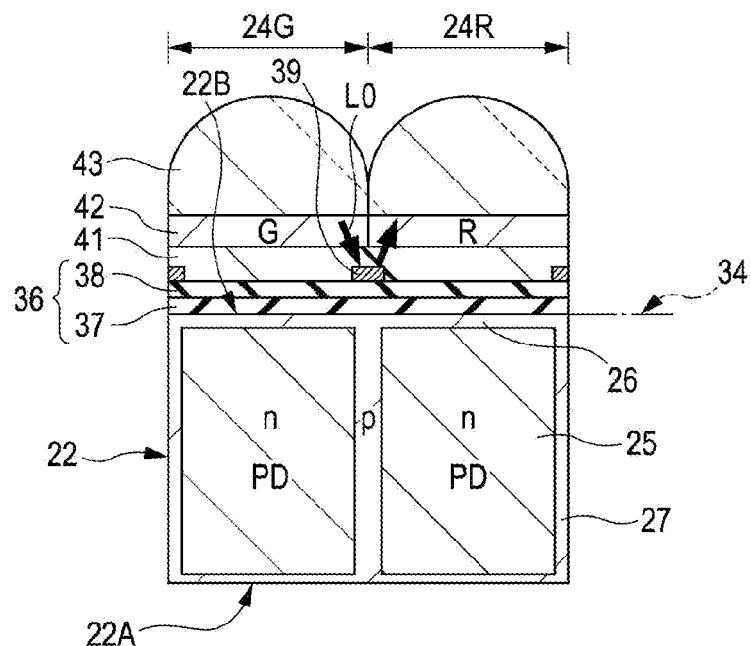
FIGS. 9A and 9B are explanatory diagrams illustrating a state where optical color mixing in an adjacent pixel according to the embodiment of the invention is reduced.
Figure 9B:
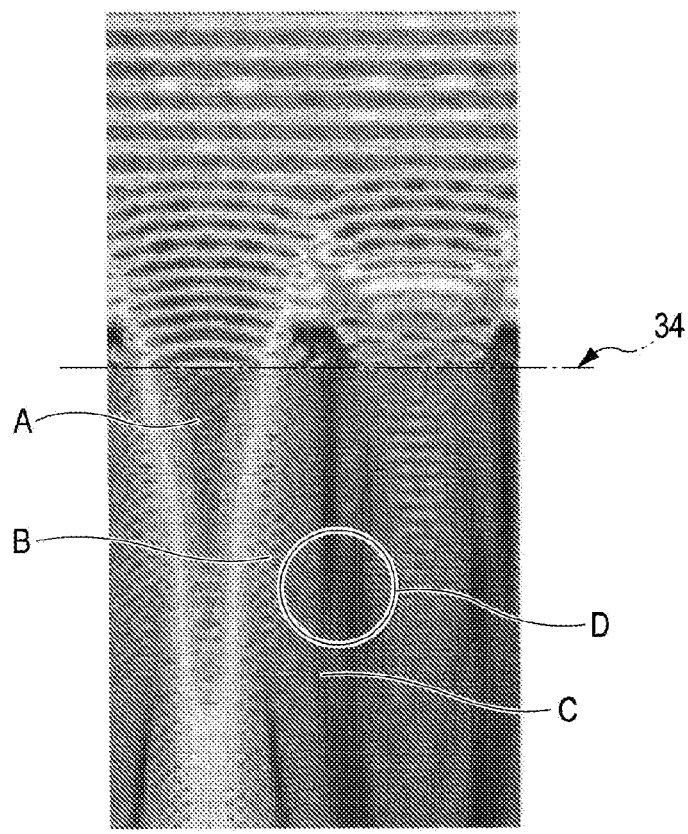

As shown in FIG. 9, reduction in optical color mixing will be described in detail using simulation of light intensity when light of a 550 nm wavelength is incident on two pixels of a green pixel and a red pixel. FIG. 9 A shows a green pixel 24G and a red pixel 24R. When the light is transmitted on the on-chip microlens 43 and is incident on the green pixel 24G, although light L0 which is not partially collected travels to the red pixel 24R which is an adjacent pixel, the light L0 is shielded by the light-shielding film 39 and is reflected. That is, incidence of the light L0 on the red pixel 24R is blocked. Such an appearance is shown by simulation of light intensity of FIG. 9B. In FIG. 9B, as mentioned above, a region A is a portion having strong light intensity, a light-colored portion B is a portion having weak light intensity, and a heavy-colored portion is a portion having hardly any light intensity. As can be seen from the simulation of FIG. 9 B, the light intensity in the boundary vicinity D to the green pixel 24G of the photodiode PD of the red pixel 24R is almost equal to zero. That is, optical color mixing is reduced.

Figure 10:
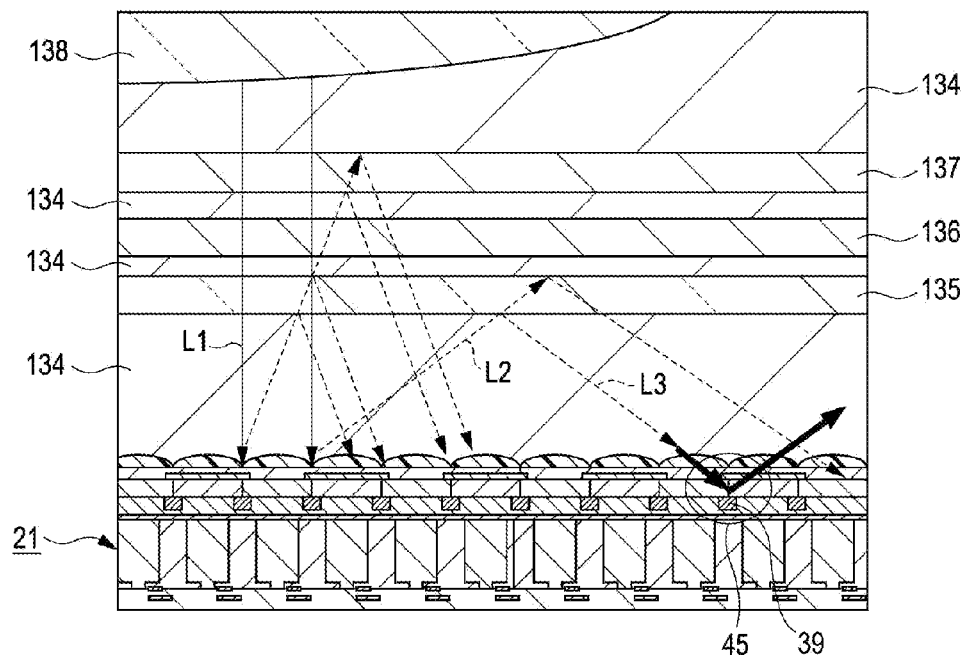
FIG. 10 is an explanatory diagram illustrating a reflection state of incident light according to the embodiment of the invention.

On the other hand, reduction of Mg flare will be described in detail. FIG. 10 shows a reflection state of the incident light in the state where the solid-state imaging device 21 according to the first embodiment is received within the package. As mentioned above, the seal glass 135 is disposed in a window of the incident light side of the package (not shown) in which the back-illuminated solid-state imaging device 21 is received through the space 134. Further, the optical low-pass filter 136 is disposed the seal glass 135 through the space 134, and the infrared (IR) cutoff filter 137 is disposed thereon through the space 134. Further, the camera lens 138 is disposed thereon.

Figure 11:
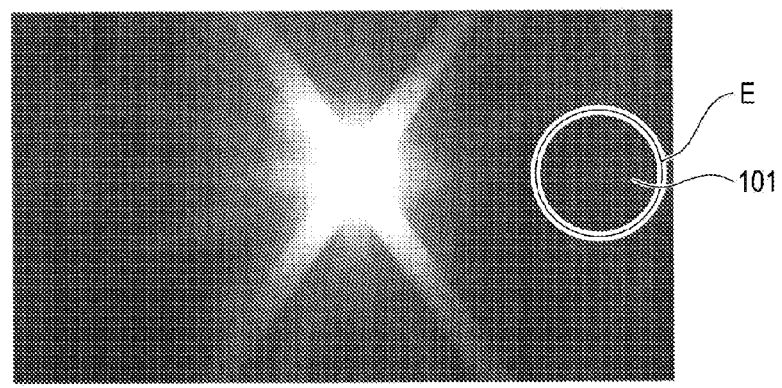
FIG. 11 is an explanatory diagram in which Mg flare according to the embodiment of the invention is reduced.

As described above, the incident light L1, which transmits the camera lens 138 and is incident on the solid-state imaging device 21, is reflected by each of the medium interfaces of the solid-state imaging device 21. This reflected light is reflected by the seal glass 135, the optical low-pass filter 136, and the infrared cutoff filter 137 and is incident again on the solid-state imaging device 21 side. The diffracted light L2 reflected even from the center at a large angle is reflected by the seal glass 135, and is incident again on the solid-state imaging device 21 as the light L3 incident again. However, at this time, as shown by a circular frame 45, the incidence of the diffracted light on the effective pixel is blocked by the light-shielding film 39, whereby Mg flare is not generated. As shown in FIG. 10, although the diffracted light L3, which is reflected by the green pixel 24G and is re-reflect, travels to the adjacent red pixel 24R side through a green filter of another green pixel 24G, the diffracted light L3 is reflected by the light-shielding film 39 of the pixel boundary (see solid arrows), and is not incident on the red pixel 24R. For this reason, as shown in FIG. 11, when photographing using high-intensity light source, Mg flare does not appear at the same place (see circular frame E) that Mg flare appears in FIG. 27 described above.

Further, in the embodiment, after the light-shielding film 39 is formed, the on-chip color filter 42 and the on-chip microlens 43 are formed through the planarization film 41. Since the on-chip microlens 43 is formed through this planarization film 41, all of the on-chip microlenses 43 on the pixel region are of equal lens height. In particular, the on-chip microlenses 43 of the effective pixel region are of equal lens height, whereby there is no level difference d generated between the peripheral portion and the central region in the effective pixel region shown in FIG. 29 described above. Therefore, the same luminance is obtained in the whole screen, that is, there is no sensitivity unevenness generated and improvement in image quality is achieved.

In this manner, the solid-state imaging device 21 is configured to dispose the light-shielding film 39 in the pixel boundary of a position close to the light receiving surface, so that optical color mixing can be reduced, and Mg flare can be reduced. Further, in the solid-state imaging device 21, sensitivity unevenness within the effective pixel region is not generated, which thereby allows the high-quality image to be photographed.

Thus, the back-illuminated solid-state imaging device 21 according to the first embodiment allows improvement in the image quality to be achieved.

Example of Method of Manufacturing Solid-State Imaging Device According to the First Embodiment FIG. 12 and FIG. 13 show a method of manufacturing the solid-state imaging device 21 according to the first embodiment. In any of the same drawings, a portion of the substrate surface sides is omitted and the only partial cross-sectional structure is shown. Reference numerals and signs of omitted parts refer to FIG. 8.

First of all, the photodiodes PD corresponding to each of the pixels, which are isolated by the element isolation region 27 formed of the p-type semiconductor region, are formed on, for example, a region in which the pixel region of the silicon semiconductor substrate 22 is to be formed. The photodiodes PD include p-n junctions composed of the n-type semiconductor region 25 extending over the whole region in a thickness direction of the substrate, and the p-type semiconductor region 26 facing both sides 22A and 22B of the substrate in contact with the n-type semiconductor region 25. The p-type semiconductor well regions 28 which are each in contact with the element isolation regions 27 are formed in regions corresponding to each pixel of the substrate surface 22A, and a plurality of each of the pixel transistors Tr is formed within the p-type semiconductor well regions 28. The pixel transistors Tr are each formed by the source region and the drain region, the gate insulating film, and the gate electrode 29. Further, the multilayer interconnection layers 33 in which a plurality of layers of interconnections 32 is disposed through the interlayer insulating film 31 are formed on the substrate surface 22A.

Figure 12A:
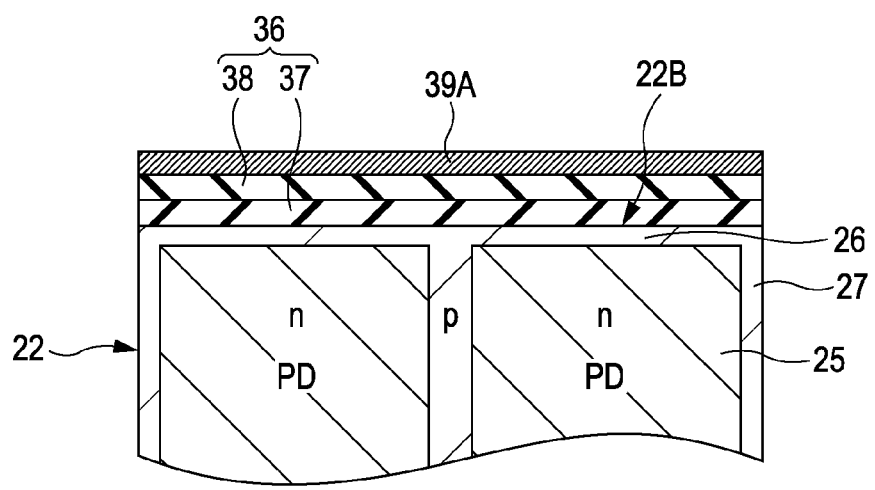
FIGS. 12A and 12B are first manufacturing process diagrams illustrating a manufacturing process of a solid-state imaging device according to a first embodiment.

Next, as shown in FIG. 12A, the insulating film, or the antireflection film 36 in the example is formed on the substrate backside 22B used as a light receiving surface, and a light-shielding film material layer 39A is formed on this antireflection film 36. The antireflection film 36 is formed by a plurality of layers having a different refractive index, and is formed by a two-layer film in which the silicon oxide (SiO$_2$) film 37 and the hafnium oxide (HfO$_2$) film 38 are stacked from the substrate backside 22B side in the example. The silicon oxide film 37 and hafnium oxide film 38 are each formed with a film thickness optimal for antireflection. The light-shielding film material layer 39A is formed by materials excellent in light-shielding property and workability, such as aluminum (Al) or tungsten (W).

Figure 12B:
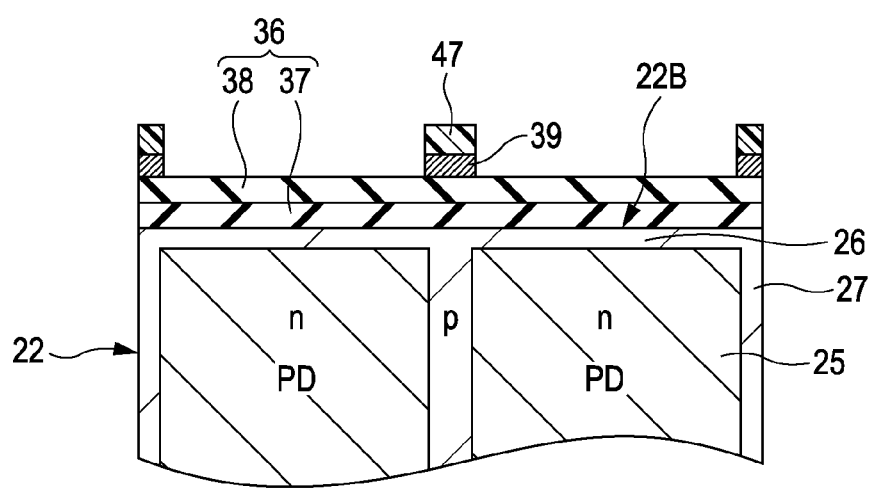

Next, a resist mask 47 is selectively formed on the light-shielding film material layer 39A. The resist mask 47 includes an aperture in a portion corresponding to the photodiode PD, and is formed in a lattice shape when seen in a plan view in order for portions corresponding to each of the pixel boundaries to remain. As shown in FIG. 12B, the light-shielding film material layer 39A is selectively etched and removed through the resist mask 47, to thereby form the light-shielding film 39 in each of the pixel boundaries. The etching may use wet etching or dry etching. It is preferable to use dry etching since a fine line width of the light-shielding film 39 is obtained with good accuracy.

Figure 13A:
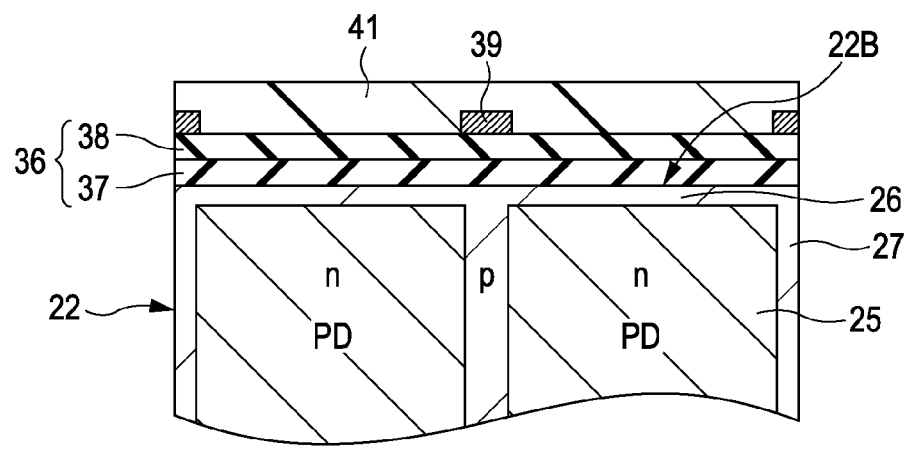
FIGS. 13A and 13B are second manufacturing process diagrams illustrating the manufacturing process of the solid-state imaging device according to the first embodiment.

Next, as shown in FIG. 13A, the planarization film 41 is formed on the antireflection film including the light-shielding film 39. This planarization film 41 is formed by applying organic materials such as, for example, resin.

Figure 13B:
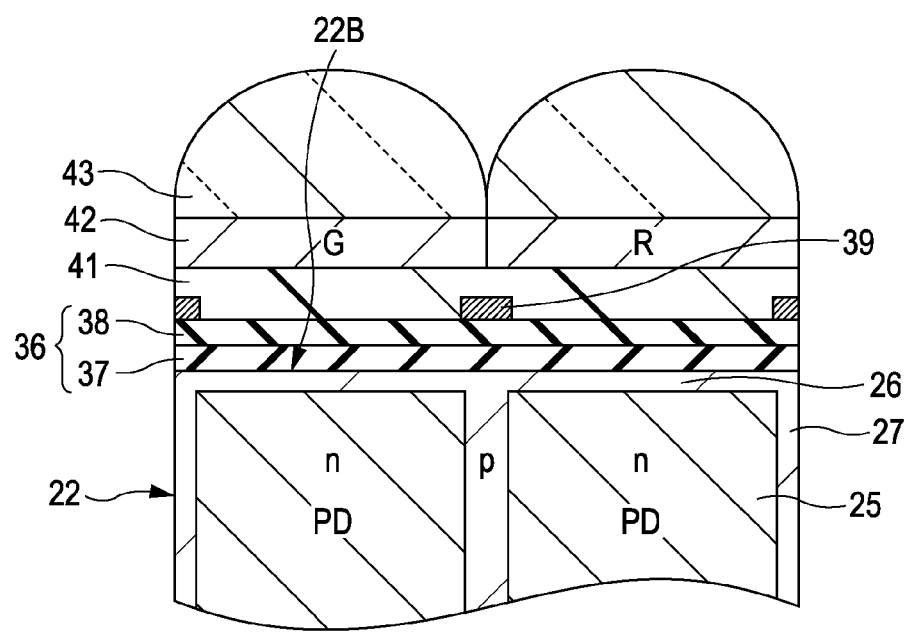

Next, as shown in FIG. 13B, the on-chip color filter 42 and the on-chip microlens 43 of, for example, Bayer array are sequentially formed on the planarization film 41. In this manner, the solid-state imaging device 21 according to a purpose of the first embodiment is obtained.

With a method of manufacturing the solid-state imaging device according to the embodiment, the light-shielding film 39 is selectively formed in a portion corresponding to the pixel boundary through the antireflection film 36 on the backside 22B used as a light receiving surface of the semiconductor substrate 22, to thereby allow the light-shielding film 39 to be formed in a position close to the light receiving surface 34. The light-shielding film 39 is formed in a position close to the light receiving surface, whereby it is possible to prevent the light which is not collected by the on-chip microlens 43 from entering the adjacent pixel. In addition, this light-shielding film prevents the incidence of the diffracted light which causes generation of Mg flare on the effective pixel. Since the antireflection film 36 is formed on the light receiving surface 34, reflection of the substrate backside 22B from the light receiving surface 34 is suppressed, and high sensitivity is achieved. Further, since the on-chip color filters 42 and the on-chip microlenses 43 are formed through the planarization film 41, the lens heights of the on-chip microlenses 43 can be made uniform within the effective screen region. Therefore, the manufacturing method can reduce optical color mixing, reduce Mg flare by suppressing the incidence of the diffracted light on the effective pixel, and manufacture the solid-state imaging device according to the first embodiment which achieves uniformity and high sensitivity within the effective pixel region, with ease and a high degree of accuracy.

3. Second Embodiment

Configuration Example of Solid-State Imaging Device

Figure 14:
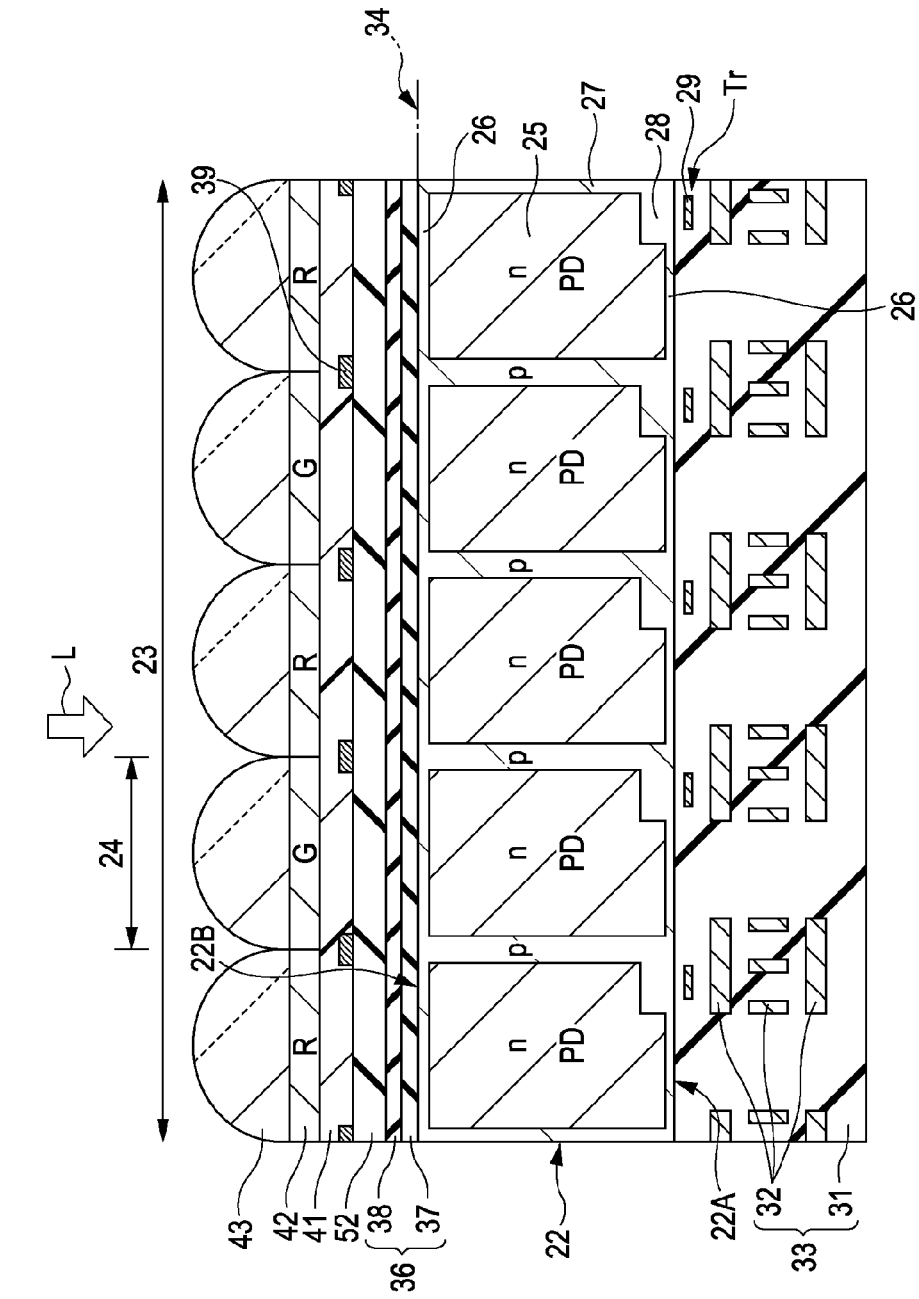
FIG. 14 is a partial configuration diagram illustrating a back-illuminated solid-state imaging device according to a second embodiment of the invention.

FIG. 14 shows the second embodiment of the solid-state imaging device according to the invention. The solid-state imaging device according to the embodiment is a back-illuminated CMOS solid-state imaging device. Similar to the first embodiment, the solid-state imaging device 51 according to the second embodiment forms, for example, a pixel region 23 in which a plurality of pixels is arranged in a semiconductor substrate 22 made of silicon, and a peripheral circuit section (not shown) disposed in a periphery of the pixel region 23. A logic circuit is formed in the peripheral circuit section. A unit pixel 24 is constituted by a photodiode PD used as a photoelectric conversion section and a plurality of pixel transistors Tr. The photodiode PD is formed so as to extend over the whole region in a thickness direction of the semiconductor substrate 22, and is configured as a p-n junction type photodiode composed of a first conductivity type, which is an n-type semiconductor region 25 in the example, and a second conductivity type facing both sides of the substrate, which is a p-type semiconductor region 26 in the example. The p-type semiconductor region facing both sides of the substrate further includes a charge accumulation region for suppressing dark current.

Each of the pixels 24 composed of the photodiode PD and the pixel transistor Tr is isolated by an element isolation region 27. The element isolation region 27 is formed and, for example, grounded by the p-type semiconductor region. The pixel transistor Tr forms a n-type source region and a drain region, which are not shown, in a p-type semiconductor well region 28 formed on a surface 22A side of the semiconductor substrate 22, and forms a gate electrode 29 on the substrate surface between both regions through a gate insulating film. In the same drawing, a plurality of pixel transistors is shown as represented by one pixel transistor Tr, and is schematically indicated by the gate electrode 29.

So-called multilayer interconnection layers 33 in which a plurality of layers of interconnections 32 is disposed through an interlayer insulating film 31 are formed on the surface 22A of the semiconductor substrate 22. Since the sides of the multilayer interconnection layers 33 are configured so that light is not incident, it is possible for a layout of the interconnections 32 to be freely set up.

An insulating layer is formed on a substrate backside 22B used as a light receiving surface 34 of the photodiode PD. This insulating layer is formed by an antireflection film 36 in the example. The antireflection film 36 is formed by a multilayer film having a different refractive index, and is formed by a two-layer film made of a hafnium oxide (HfO$_2$) film 37 and a silicon oxide film 38 in the example.

In the embodiment, particularly, the insulating film 52 is formed on this antireflection film 36, and a light-shielding film 39 is formed at the pixel boundary on this insulating film 52. The insulating film 52 is set up so as for a film type and a film thickness thereof to be an optically appropriate value. The insulating film 52 is preferable to be formed by, for example, a silicon oxide film, and is set up so as for film thickness thereof to be sufficiently thicker than at least a film thickness of the antireflection film 36. The light-shielding film 39 may be a light-shielding material. Meanwhile, it is preferable to form the light-shielding film with a film of metal, for example, aluminum (Al), or tungsten (W), or copper (Cu) as a material which has strong light-shielding properties, and is capable of being processed with good accuracy using microfabrication, for example, etching.

It is preferable that the insulating film 52 is a film having larger refractive index difference than that of a high refractive index film of an upper layer constituting the antireflection film 36, which is the hafnium oxide ($HfO_2$) film 38 in the example. For example, a silicon oxide film is preferable. For example, when the insulating film 52 is formed by a silicon nitride (SiN) film having a refractive index close to that of the hafnium oxide ($HfO_2$) film, a film thickness of the hafnium oxide film 38 becomes substantially thicker, and thereby is inappropriate as an antireflection film.

A planarization film 41 is formed on the insulating film 52 including the light-shielding film 39, and an on-chip color filter 42 and an on-chip microlens 43 thereon are sequentially formed on this planarization film 41. The planarization film 41 may be formed by, for example, organic materials such as resin. The planarization film 41 may be formed by, for example, organic materials such as resin. As an on-chip color filter, for example, a color filter of Bayer array is used. The light L enters from the substrate backside 22B, and is collected by the on-chip microlens 43 and then received in each of the photodiodes PD.

With the back-illuminated solid-state imaging device 51 according to the second embodiment, the insulating film 52 of which film thickness is thicker than that of the antireflection film 36 is formed on the antireflection film 39, and the light-shielding film 36 is formed at a portion corresponding to the pixel boundary on the insulating film 52, therefore the optimal antireflection film 36 is maintained. That is, formation of the light-shielding film 36 is patterned by selective etching, after the light-shielding film material layer is formed in the whole surface. In this selective etching, even though an underlying layer receives an etching damage, the damage is received by the insulating film 52, therefore the antireflection film 36 is not affected at all.

In the back-illuminated solid-state imaging device, it is necessary to stably control film thickness of the antireflection film 36 to be previously formed in a silicon interface in order to stably produce sensitivity or spectroscopic characteristics. When reduction in a film on the antireflection film 36 is generated when processing of the light-shielding film 36, variation of sensitivity or spectroscopic characteristics occurs. Since the insulating film 52 is formed on the antireflection film 36 prior to the formation of the light-shielding film 36, sensitivity or spectroscopic characteristics becomes stable.

Furthermore, the solid-state imaging device 51 according to the second embodiment exhibits the same effect as described in the first embodiment. That is, since the light-shielding film 39 is formed in the pixel boundary very close to the light receiving surface 34, light travelling to an adjacent pixel is shielded without being collected by the on-chip microlens 43. That is, it is possible to prevent the light from being incident on the adjacent pixel by the light-shielding film 39 of the pixel boundary, and to reduce optical color mixing. In addition, even though the light is incident on the solid-state imaging device 21 disposed with a package, and then diffracted light partially reflected is re-reflected by the seal glass to thereby being incident on the solid-state imaging device 51, incidence of the diffracted light is prevented by the light-shielding film 39 of the pixel boundary. For this reason, in particular, it is possible to reduce Mg flare when photographing using high-intensity light source.

Since the on-chip microlens 43 is formed through this planarization film 41, all of the on-chip microlenses 43 on the pixel region are of equal lens height. In particular, the on-chip microlenses 43 of the effective pixel region are of equal lens height, whereby there is no level difference d generated between the peripheral portion and the central region in the effective pixel region shown in FIG. 4 described above. Therefore, the same luminance is obtained in the whole screen, that is, there is no sensitivity unevenness generated and improvement in image quality is achieved.

In this manner, the solid-state imaging device 51 is configured to dispose the light-shielding film 39 in the pixel boundary of a position close to the light receiving surface, so that optical color mixing can be reduced, and Mg flare can be reduced. Further, in the solid-state imaging device 51, sensitivity unevenness within the effective pixel region is not generated, which thereby allows the high-quality image to be photographed. Thus, the back-illuminated solid-state imaging device 51 according to the second embodiment allows improvement in the image quality to be achieved.

Example of Method of Manufacturing Solid-State Imaging Device According to the Second Embodiment FIG. 15 and FIG. 16 show a method of manufacturing the solid-state imaging device 51 according to the second embodiment. In any of the same drawings, a portion of the substrate surface sides is omitted and the only partial cross-sectional structure is shown. Reference numerals and signs of omitted parts refer to FIG. 14.

As mentioned above, first of all, the photodiodes PD corresponding to each of the pixels, which are isolated by the element isolation region 27 formed of the p-type semiconductor region, are formed on, for example, a region in which the pixel region of the silicon semiconductor substrate 22 is to be formed. The photodiodes PD include p-n junctions composed of the n-type semiconductor region 25 extending over the whole region in a thickness direction of the substrate, and the p-type semiconductor region 26 facing both sides 22A and 22B of the substrate in contact with the n-type semiconductor region 25. The p-type semiconductor well regions 28 which are contact with the element isolation regions, respectively, are formed in regions corresponding to each pixel of the substrate surface 22A, and a plurality of each of the pixel transistors Tr is formed within the p-type semiconductor well regions 28. The pixel transistors Tr are formed by the source region and the drain region, the gate insulating film, and the gate electrode 29, respectively. Further, the multilayer interconnection layers 33 in which a plurality of layers of interconnections 32 is disposed through the interlayer insulating film 31 are formed on the substrate surface 22A.

Figure 15A:
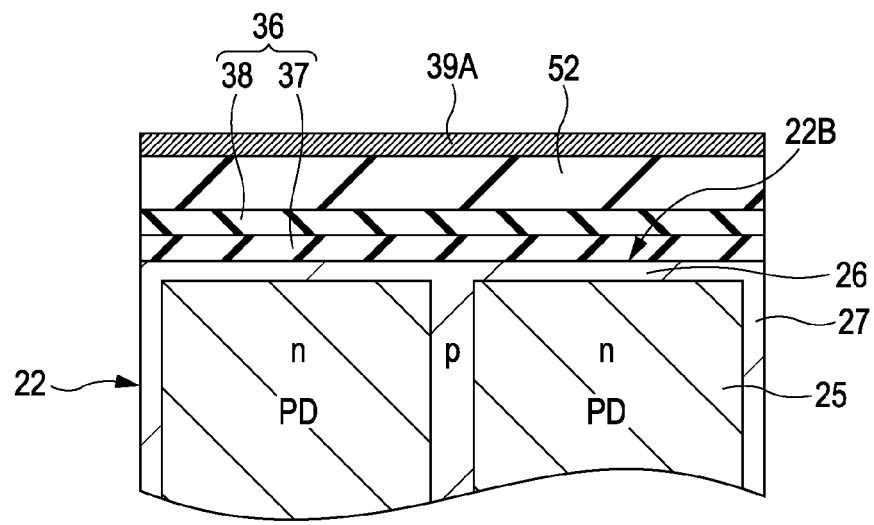
FIGS. 15A and 15B are first manufacturing process diagrams illustrating a manufacturing process of the solid-state imaging device according to the second embodiment.

Next, as shown in FIG. 15A, the insulation film, or the antireflection film 36 in the example is formed on the substrate backside 22B used as a light receiving surface, and the insulation film 52 is formed on this antireflection film 36.

The light-shielding film material layer 39A is formed on this insulating film 52. The insulating film 52 may be formed by, for example, a silicon oxide ($SiO_2$) film. A film thickness of the insulating film 52 is selected to be sufficiently thicker than a film thickness of the antireflection film 36. The antireflection film 36 is formed by a plurality of layers having a different refractive index, and is formed by a two-layer film in which the silicon oxide ($SiO_2$) film 37 and the hafnium oxide ($HfO_2$) film 38 are stacked from the substrate backside 22B side in the example. The silicon oxide film 37 and hafnium oxide film 38 are each formed with a film thickness optimal for antireflection. The light-shielding film material layer 39A is formed by materials excellent in light-shielding property and workability, such as aluminum (Al) or tungsten (W).

Figure 15B:
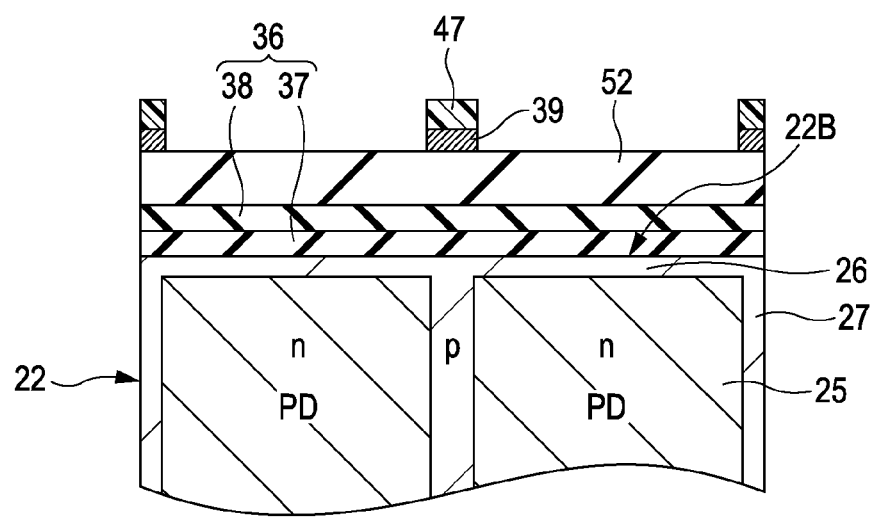

Next, a resist mask 47 is selectively formed on the light-shielding film material layer 39A. The resist mask 47 includes an aperture in a portion corresponding to the photodiode PD, and is formed in a lattice shape when seen in a plan view in order for portions corresponding to each of the pixel boundaries to remain. As shown in FIG. 15B, the light-shielding film material layer 39A is selectively etched and removed through the resist mask 47, to thereby form the light-shielding film 39 in each of the pixel boundaries. The etching may use wet etching or dry etching. It is preferable to use dry etching since a fine line width of the light-shielding film 39 is obtained with good accuracy. At the time of selective etching of this light-shielding film material layer 39A, even though an underlying layer receives an etching damage, there is no damage received by the insulating film 52.

Figure 16A:
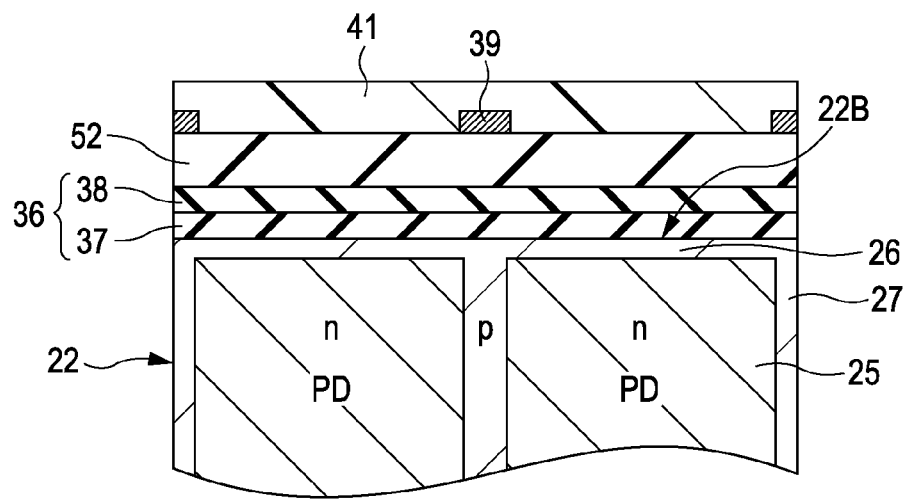
FIGS. 16A and 16B are second manufacturing process diagram illustrating the manufacturing process of the solid-state imaging device according to the second embodiment.

Next, as shown in FIG. 16A, the planarization film 41 is formed on the antireflection film including the light-shielding film 39. This planarization film 41 is formed by applying organic materials such as, for example, resin.

Figure 16B:
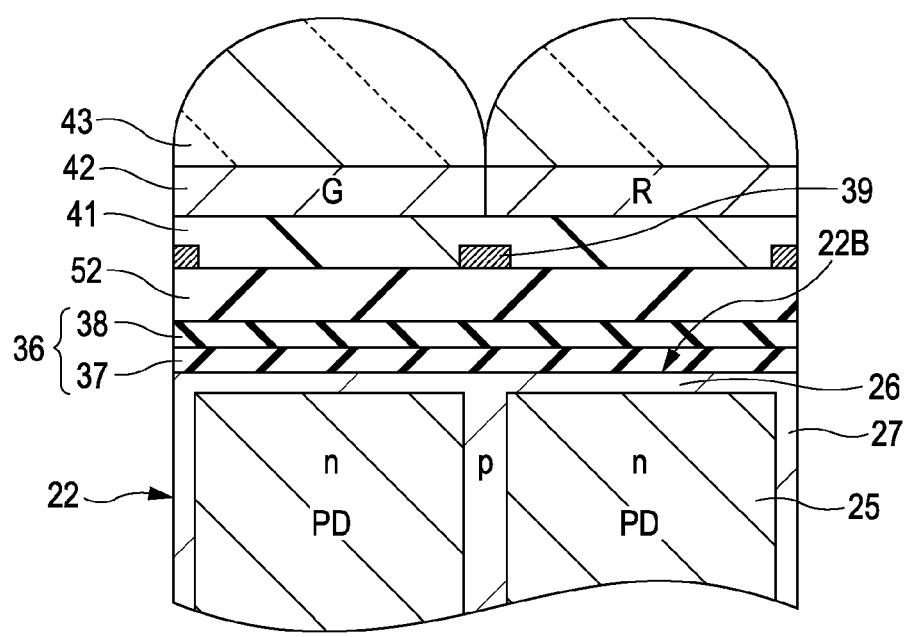

Next, as shown in FIG. 16B, the on-chip color filter 42 and the on-chip microlens 43 of, for example, Bayer array are sequentially formed on the planarization film 41. In this manner, the solid-state imaging device 51 according to a purpose of the second embodiment is obtained.

With a method of manufacturing the solid-state imaging device according to the embodiment, after the insulating film 52 of which a film thickness sufficiently thicker than that of the antireflection film 36 is formed on the antireflection film 36, the light-shielding film 39 is formed at the portion of the pixel boundary on the insulating film 52. For this reason, at the time of selective processing by etching of the light-shielding film 39, even though an etching damage is given to an underlying film, it is possible to form the antireflection film 36 having an optimal film thickness without any etching damage on the antireflection film 36.

Furthermore, the same effect is exhibited as described in the method of manufacturing the solid-state imaging device according to the first embodiment. That is, the light-shielding film 39 is selectively formed in a portion corresponding to the pixel boundary through the antireflection film 36 and the insulating film 52 on the backside 22B used as a light receiving surface of the semiconductor substrate 22, to thereby allow the light-shielding film 39 to be formed in a position close to the light receiving surface 34. The light-shielding film 39 is formed in a position close to the light receiving surface, whereby it is possible to prevent the light which is not collected by the on-chip microlens 43 from entering the adjacent pixel. In addition, this light-shielding film 39 prevents the incidence of the diffracted light which causes generation of Mg flare on the effective pixel. Since the on-chip color filters 42 and the on-chip microlenses 43 are formed through the planarization film 41, the lens heights of the on-chip microlenses 43 can be made uniform within the effective screen region.

Further, in the manufacturing method according to the embodiment, since the antireflection film 36 maintaining an optimal film thickness on the light receiving surface 34 is formed, reflection from the light receiving surface 34 of the substrate backside 22B is further suppressed, and high sensitivity is achieved. Therefore, the manufacturing method can reduce the optical color mixing, reduce Mg flare by suppressing the incidence of the diffracted light on the effective pixel, and manufacture the solid-state imaging device according to the higher-performance second embodiment which achieves uniformity and high sensitivity within the effective pixel region, with ease and a high degree of accuracy.

Figure 17A:
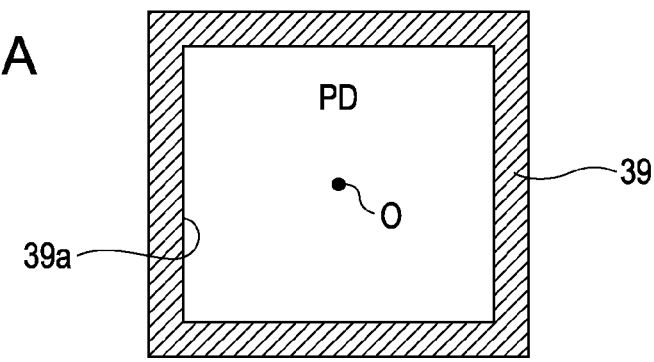
FIGS. 17A to 17C are plan views illustrating each example of aperture shapes of a light-shielding film according to the invention.
Figure 17B:
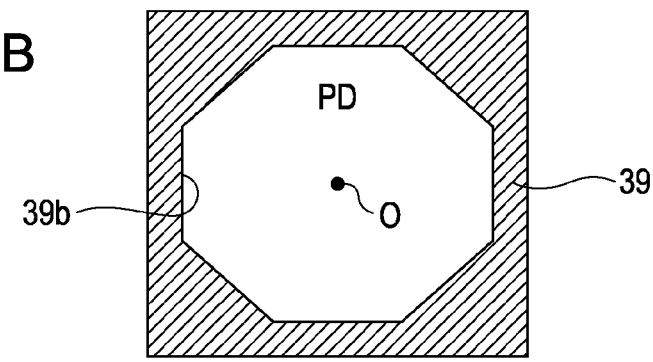
Figure 17C:
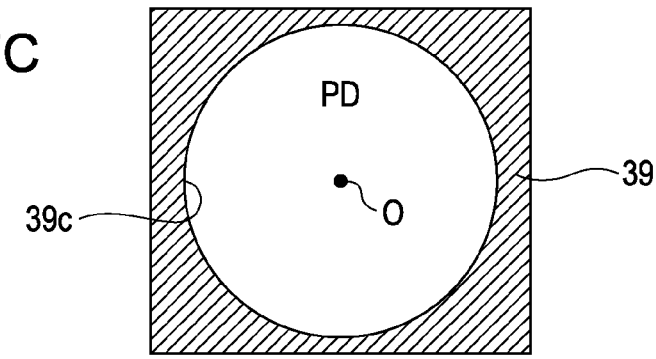

In the solid-state imaging device 21 and 51 according to the above-mentioned embodiment, it is possible to appropriately select an aperture shape of the light-shielding film 39 in accordance with a light-collecting state. FIGS. 17A to 17C show examples of the aperture shapes of the light-shielding film 39. The light-shielding film 39 shown in FIG. 17A includes a quadrangular aperture 39a as the aperture shape. Therefore, the shape of the light receiving surface of the photodiode PD is quadrangular. When the aperture 39a is quadrangular, the maximum sensitivity is obtained.

The light-shielding film 39 shown in FIG. 17B is configured to have the aperture 39b formed of polygon, and octagon in the example as an aperture shape. Therefore, the shape of the light receiving surface of the photodiode PD is octagonal. When the aperture 39b is octagonal, it is possible to reduce flare in a diagonal direction compared to the quadrangular shape.

The light-shielding film 39 shown in FIG. 17C is configured to have the aperture 39c formed of circle as an aperture shape. Therefore, the shape of the light receiving surface of the photodiode PD is circular. When the aperture 39c is circular (inscribed circle of a quadrangular shape in FIG. 17A), it is also possible to reduce flare generated in an immediate direction of horizon and diagonal. However, the sensitivity is lowest among FIG. 17A to FIG. 17C.

In any of the configurations of FIGS. 17A to 17C, the light-shielding film 39 of the pixel boundary is formed so that a center O of the photodiode PD and a center O of the light-shielding film aperture formed in the semiconductor substrate 22 are matched with each other with a diphycercally and bilaterally symmetric shape. It is possible to maintain incidence angle-dependent symmetric properties and to obtain isotropic sensitivity characteristics in the whole screen by matching the center of the photodiode PD and the center of the light-shielding film aperture with each other.

4. Third Embodiment

Configuration Example of Solid-State Imaging Device

Figure 18:
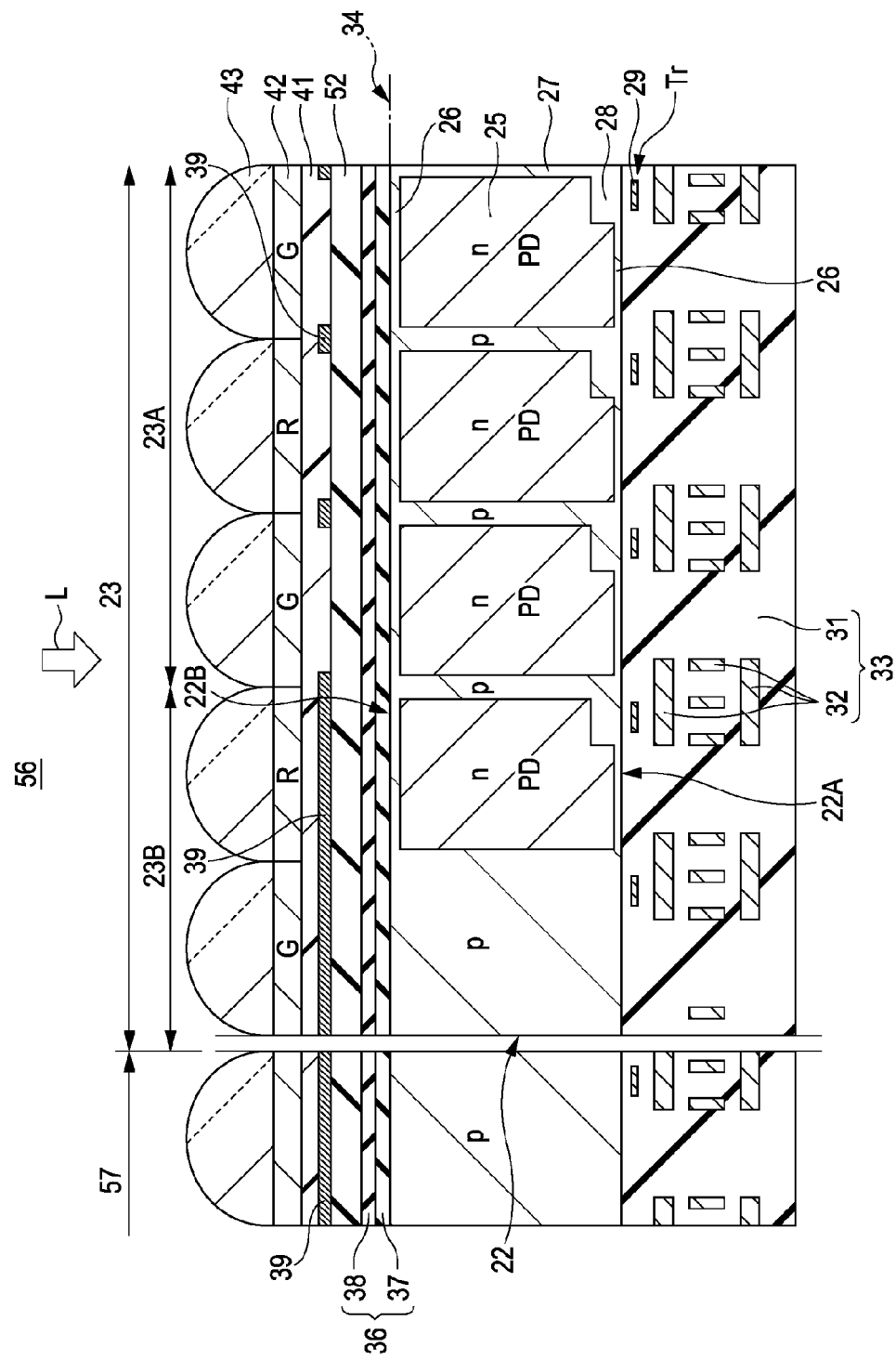
FIG. 18 is a partial configuration diagram illustrating a back-illuminated solid-state imaging device according to a third embodiment of the invention.

FIG. 18 shows the third embodiment of the solid-state imaging device according to the invention. The solid-state imaging device according to the embodiment is a back-illuminated CMOS solid-state imaging device. The solid-state imaging device 56 according to the third embodiment is constituted so that each of the photodiodes PD is formed in the pixel region 23 of the semiconductor substrate 22, a logic circuit (not shown) is formed in the peripheral circuit section 57, and the antireflection film 36 and the insulating film 52 are formed on the backside 22B of the semiconductor substrate 22 in order.

In the embodiment, the lattice-shaped light-shielding film 39 in the pixel boundary is formed on the insulating film 52 corresponding to the pixel region 23, and the consecutive light-shielding film 39 is formed on the insulating film 52 corresponding to the peripheral circuit section 57 and an optical black level region 23B of the pixel region. The optical black level region 23B is formed in the circumference of the effective pixel region 23A. The light-shielding film 39 of the pixel boundary, and the consecutive light-shielding film 39 reaching the peripheral circuit 57 and the optical black level region 23B are simultaneously formed by the same material films. The light-shielding film 39 in the pixel boundary, and the light-shielding film 39 reaching the peripheral circuit 57 and the optical black level region 23B are consecutively integrally formed with each other.

In the embodiment, the planarization film 41 is further formed on the insulating film 52 including the light-shielding films 39 and 39, and the on-chip color filter 42 and the on-chip microlens 43 are formed on a region corresponding to the pixel region 23 of the planarization film 41. The multilayer interconnection layer, in which a plurality of layers of interconnections is disposed in the substrate surface side through the interlayer insulating film, is formed even in the peripheral circuit section 57.

Furthermore, the configuration is the same as described in the second embodiment, therefore the same numerals and signs are attached to the parts corresponding to FIG. 14, and the description thereof is omitted.

With the solid-state imaging device 56 according to the third embodiment, the light-shielding film 39 consecutive from the peripheral circuit section 57 to the optical black level region 23B, and the lattice-shaped light-shielding film 39 in the pixel boundary are simultaneously formed, to thereby reduce level difference caused by the light-shielding film 39. Herewith, the on-chip microlenses 43 can be of the uniform lens height within the effective pixel region, and the uniform light-collecting state is obtained in the whole effective pixel.

Furthermore, the same effect is exhibited as described in the second embodiment, where optical color mixing in the adjacent pixel by the light which is not collected by the on-chip microlens 43 is reduced, and the incidence of the diffracted light on the effective pixel is suppressed to thereby reduce generation of Mg flare, and the like. Thus, the back-illuminated solid-state imaging device 56 according the third embodiment can achieve improvement in image quality.

5. Fourth Embodiment

Configuration Example of Solid-State Imaging Device

Figure 19:
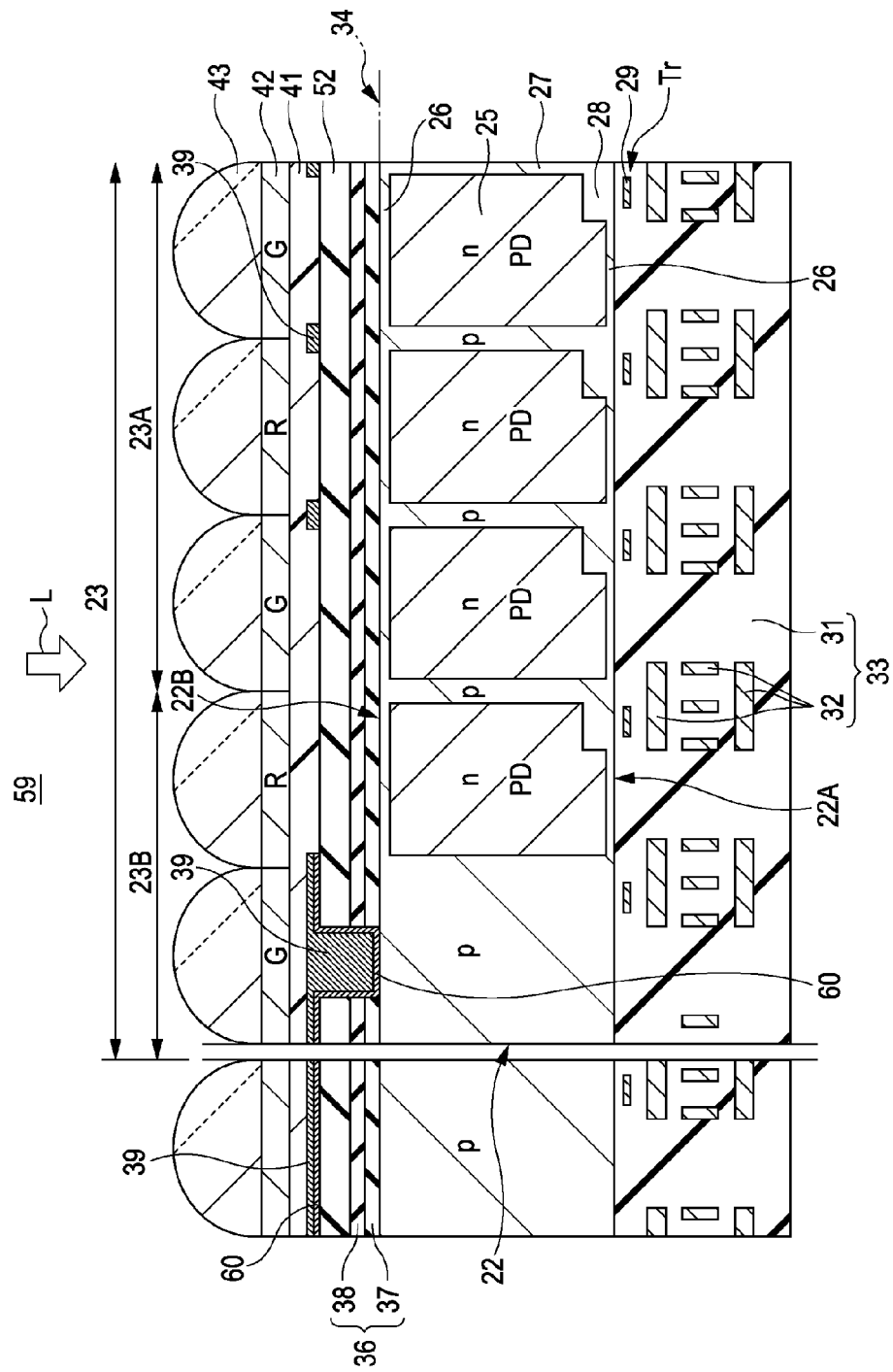
FIG. 19 is a partial configuration diagram illustrating a back-illuminated solid-state imaging device according to a fourth embodiment of the invention.

FIG. 19 shows the fourth embodiment of the solid-state imaging device according to the invention. The solid-state imaging device according to the embodiment is a back-illuminated CMOS solid-state imaging device. In the same drawing, a portion of the substrate surface sides is omitted and the only partial cross-sectional structure is shown. The omitted parts are the same as those of FIG. 14. The solid-state imaging device 59 according to the fourth embodiment is constituted so that each of the photodiodes PD is formed in the pixel region 23 of the semiconductor substrate 22, a logic circuit (not shown) is formed in the peripheral circuit section 57, and the antireflection film 36 and the insulating film 52 are formed on the backside 22B of the semiconductor substrate 22 in order.

The lattice-shaped light-shielding film 39 is formed, corresponding to the pixel boundary, on the insulating film 52 corresponding to the pixel region 23, and the consecutive light-shielding film 39 is formed on the insulating film 52 corresponding to the peripheral circuit section 57 and an optical black level region 23B of the pixel region. The optical black level region 23B is formed in the circumference of the effective pixel region 23A. The light-shielding film 39 of the pixel boundary and the consecutive light-shielding film 39 reaching the peripheral circuit 57 and the optical black level region 23B are simultaneously formed by the same material films. The light-shielding film 39 in the pixel boundary and the light-shielding film 39 reaching the peripheral circuit 57 and the optical black level region 23B are consecutively integrally formed with each other.

In the embodiment, the above-mentioned light-shielding film 39 is connected to a ground (GND) region of the semiconductor substrate 22, that is, the element isolation region 27 made of a p-type semiconductor region. As mentioned above, the light-shielding film 39 is formed by, for example, aluminum (Al) or tungsten (W). It is preferable that the light-shielding film 27 is connected to the p-type semiconductor region of the element isolation region 27 through a barrier metal layer 60 such as, for example, Ti and TiN, as shown in FIG. 19. A ground potential is applied to the light-shielding film 39 through the p-type semiconductor region of the element isolation region 27.

Figure 20:
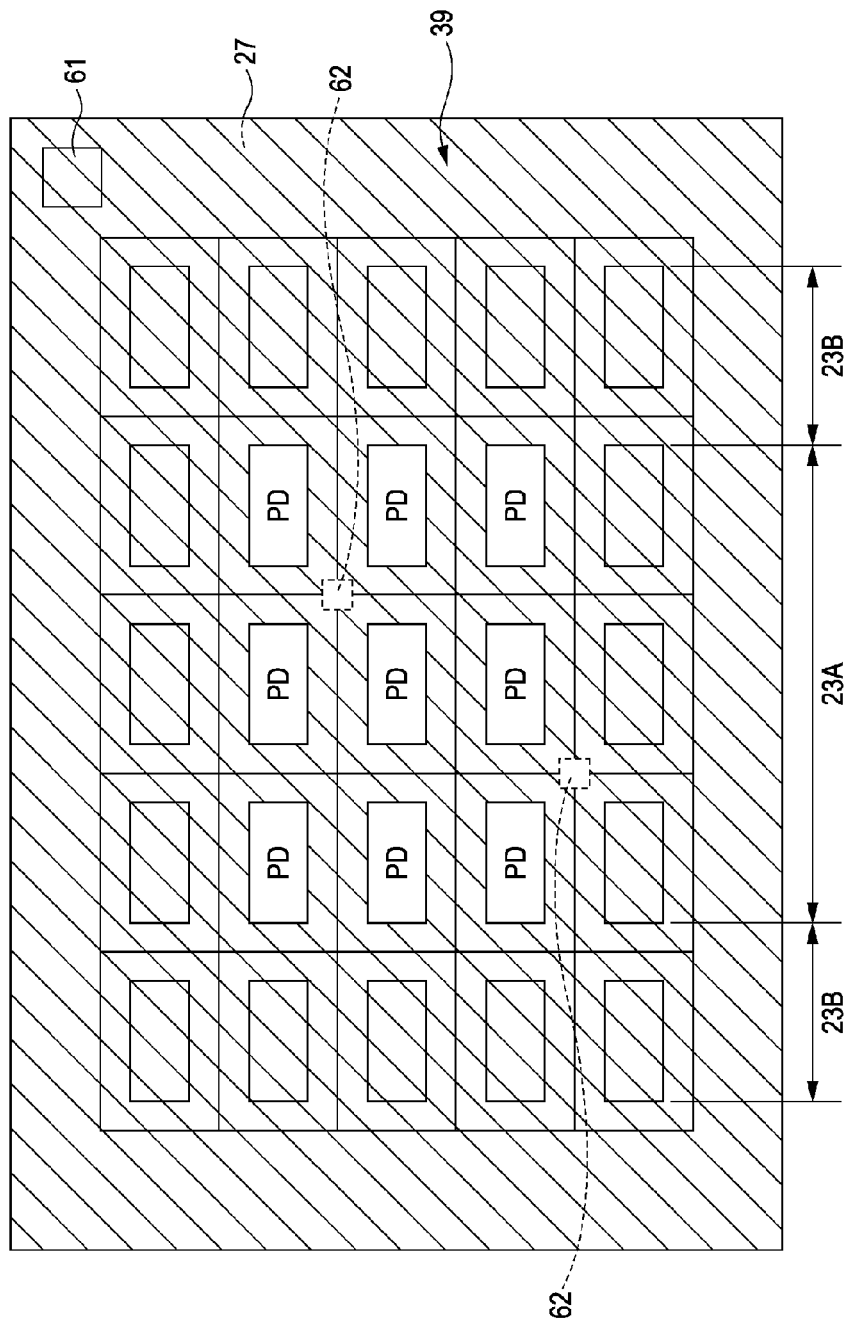
FIG. 20 is a partial plan view illustrating the back-illuminated solid-state imaging device according to the fourth embodiment of the invention.

As shown in FIG. 20, the light-shielding film 39 is connected to the element isolation region 27 locating the outside from the optical black level region 23B of the pixel region through a contact portion 61. In addition, the light-shielding film 39 may be connected to a contact portion 62 of the element isolation region 27 in the effective pixel region 23A. In the pixel region 23, since damage is given to the silicon due to formation of the contact portion 61, and there may be a possibility that white spot generation occurs, the contact portion 61 has to be formed. Therefore, it is preferable that connection of the light-shielding film 39 to the element isolation region is performed at the outside of the optical black level region.

Furthermore, the configuration is the same as described in the second embodiment and the third embodiment, therefore the same numerals and signs are attached to the parts corresponding to FIG. 14 and FIG. 18 and the description thereof is omitted.

With the solid-state imaging device 59 according to the fourth embodiment, the light-shielding film 39 is grounded through the element isolation region 27 which is a ground region, so that a potential of the light-shielding film 39 is fixed, dark noise can be reduced without having an adverse influence on the below photodiode PD.

Furthermore, the same effect is exhibited as described in the second embodiment, such as reduction of optical color mixing in the adjacent pixel by the light-shielding film 39 of the pixel boundary, reduction of generation of Mg flare by suppression of the incidence of the diffracted light on the effective pixel, and uniform sensitivity within the effective pixel region by the planarization film 41, and the like. In addition, the same effect is exhibited as described in the third embodiment, such as reduction of level difference by the light-shielding film 39, and obtainment of the uniform light-collecting state in the whole effective pixel. Thus, the back-illuminated solid-state imaging device 59 according to the fourth embodiment can achieve improvement in image quality.

6. Fifth Embodiment

Configuration Example of Solid-State Imaging Device

Figure 21:
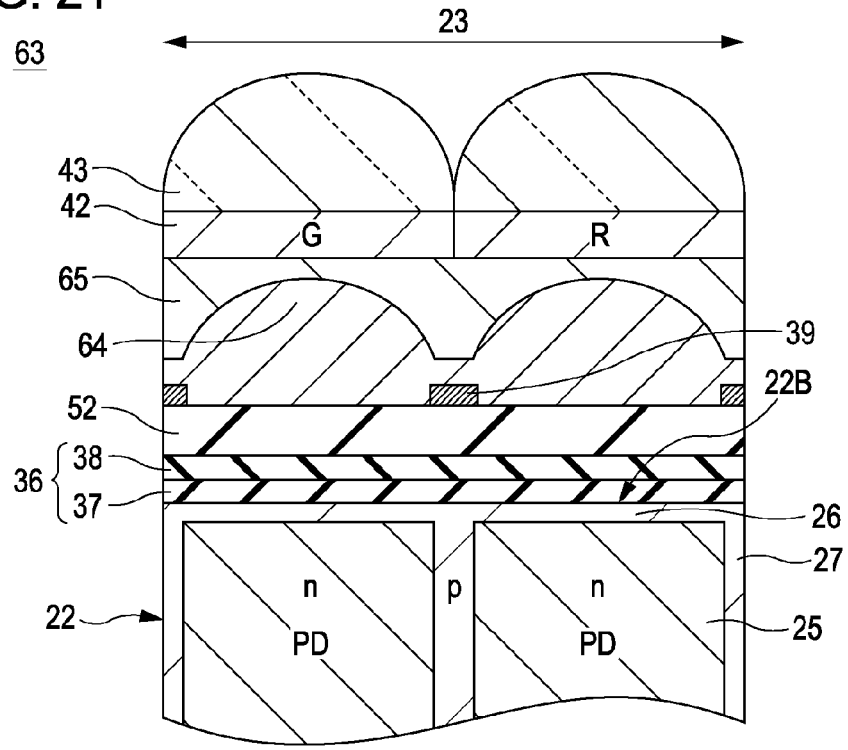
FIG. 21 is a partial configuration diagram illustrating a back-illuminated solid-state imaging device according to a fifth embodiment of the invention.

FIG. 21 shows the fifth embodiment of the solid-state imaging device according to the invention. The solid-state imaging device according to the embodiment is a back-illuminated CMOS solid-state imaging device. In the same drawing, a portion of the substrate surface sides is omitted and the only partial cross-sectional structure is shown. The omitted parts are the same as those of FIG. 14. The solid-state imaging device 63 according to the fifth embodiment is constituted so that each of the photodiodes PD is formed in the pixel region 23 of the semiconductor substrate 22, and a logic circuit is formed in the peripheral circuit section (not shown). Each of the pixel composed of the photodiode PD and the pixel transistor is isolated by the element isolation region 27. The antireflection film 36 and the insulating film 52 are formed on the substrate backside 22B used as a light receiving surface of the photodiode PD, and the lattice-shaped light-shielding film 39 is formed in the pixel boundary on the insulating film 52.

In the embodiment, an intralayer lens 64 is formed in the upper portion to which each photodiode PD corresponds. The intralayer lens 64 may be formed by, for example, a nitride film as the intralayer lens 64 which is configured to be form a convex lens in the example.

A planarization film 67 made of, for example, an organic film is formed on the intralayer lens 64, and the on-chip color filter 42 and the on-chip microlens 43 are sequentially formed on this planarization film 67. The intralayer lens 64 according to the embodiment is formed between, so to speak, a lower layer of the on-chip color filter 42, that is, antireflection film 36 and the on-chip color filter 42.

Furthermore, the configuration is the same as described in the second embodiment, therefore the same numerals and signs are attached to the parts corresponding to FIG. 14 and the description thereof is omitted.

With the solid-state imaging device 63 according to the fifth embodiment, since the intralayer lens 64 is formed corresponding to the each photodiode PD between the antireflection film 36 and the on-chip color filter 42, light-collecting efficiency in the photodiode PD is further improved. Herewith, optical color mixing in the adjacent pixel can be further reduced.

Furthermore, the same effect is exhibited as described in the second embodiment, such as reduction of optical color mixing in the adjacent pixel by the light-shielding film 39 of the pixel boundary, reduction of generation of Mg flare by suppression of the incidence of the diffracted light on the effective pixel, and uniform sensitivity within the effective pixel region by the planarization film 41. Thus, the back-illuminated solid-state imaging device 63 according to the fifth embodiment can achieve improvement in image quality.

7. Sixth Embodiment

Configuration Example of Solid-State Imaging Device

Figure 22:
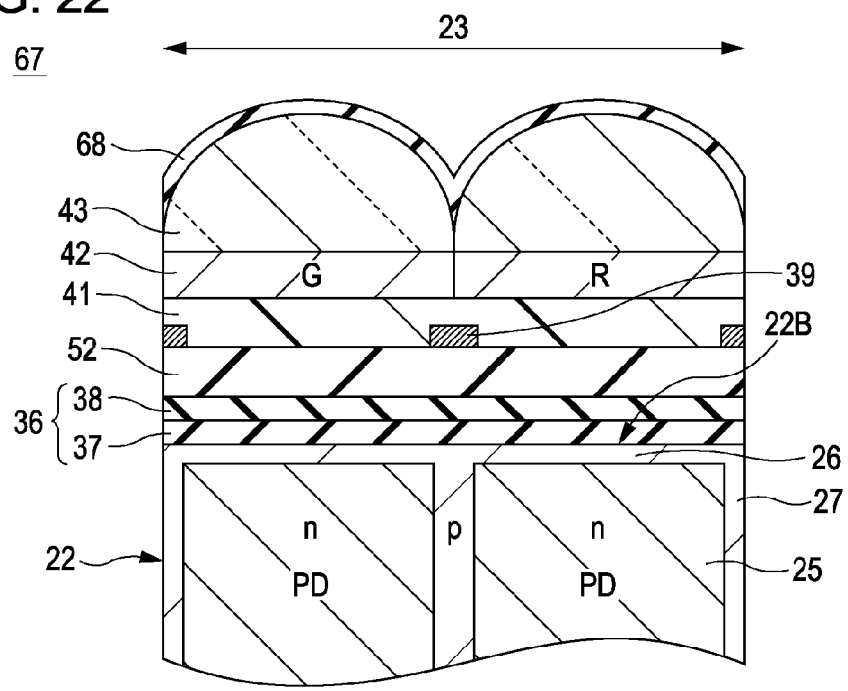
FIG. 22 is a partial configuration diagram illustrating a back-illuminated solid-state imaging device according to a sixth embodiment of the invention.

FIG. 22 shows the sixth embodiment of the solid-state imaging device according to the invention. The solid-state imaging device according to the embodiment is a back-illuminated CMOS solid-state imaging device. In the same drawing, a portion of the substrate surface sides is omitted and the only partial cross-sectional structure is shown. The omitted parts are the same as those of FIG. 14. The solid-state imaging device 67 according to the sixth embodiment is constituted so that each of the photodiodes PD is formed in the pixel region 23 of the semiconductor substrate 22, and a logic circuit is formed in the peripheral circuit section (not shown). Each of the pixel composed of the photodiode PD and the pixel transistor is isolated by the element isolation region 27. The antireflection film 36 and the insulating film 52 are formed on the substrate backside 22B used as a light receiving surface of the photodiode PD, and the lattice-shaped light-shielding film 39 is formed in the pixel boundary on the insulating film 52. Further, the on-chip color filter 42 and the on-chip microlens 43 are formed on the insulating film 52 including the light-shielding film 39 through the planarization film 41.

In the embodiment, the antireflection film 68 is formed on the surface of each on-chip microlens 43 so as to be along the lens surface. It is possible to be formed by one layer of, for example, a silicon oxide film as this antireflection film 68. It is also possible to be formed by the other plural layer films as the antireflection film 68.

Furthermore, the configuration is the same as described in the second embodiment, therefore the same numerals and signs are attached to the parts corresponding to FIG. 14 and the description thereof is omitted.

With the solid-state imaging device 67 according to the sixth embodiment, it is possible to reduce reflectance caused by the on-chip microlens 43 and the on-chip color filter 42 when photographing using a high-intensity light source by forming the antireflection film 68 in the surface of the on-chip microlens 43. Therefore, it is possible to further reduce the incidence of the diffracted light on the effective pixel and to further reduce Mg flare.

Furthermore, the same effect is exhibited as described in the second embodiment, such as reduction of optical color mixing in the adjacent pixel by the light-shielding film 39 of the pixel boundary, reduction of generation of Mg flare by suppression of the incidence of the diffracted light on the effective pixel, and uniform sensitivity within the effective pixel region by the planarization film 41. Thus, the back-illuminated solid-state imaging device 67 according to the sixth embodiment can achieve improvement in image quality.

8. Seventh Embodiment

Configuration Example of Solid-State Imaging Device

Figure 23:
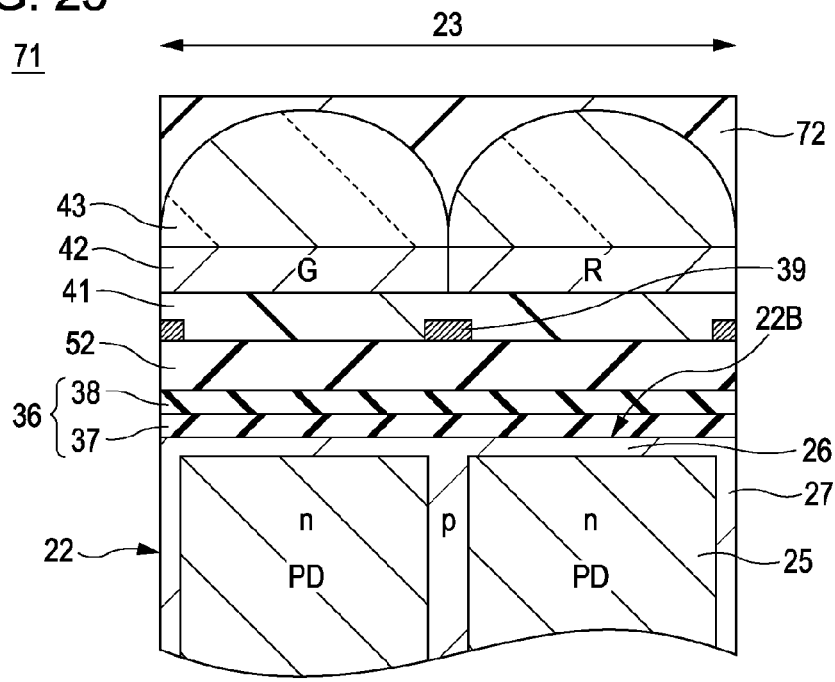
FIG. 23 is a partial configuration diagram illustrating a back-illuminated solid-state imaging device according to a seventh embodiment of the invention.

FIG. 23 shows the seventh embodiment of the solid-state imaging device according to the invention. The solid-state imaging device according to the embodiment is a back-illuminated CMOS solid-state imaging device. In the same drawing, a portion of the substrate surface sides is omitted and the only partial cross-sectional structure is shown. The omitted parts are the same as those of FIG. 14. The solid-state imaging device 71 according to the seventh embodiment is constituted so that each of the photodiodes PD is formed in the pixel region 23 of the semiconductor substrate 22, and a logic circuit is formed in the peripheral circuit section (not shown). Each of the pixel composed of the photodiode PD and the pixel transistor is isolated by the element isolation region 27. The antireflection film 36 and the insulating film 52 are formed on the substrate backside 22B used as a light receiving surface of the photodiode PD, and the lattice-shaped light-shielding film 39 is formed in the pixel boundary on the insulating film 52. Further, the on-chip color filter 42 and the on-chip microlens 43 are formed on the insulating film 52 including the light-shielding film 39 through the planarization film 41.

In the embodiment, a transparent planarization film 72 which is uniformly and continuously formed on the on-chip microlens 43. This planarization film 72 is formed by a material film having a lower refractive index than that of the on-chip microlens 43, for example, an organic film such as resin.

Furthermore, the configuration is the same as described in the second embodiment, therefore the same numerals and signs are attached to the parts corresponding to FIG. 14 and the description thereof is omitted.

With the solid-state imaging device 71 according to the seventh embodiment, since the planarization film 72 which is uniformly and continuously formed on the on-chip microlens 43, it is possible to reduce reflectance caused by the on-chip microlens 43 and the on-chip color filter 42 when photographing using a high-intensity light source. Therefore, it is possible to suppress the incidence of the diffracted light on the effective pixel and to further reduce Mg flare.

Furthermore, the same effect is exhibited as described in the second embodiment, such as reduction of optical color mixing in the adjacent pixel by the light-shielding film 39 of the pixel boundary, reduction of generation of Mg flare by suppression of the incidence of the diffracted light on the effective pixel, and uniform sensitivity within the effective pixel region by the planarization film 41. Thus, the back-illuminated solid-state imaging device 71 according to the seventh embodiment can achieve improvement in image quality.

9. Eighth Embodiment

Configuration Example of Solid-State Imaging Device

Figure 24:
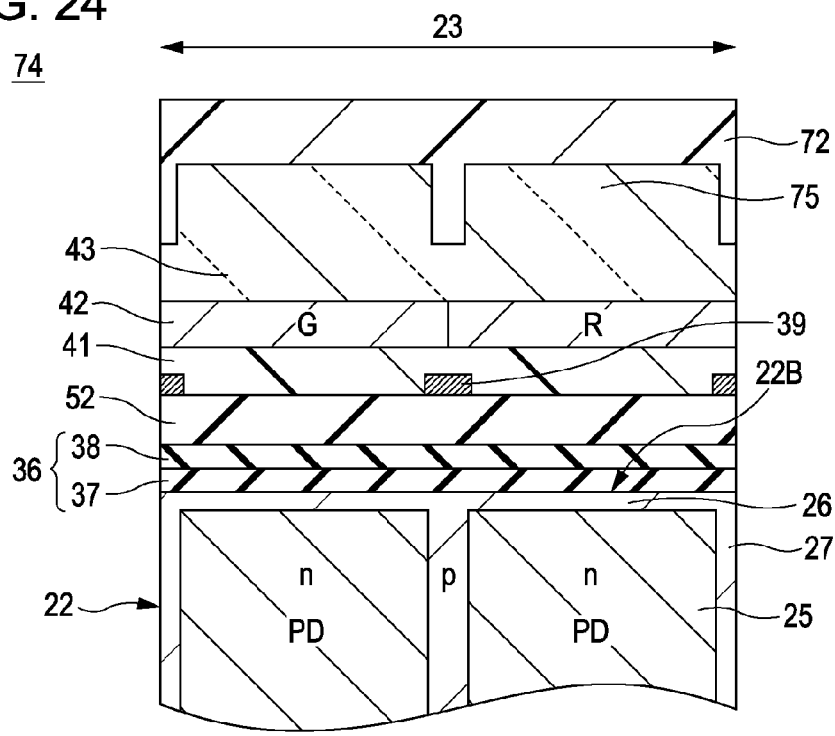
FIG. 24 is a partial configuration diagram illustrating a back-illuminated solid-state imaging device according to an eighth embodiment of the invention.

FIG. 24 shows the eighth embodiment of the solid-state imaging device according to the invention. The solid-state imaging device according to the embodiment is a back-illuminated CMOS solid-state imaging device. In the same drawing, a portion of the substrate surface sides is omitted and the only partial cross-sectional structure is shown. The omitted parts are the same as those of FIG. 14. The solid-state imaging device 74 according to the eighth embodiment is constituted so that each of the photodiodes PD is formed in the pixel region 23 of the semiconductor substrate 22, and a logic circuit is formed in the peripheral circuit section (not shown). Each of the pixel composed of the photodiode PD and the pixel transistor is isolated by the element isolation region 27. The antireflection film 36 and the insulating film 52 are formed on the substrate backside 22B used as a light receiving surface of the photodiode PD, and the lattice-shaped light-shielding film 39 is formed in the pixel boundary on the insulating film 52. Further, the on-chip color filter 42 and an on-chip microlens 75 are formed on the insulating film 52 including the light-shielding film 39 through the planarization film 41.

In the embodiment, the on-chip microlens 75 is formed by a rectangular lens, and the transparent planarization film 72 which is uniformly and continuously formed on the on-chip microlens 75. This planarization film 72 is formed by a material film having a lower refractive index than that of the on-chip microlens 43, for example, an organic film such as resin.

Furthermore, the configuration is the same as described in the second embodiment, therefore the same numerals and signs are attached to the parts corresponding to FIG. 14 and the description thereof is omitted.

With the solid-state imaging device 74 according to the eighth embodiment, since the planarization film 72 which is uniformly and continuously formed on the on-chip microlens 75, it is possible to reduce reflectance caused by the on-chip microlens 75 and the on-chip color filter 42 when photographing using a high-intensity light source. Therefore, it is possible to suppress the incidence of the diffracted light on the effective pixel and to further reduce Mg flare. In addition, since the on-chip microlens 75 is formed by a rectangular lens, it is possible to make a lens height higher, and to improve a light-collecting capacity of the on-chip microlens to a large extent.

Furthermore, the same effect is exhibited as described in the second embodiment, such as reduction of optical color mixing in the adjacent pixel by the light-shielding film 39 of the pixel boundary, reduction of generation of Mg flare by suppression of the incidence of the diffracted light on the effective pixel, and uniform sensitivity within the effective pixel region by the planarization film 41. Thus, the back-illuminated solid-state imaging device 74 according to the eighth embodiment can achieve improvement in image quality.

10. Ninth Embodiment

Configuration Example of Solid-State Imaging Device

Figure 25:
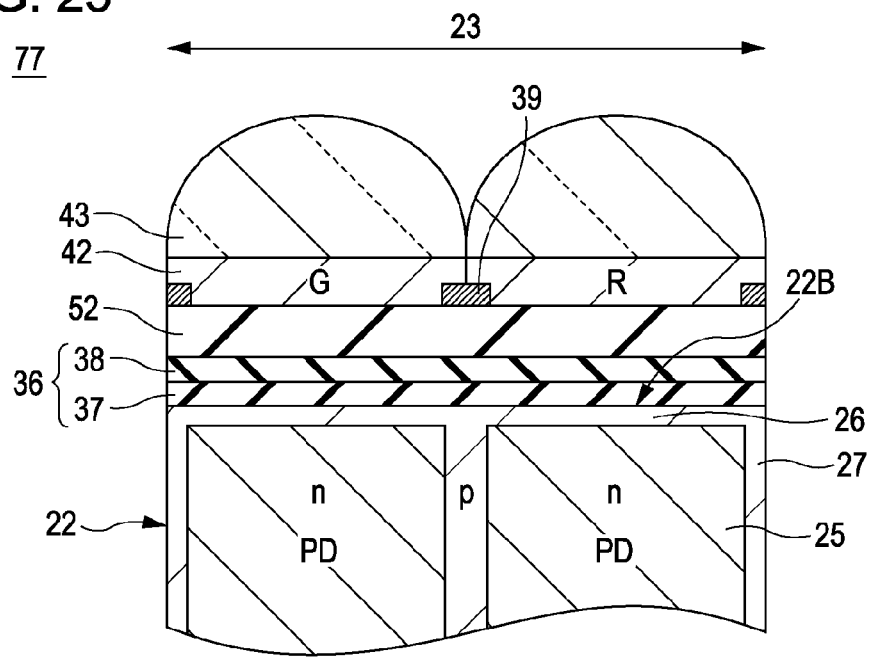
FIG. 25 is a partial configuration diagram illustrating a back-illuminated solid-state imaging device according to a ninth embodiment of the invention.

FIG. 25 shows the ninth embodiment of the solid-state imaging device according to the invention. The solid-state imaging device according to the embodiment is a back-illuminated CMOS solid-state imaging device. In the same drawing, a portion of the substrate surface sides is omitted and the only partial cross-sectional structure is shown. The omitted parts are the same as those of FIG. 14. The solid-state imaging device 77 according to the ninth embodiment is constituted so that each of the photodiodes PD is formed in the pixel region 23 of the semiconductor substrate 22, and a logic circuit is formed in the peripheral circuit section (not shown). Each of the pixel composed of the photodiode PD and the pixel transistor is isolated by the element isolation region 27. The antireflection film 36 and the insulating film 52 are formed on the substrate backside 22B used as a light receiving surface of the photodiode PD, and the lattice-shaped light-shielding film 39 is formed in the pixel boundary on the insulating film 52.

In the embodiment, the planarization film 41 is omitted, the on-chip color filter 42 is formed directly on the antireflection film 36 including the light-shielding film 39, and the on-chip microlens 43 is formed thereon. A portion of each of the color filters of the on-chip color filter 42 is formed between the light-shielding films 39.

Furthermore, the configuration is the same as described in the second embodiment, therefore the same numerals and signs are attached to the parts corresponding to FIG. 14 and the description thereof is omitted.

With the solid-state imaging device 77 according to the ninth embodiment, since the on-chip color filter 42 is formed directly on the antireflection film 36 including the light-shielding film 39, the sensitivity is increased, and optical color mixing and Mg flare are reduced.

Furthermore, the same effect is exhibited as described in the second embodiment, such as reduction of optical color mixing in the adjacent pixel by the light-shielding film 39 of the pixel boundary, reduction of generation of Mg flare by suppression of the incidence of the diffracted light on the effective pixel, and uniform sensitivity within the effective pixel region by the planarization film 41. Thus, the back-illuminated solid-state imaging device 77 according to the ninth embodiment can achieve improvement in image quality.

11. Tenth Embodiment

Configuration Example of Solid-State Imaging Device

Figure 26:
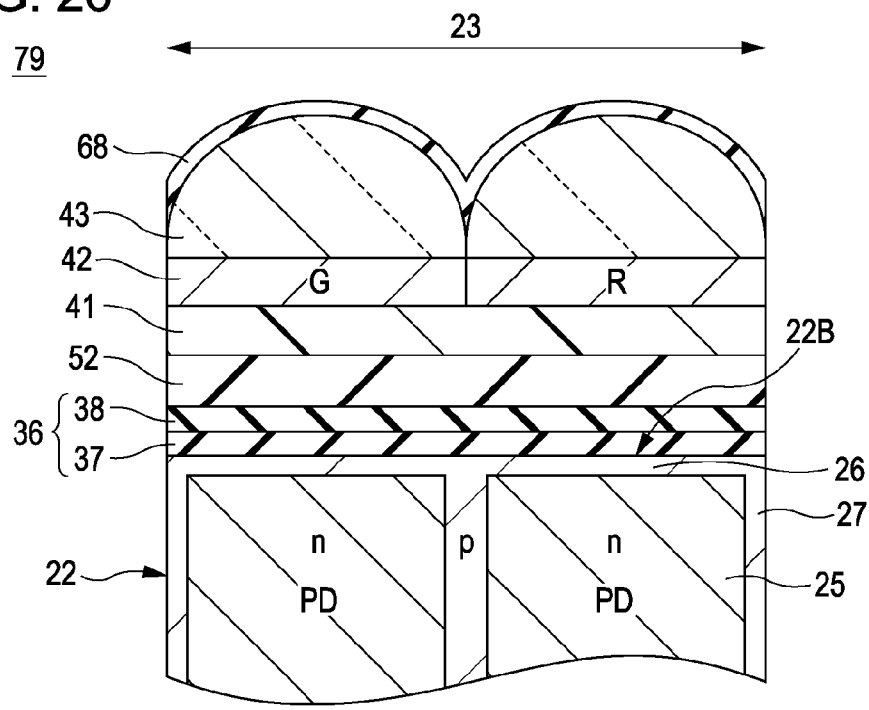
FIG. 26 is a partial configuration diagram illustrating a back-illuminated solid-state imaging device according to a tenth embodiment of the invention.

FIG. 26 shows the tenth embodiment of the solid-state imaging device according to the invention. The solid-state imaging device according to the embodiment is a back-illuminated CMOS solid-state imaging device. In the same drawing, a portion of the substrate surface sides is omitted and the only partial cross-sectional structure is shown. The omitted parts are the same as those of FIG. 14. The solid-state imaging device 79 according to the tenth embodiment is equal to the configuration where the light-shielding film 39 of the pixel boundary is omitted in the above-mentioned sixth embodiment (see FIG. 22). Meanwhile, the peripheral circuit section and the optical black level region are shielded from light—as in the example of the related art.

That is, the solid-state imaging device 79 according to the embodiment is constituted so that each of the photodiodes PD is formed in the pixel region 23 of the semiconductor substrate 22, and a logic circuit is formed in the peripheral circuit section (not shown). Each pixel composed of the photodiode PD and the pixel transistor is isolated by the element isolation region 27. The antireflection film 36 and the insulating film 52 are formed on the substrate backside 22B used as a light receiving surface of the photodiode PD. The on-chip color filter 42 and the on-chip microlens 43 are formed on the insulating film 52 through the planarization film 41.

Further, in the embodiment, the antireflection film 68 is formed on the surface of each on-chip microlens 43 so as to be along the lens surface. It is possible to be formed by one layer of, for example, a silicon oxide film as this antireflection film 68. It is also possible to be formed by the other plural layer films as the antireflection film 68.

Furthermore, the configuration is the same as described in the second embodiment, therefore the same numerals and signs are attached to the parts corresponding to FIG. 14 and the description thereof is omitted.

With the solid-state imaging device 79 according to the tenth embodiment, it is possible to reduce reflectance caused by the on-chip microlens 43 and the on-chip color filter 42 when photographing using a high-intensity light source by forming the antireflection film 68 in the surface of the on-chip microlens 43. Therefore, it is possible to further reduce the incidence of the diffracted light on the effective pixel and to further reduce Mg flare. Thus, the back-illuminated solid-state imaging device 79 according to the tenth embodiment can achieve improvement in image quality.

12. Eleventh Embodiment

Configuration Example of Solid-State Imaging Device

Figure 27:
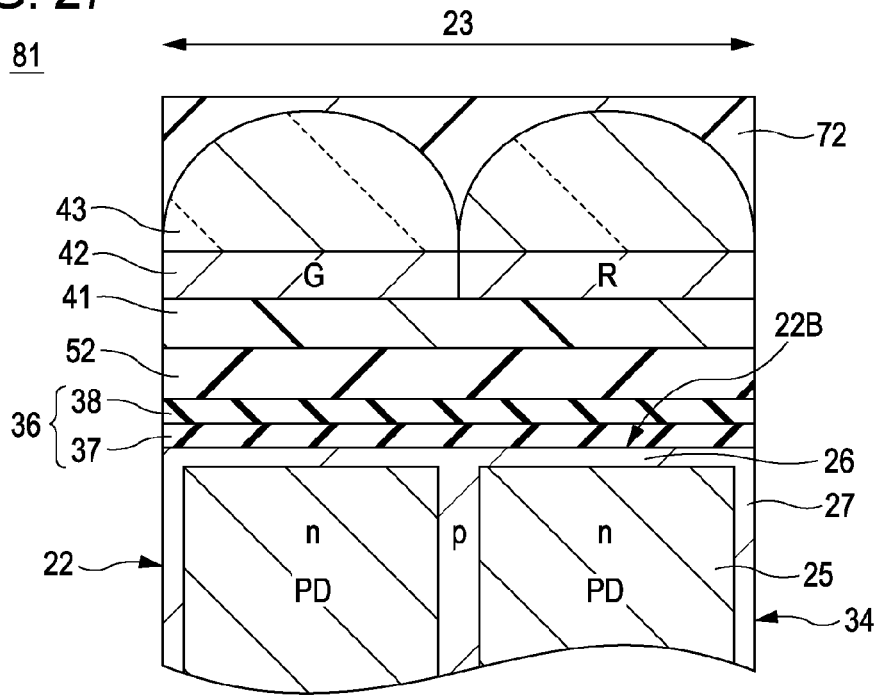
FIG. 27 is a partial configuration diagram illustrating a back-illuminated solid-state imaging device according to an eleventh embodiment of the invention.

FIG. 27 shows the eleventh embodiment of the solid-state imaging device according to the invention. The solid-state imaging device according to the embodiment is a back-illuminated CMOS solid-state imaging device. In the same drawing, a portion of the substrate surface sides is omitted and the only partial cross-sectional structure is shown. The omitted parts are the same as those of FIG. 14. The solid-state imaging device 81 according to the eleventh embodiment is equal to the configuration where the light-shielding film 39 of the pixel boundary is omitted in the above-mentioned seventh embodiment (see FIG. 23). Meanwhile, the peripheral circuit section and the optical black level region are shielded from light as in the example of the related art.

That is, the solid-state imaging device 81 according to the embodiment is constituted so that each of the photodiodes PD is formed in the pixel region 23 of the semiconductor substrate 22, and a logic circuit is formed in the peripheral circuit section (not shown). Each pixel composed of the photodiode PD and the pixel transistor is isolated by the element isolation region 27. The antireflection film 36 and the insulating film 52 are formed on the substrate backside 22B used as a light receiving surface of the photodiode PD. The on-chip color filter 42 and the on-chip microlens 43 are formed on the insulating film 52 through the planarization film 41.

In the embodiment, the transparent planarization film 72 which is uniformly and continuously formed on the on-chip microlens 43. This planarization film 72 is formed by a material film having a lower refractive index than that of the on-chip microlens 43, for example, an organic film such as resin.

Furthermore, the configuration is the same as described in the second embodiment, therefore the same numerals and signs are attached to the parts corresponding to FIG. 14 and the description thereof is omitted.

With the solid-state imaging device 81 according to the eleventh embodiment, since the planarization film 72 which is uniformly and continuously formed on the on-chip microlens 43, it is possible to reduce reflectance caused by the on-chip microlens 43 and the on-chip color filter 42 when photographing using a high-intensity light source. Therefore, it is possible to suppress the incidence of the diffracted light on the effective pixel and to further reduce Mg flare.

Thus, the back-illuminated solid-state imaging device 81 according to the eleventh embodiment can achieve improvement in image quality.

13. Twelfth Embodiment

Configuration Example of Solid-State Imaging Device

Figure 28:
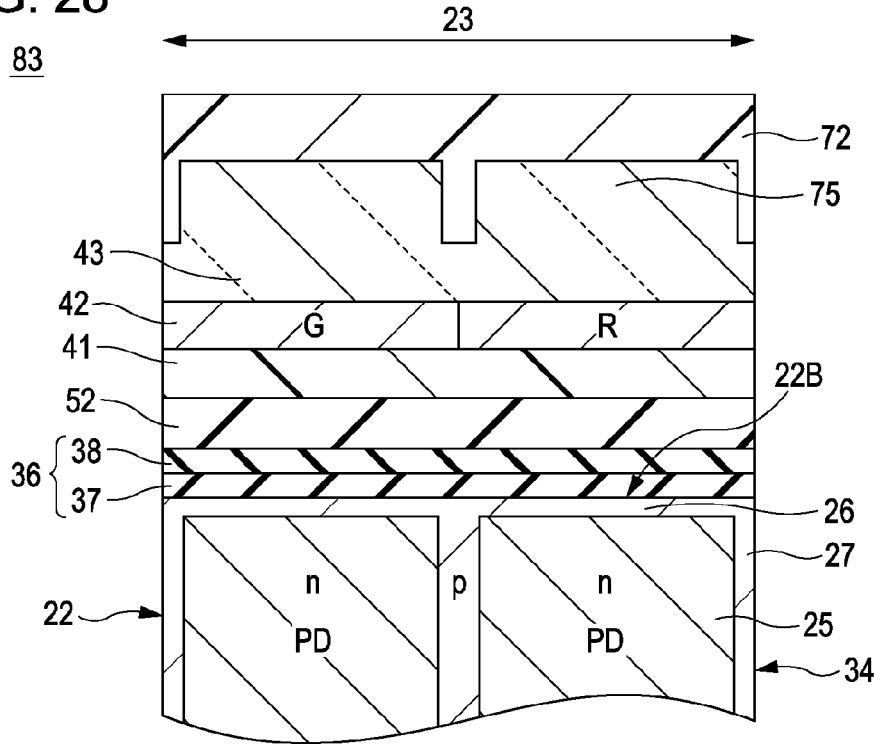
FIG. 28 is a partial configuration diagram illustrating a back-illuminated solid-state imaging device according to a twelfth embodiment of the invention.

FIG. 28 shows the twelfth embodiment of the solid-state imaging device according to the invention. The solid-state imaging device according to the embodiment is a back-illuminated CMOS solid-state imaging device. In the same drawing, a portion of the substrate surface sides is omitted and the only partial cross-sectional structure is shown. The omitted parts are the same as those of FIG. 14. The solid-state imaging device 83 according to the twelfth embodiment is equal to the configuration where the light-shielding film 39 of the pixel boundary is omitted in the above-mentioned eighth embodiment (see FIG. 24). Meanwhile, the peripheral circuit section and the optical black level region are shielded from light as in the example of the related art.

That is, the solid-state imaging device 81 according to the embodiment is constituted so that each of the photodiodes PD is formed in the pixel region 23 of the semiconductor substrate 22, and a logic circuit is formed in the peripheral circuit section (not shown). Each pixel composed of the photodiode PD and the pixel transistor is isolated by the element isolation region 27. The antireflection film 36 and the insulating film 52 are formed on the substrate backside 22B used as a light receiving surface of the photodiode PD. The on-chip color filter 42 and the on-chip microlens 75 are formed on the insulating film 52 through the planarization film 41.

In the embodiment, the on-chip microlens 75 is formed by a rectangular lens, and the transparent planarization film 72 which is uniformly and continuously formed on the on-chip microlens 75. This planarization film 72 is formed by a material film having a lower refractive index than that of the on-chip microlens 43, for example, an organic film such as resin.

Furthermore, the configuration is the same as described in the second embodiment, therefore the same numerals and signs are attached to the parts corresponding to FIG. 14 and the description thereof is omitted.

With the solid-state imaging device 83 according to the twelfth embodiment, since the planarization film 72 which is uniformly and continuously formed on the on-chip microlens 75, it is possible to reduce reflectance caused by the on-chip microlens 75 and the on-chip color filter 42 when photographing using a high-intensity light source. Therefore, it is possible to suppress the incidence of the diffracted light on the effective pixel and to further reduce Mg flare. In addition, since the on-chip microlens 75 is formed by a rectangular lens, it is possible to make a lens height higher, and to improve a light-collecting capacity of the on-chip microlens to a large extent. Thus, the back-illuminated solid-state imaging device 74 according to the twelfth embodiment can achieve improvement in image quality.

In the third embodiment to the twelfth embodiment, it is also possible to form the configurations where the insulating film 52 is omitted similar to the first embodiment. In addition, it is also possible to form the configurations where the characteristic configurations in the first embodiment to the twelfth embodiment are combined with each other.

14. Thirteenth Embodiment

Configuration Example of Solid-State Imaging Device

Figure 29:
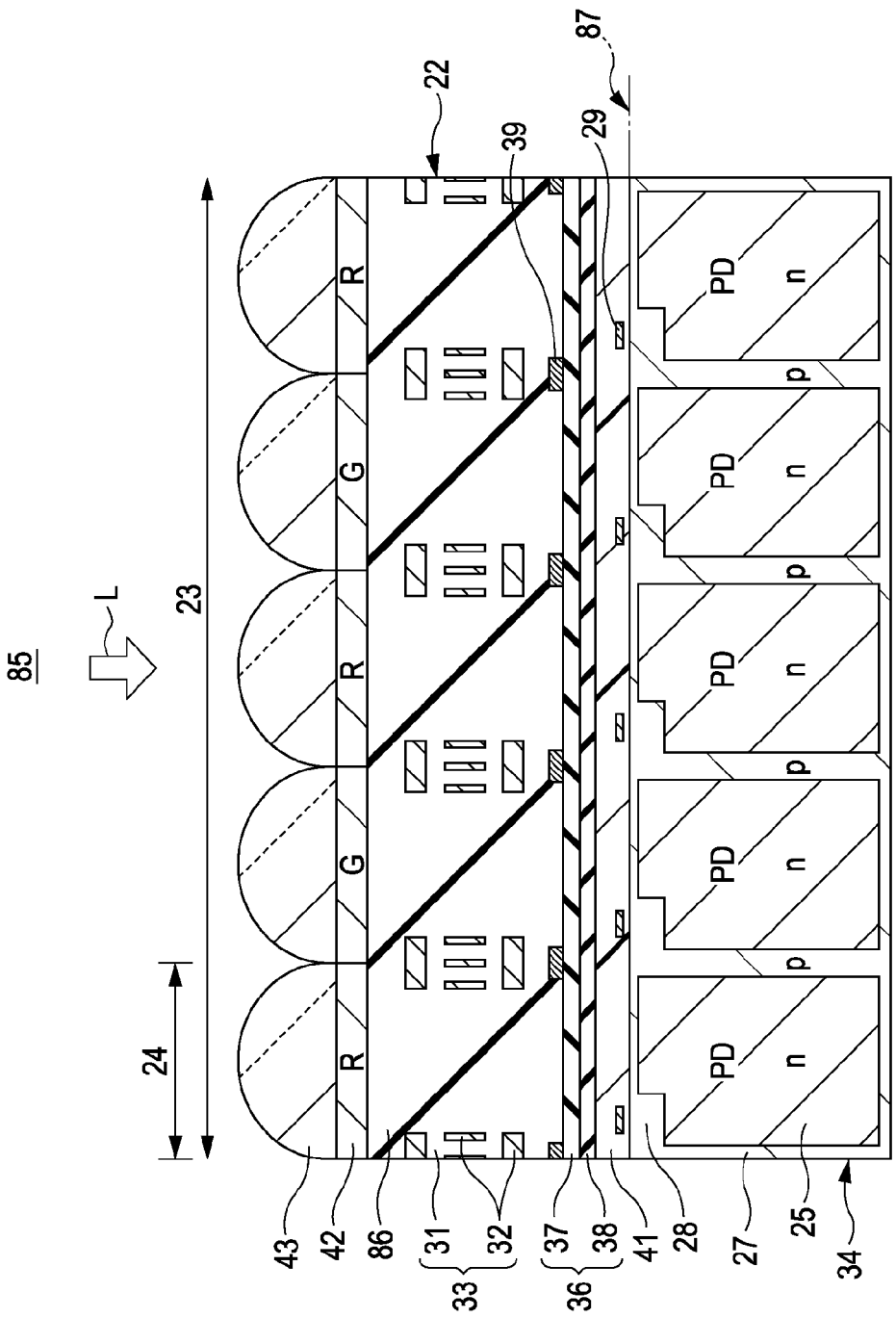
FIG. 29 is a partial configuration diagram illustrating a front-illuminated solid-state imaging device according to a thirteenth embodiment of the invention.

FIG. 29 shows the thirteenth embodiment of the solid-state imaging device according to the invention. The solid-state imaging device according to the embodiment is a back-illuminated CMOS solid-state imaging device. The solid-state imaging device 85 according to the thirteenth embodiment forms, for example, a pixel region (so-called image capturing region) 23 in which a plurality of pixels is arranged in a semiconductor substrate 22 made of silicon, and a peripheral circuit section (not shown) disposed in a periphery of the pixel region 23. A unit pixel 24 is constituted by a photodiode PD used as a photoelectric conversion section and a plurality of pixel transistors Tr. The photodiode PD is formed so as to extend over the whole region in a thickness direction of the semiconductor substrate 22, and is configured as a p-n junction type photodiode composed of a first conductivity type, which is an n-type semiconductor region 25 in the example, and a second conductivity type facing both sides of the substrate, which is a p-type semiconductor region 26 in the example. The p-type semiconductor region facing both sides of the substrate further includes a hole charge accumulation region for suppressing dark current.

Each of the pixels 24 composed of the photodiode PD and the pixel transistor Tr is isolated by an element isolation region 27. The element isolation region 27 is formed and, for example, grounded by the p-type semiconductor region. The pixel transistor Tr forms a n-type source region and a drain region, which are not shown, in a p-type semiconductor well region 28 formed on a surface 22A side of the semiconductor substrate 22, and forms a gate electrode 29 on the substrate surface between both regions through a gate insulating film. In the same drawing, a plurality of pixel transistors is shown as represented by one pixel transistor Tr, and is schematically indicated by the gate electrode 29.

In the embodiment, an insulating film is formed on the surface 22A used as a light receiving surface of the semiconductor substrate 22 in which the pixel transistor Tr is formed, through the planarization film 86 made of an insulating film such as, for example, a silicon oxide film. This insulating layer is formed by an antireflection film 36 in the example. The antireflection film 36 is formed by a multilayer film having a different refractive index, and is formed by a two-layer film made of the hafnium oxide ($HfO_2$) film 37 and the silicon oxide film 38 in the example.

Further, the light-shielding film 39 is formed at a pixel boundary on this antireflection film 36. As mentioned above, this light-shielding film 39 may be a light-shielding material. Meanwhile, it is preferable to form the light-shielding film with a film of metal, for example, aluminum (Al) or tungsten (W) as a material which has strong light-shielding properties, and is capable of being processed with good accuracy using microfabrication, for example, etching. The light-shielding film 39 may be formed by, for example, polysilicon.

So-called multilayer interconnection layers 33 in which a plurality of layers of interconnections 32 is disposed through the interlayer insulating film 31 are formed on the antireflection film 36 including the light-shielding film 39. The on-chip color filter 42 and the on-chip microlens 43 thereon are sequentially formed on the multilayer interconnection layer 33 through the planarization film 86. The light L enters from the substrate surface 22A, and is collected by the on-chip microlens 43 and then received in each of the photodiodes PD.

With the back-illuminated solid-state imaging device 85 according to the thirteenth embodiment, since the light-shielding film 39 is formed in the pixel boundary very close to the light receiving surface 34, light travelling to an adjacent pixel is shielded without being collected by the on-chip microlens 43. That is, it is possible to prevent the light from being incident on the adjacent pixel by the light-shielding film 39 of the pixel boundary, and to reduce optical color mixing. Thus, the solid-state imaging device 85 according to the thirteenth embodiment can improve image quality.

15. Fourteenth Embodiment

Configuration Example of Solid-State Imaging Device

Figure 30:
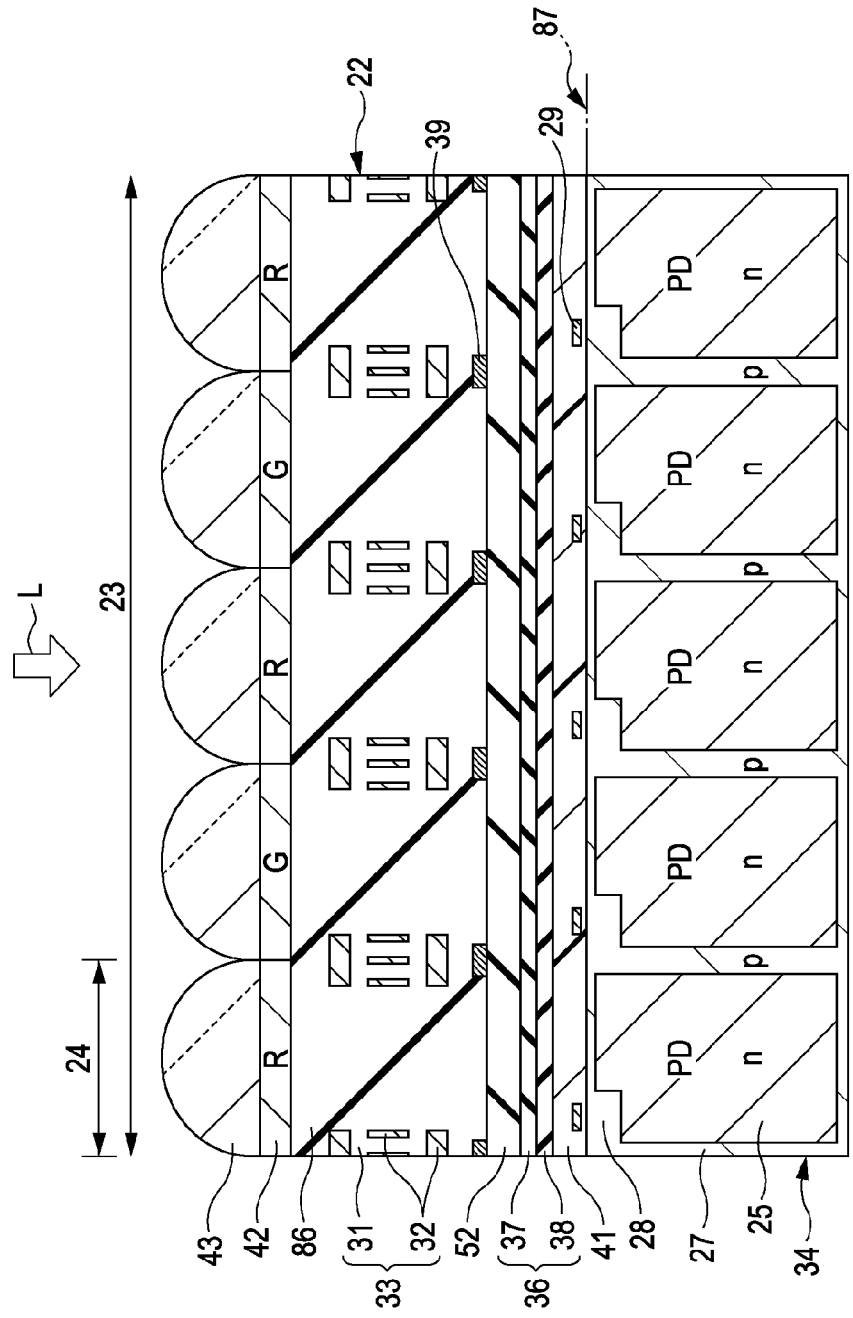
FIG. 30 is a partial configuration diagram illustrating a front-illuminated solid-state imaging device according to a fourteenth embodiment of the invention.

FIG. 30 shows the fourteenth embodiment of the solid-state imaging device according to the invention. The solid-state imaging device according to the embodiment is a back-illuminated CMOS solid-state imaging device. Similar to the thirteenth embodiment, the solid-state imaging device 89 according to the fourteenth embodiment forms, for example, a pixel region (so-called image capturing region) 23 in which a plurality of pixels is arranged in a semiconductor substrate 22 made of silicon, and a peripheral circuit section (not shown) disposed in a periphery of the pixel region 23. A logic circuit is formed in the peripheral circuit section. A unit pixel 24 is constituted by a photodiode PD used as a photoelectric conversion section and a plurality of pixel transistors Tr. The photodiode PD is formed so as to extend over the whole region in a thickness direction of the semiconductor substrate 22, and is configured as a p-n junction type photodiode composed of a first conductivity type, which is an n-type semiconductor region 25 in the example, and a second conductivity type facing both sides of the substrate, which is a p-type semiconductor region 26 in the example. The p-type semiconductor region facing both sides of the substrate further includes a hole charge accumulation region for suppressing dark current.

Each of the pixels 24 composed of the photodiode PD and the pixel transistor Tr is isolated by an element isolation region 27. The element isolation region 27 is formed and, for example, grounded by the p-type semiconductor region. The pixel transistor Tr forms a n-type source region and a drain region, which are not shown, in a p-type semiconductor well region 28 formed on a surface 22A side of the semiconductor substrate 22, and forms a gate electrode 29 on the substrate surface between both regions through a gate insulating film. In the same drawing, a plurality of pixel transistors is shown as represented by one pixel transistor Tr, and is schematically indicated by the gate electrode 29.

In the embodiment, an insulating film is formed on the surface 22A used as a light receiving surface of the semiconductor substrate 22 in which the pixel transistor Tr is formed, through the planarization film 86 made of an insulating film such as, for example, a silicon oxide film. This insulating layer is formed by an antireflection film 36 in the example. The antireflection film 36 is formed by a multilayer film having a different refractive index, and is formed by a two-layer film made of the hafnium oxide (HfO$_2$) film 37 and the silicon oxide film 38 in the example.

Further, in the embodiment, the insulating film 52 is formed on this antireflection film 36, and a light-shielding film 39 is formed at the pixel boundary on this insulating film 52. The insulating film 52 is set up so as for a film type and a film thickness thereof to be an optically appropriate value. The insulating film 52 may be formed by, for example, a silicon oxide film, and is set up so as for film thickness thereof to be sufficiently thicker than at least a film thickness of the antireflection film 36. The light-shielding film 39 may be a light-shielding material. Meanwhile, it is preferable to form the light-shielding film with a film of metal, for example, aluminum (Al) or tungsten (W) as a material which has strong light-shielding properties, and is capable of being processed with good accuracy using microfabrication, for example, etching. The light-shielding film 39 may be also formed by, for example, poly-silicon.

So-called multilayer interconnection layers 33 in which a plurality of layers of interconnections 32 is disposed through the interlayer insulating film 31 are formed on the insulating film 52 including the light-shielding film 39. The on-chip color filter 42 and the on-chip microlens 43 thereon are sequentially formed on the multilayer interconnection layer 33 through the planarization film 86. The light L enters from the substrate surface 22A, and is collected by the on-chip microlens 43 and then received in each of the photodiodes PD.

With the back-illuminated solid-state imaging device 89 according to the fourteenth embodiment, the insulating film 52 of which film thickness is thicker than that of the antireflection film 36 is formed on the antireflection film 39, and the light-shielding film 36 is formed at a portion corresponding to the pixel boundary on this insulating film 52, therefore the optimal antireflection film 36 is maintained. That is, formation of the light-shielding film 36 is patterned by selective etching, after the light-shielding film material layer is formed in the whole surface. In this selective etching, even though an underlying layer receives an etching damage, the damage received by the insulating film 52, therefore the antireflection film 36 is not affected at all.

Similar to the thirteenth embodiment, since the light-shielding film 39 is formed in the pixel boundary very close to the light receiving surface 87, light travelling to an adjacent pixel is shielded without being collected by the on-chip microlens 43. That is, it is possible to prevent the light from being incident on the adjacent pixel by the light-shielding film 39 of the pixel boundary, and to reduce optical color mixing. Thus, the solid-state imaging device 85 according to the fourteenth embodiment can improve an image quality.

In the solid-state imaging device according to the embodiment described above, the first conductivity type is set to an n type and the second conductivity type is set to a p type, using the signal charge as an electron. However, when the signal charge is used as a hole, the first conductivity type may be set to a p type and the second conductivity type may be set to an n type. In this case, the conductivity type semiconductor region according to the embodiment described above becomes a reverse conductivity type.

16. Fifteenth Embodiment

Configuration Example of Electronic Apparatus

The solid-state imaging devices according to the invention described above can be applied to electronic apparatuses such as, for example, camera systems of a digital camera or a video camera and like, cellular phones having an image capturing function, or other apparatuses having an image capturing function.

Figure 43:
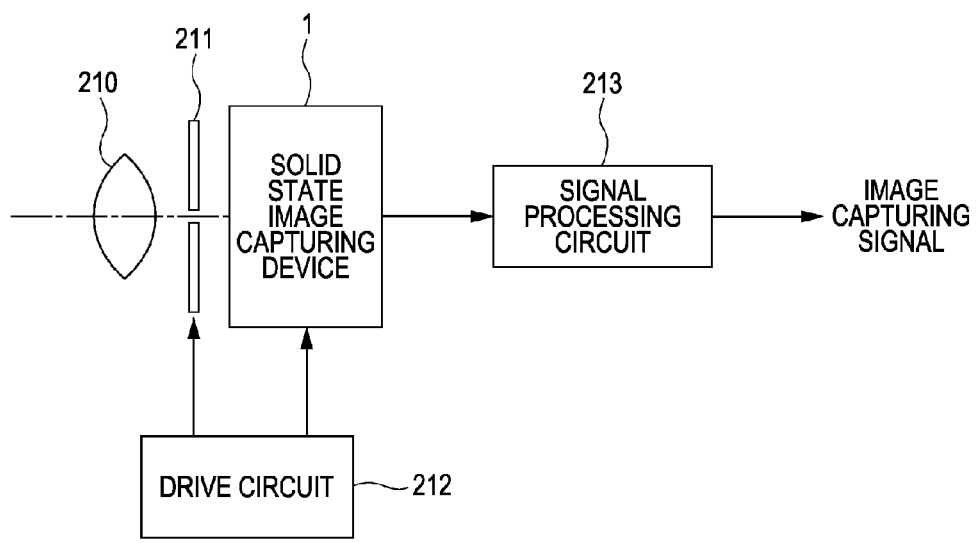
FIG. 43 is a schematic configuration diagram of an electronic apparatus according to a fifteenth embodiment and an eighteenth embodiment of the invention.

FIG. 43 shows the third embodiment applied to a camera as an example of the electronic apparatus according to the invention. The camera according to examples of the embodiments includes a video camera capable of photographing a still image or a moving image as an example. The camera according to examples of the embodiments includes a solid-state imaging device 1, an optical system 210 for leading incident light to a light-receiving sensor portion of the solid-state imaging device 1, a shutter device 211, a drive circuit 212 for driving the solid-state imaging device 1, and a signal processing circuit 213 for processing an output signal of the solid-state imaging device 1.

The solid-state imaging device 1 is applied to any of the solid-state imaging devices according to each embodiment described above. The optical system (optical lens) 210 images an image light (incident light) from a photographic subject on an image capturing surface of the solid-state imaging device 1. Herewith, signal charges are accumulated within the solid-state imaging device 1 for a certain period of time. The optical system 210 may be an optical lens system constituted by a plurality of optical lenses. The shutter device 211 controls a period of light illumination and a period of light shielding to the solid-state imaging device 1. The drive circuit 212 supplies a driving signal for controlling a transfer operation of the solid-state imaging device 1 and a shutter operation of the shutter device 211. The signal transfer in the solid-state imaging device 1 is performed by the driving signal (timing signal) supplied from the drive circuit 212. The signal processing circuit 213 is performed various types of signal processing. The image signal which the signal processing has performed is stored in a storage medium such as a memory, or is output to a monitor.

With the electronic apparatus according to the fourth embodiment, the solid-state imaging device according to the above-mentioned embodiments is used as the solid-state imaging device 1, to thereby allow improvement in image quality to be achieved, and to allow an electronic apparatus such as a camera having a higher reliability to be provided.

17. Sixteenth Embodiment

Solid-State Imaging Device 17.1 Configuration of the Whole Solid-State Imaging Device FIG. 7 is a schematic configuration diagram illustrating the whole CMOS type solid-state imaging device according to the sixteenth embodiment of the invention.

The solid-state imaging devices or the electronic apparatuses associated with the first embodiment to fifteenth embodiment may be used simultaneously with the solid-state imaging devices or the electronic apparatuses associated with the sixteenth embodiment to eighteenth embodiment.

The solid-state imaging device 1 includes, a pixel 2, a pixel section 3, a vertical drive circuit 4, a column signal processing circuit 5, a horizontal drive circuit 6, an output circuit 7, a control circuit 8, a horizontal signal 10, a pixel forming region 512, a substrate 513, a support substrate 514, an interconnection layer 515, an on-chip lens 516, a light-shielding portion 517, a high-dielectric material film 518, a trench portion 519, a light-shielding film 520, a charge accumulation region 521, a dark current suppression region 522, a dark current suppression region 523, an element isolation region 524, an interconnection 525, an interconnection layer 526, an interlayer insulating film 527, a gate electrode 528, a gate insulating film 529, a backside region 530, a silicon layer 530a, an etching stopper layer 530b, a photoresist layer 531, an aperture portion 531a, and a burying film 532.

The solid-state imaging device 1 according to the example of the embodiment includes the pixel section 3 constituted by a plurality of pixels 2 which is arranged on the substrate 11 made of silicon, the vertical drive circuit 4, the column signal processing circuit 5, the horizontal drive circuit 6, the output circuit 7, and control circuit 8.

A plurality of pixels 2 is constituted by the light-receiving portion composed of the photodiodes, and a plurality of pixel transistors, and is regularly arranged on the substrate 11 in a two-dimensional array shape. The pixel transistors constituting the pixel 2 may be four MOS transistors which are composed of a transfer transistor, a reset transistor, a selective transistor, an amplifying transistor, and may also be three transistors excluding the selective transistor.

The pixel section 3 is constituted by a plurality of pixels 2 which is regularly arranged in a two-dimensional array shape. The pixel section 3 is constituted by an effective pixel region in which light is actually received and a signal charge generated by photoelectric conversion is amplified and thereby reads out the signal charge in the column signal processing circuit 5, a black reference pixel region (not shown) for outputting optical black which is a reference of black level. The black reference pixel region is typically formed at a circumference portion of the effective pixel region.

The control circuit 8 generates a clock signal or a control signal and the like which is a reference of operation of the vertical drive circuit 4, the column signal processing circuit 5, the horizontal drive circuit 6 and the like on the basis of a vertical synchronization signal, a horizontal synchronization signal and a master clock. The clock signal or the control signal and the like generated by the control circuit 8 are input to the vertical drive circuit 4, the column signal processing circuit 5, horizontal drive circuit 6 and the like.

The vertical drive circuit 4 is constituted by, for example, shift registers, and sequentially selectively scans each pixel 2 of the pixel section 3 in a vertical direction in a row unit. A pixel signal, which is based on the signal charge generated in response to the amount of light received in the photodiodes of each pixel 2, is supplied to the column signal processing circuit 5 through a vertical signal line.

The column signal processing circuit 5, for example, is disposed for each column of the pixel 2, and performs the signal processing such as denoising or signal amplification by the signal from the black reference pixel region (not shown, and formed at the periphery of the effective pixel region) processing a signal output from one line of the pixels 2 for each pixel column. An output stage of the column signal processing circuit 5 is provided with a horizontal selective switch (not shown) between the horizontal signal line 10 and the output stage.

The horizontal drive circuit 6, for example, is constituted by the shift registers, and sequentially outputs horizontal scan pulses, to thereby select each of the column signal processing circuits 5 in order, and to output the pixel signal from each of the column signal processing circuits 5 to the horizontal signal line 10.

The output circuit 7 performs the signal processing on the signal sequentially supplied from each of the column signal processing circuits 5 through the horizontal signal line 10 and outputs the signal.

17.2 Partial Configuration

Figure 31:
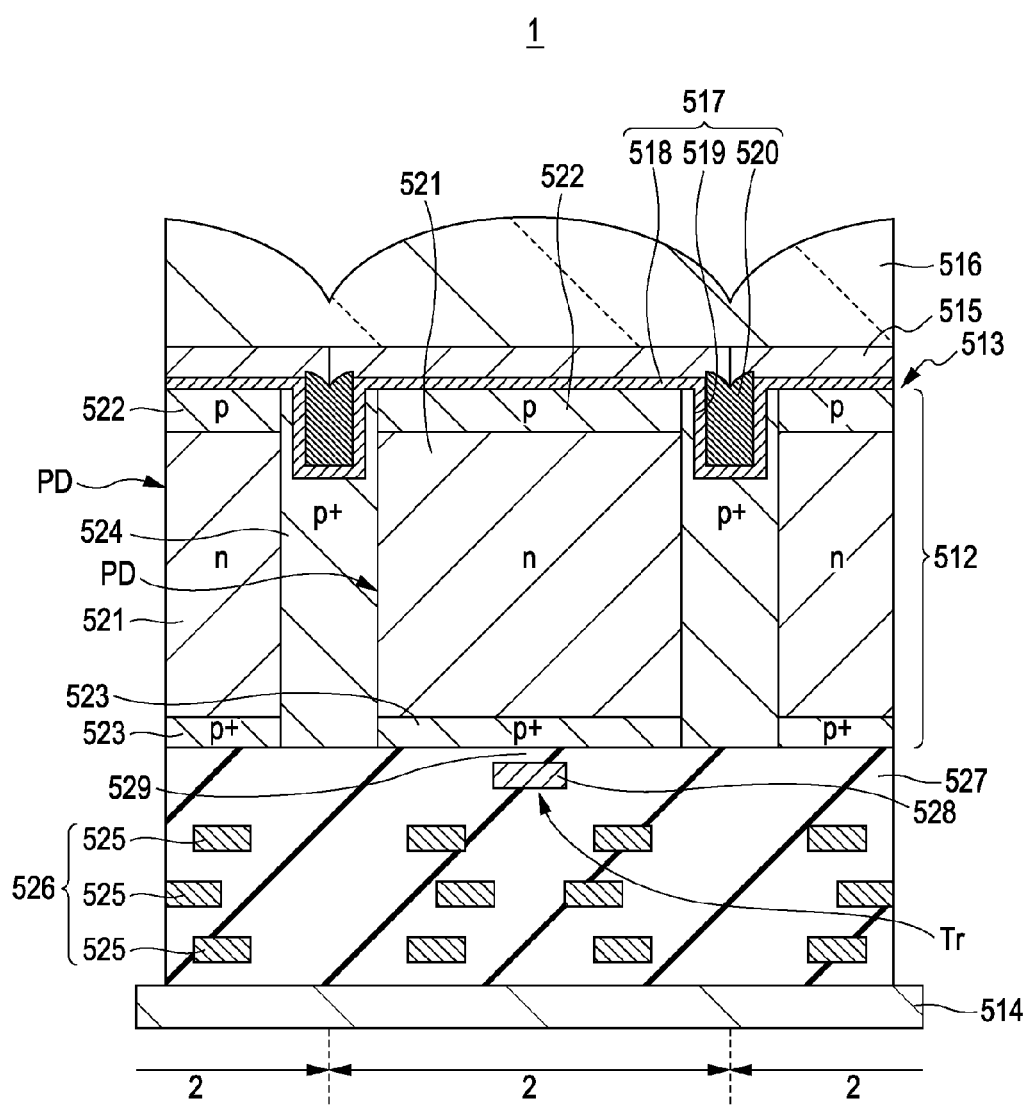
FIG. 31 is a cross-sectional configuration diagram in a pixel section of a solid-state imaging device according to a sixteenth embodiment.

FIG. 31 shows a cross-sectional configuration diagram in the pixel section 3 of the solid-state imaging device 1 according to the example of the embodiment. The solid-state imaging device 1 according to the example of the embodiment includes a back-illuminated CMOS solid-state imaging device as an example.

As shown in FIG. 31, the solid-state imaging device 1 according to the example of the embodiment is constituted by a substrate 513, an interconnection layer 526 and a support substrate 514 formed at the surface side of the substrate 513, and a color filter layer 515 and an on-chip lens 516 formed at the backside of the substrate 513.

The substrate 513 is constituted by the semiconductor substrate made of silicon, and is constituted by the semiconductor substrate of, for example, the first conductivity type (n type in the example of the embodiment). The substrate 513 has a thickness of 3 μm to 5 μm. A plurality of the pixels 2 composed of the light-receiving portion PD, and a plurality of pixel transistors Tr constituting the pixel circuit section is formed in the pixel forming region 512 of the substrate 513 in a two-dimensional matrix shape. In addition, although not shown in FIG. 31, the peripheral circuit section is formed in the peripheral region of the pixel 2 formed in the substrate 513.

The light-receiving portion PD is constituted by dark current suppression regions 522 and 523 formed in the pixel forming region 512, and a charge accumulation region 521 formed in a region between the dark current suppression regions 522 and 523. The dark current suppression region 523 is formed in the surface side of the substrate 513 (pixel forming region 512), and is composed of a high-density impurity region of the second conductivity type (p type in the example of the embodiment). In addition, the dark current suppression region 522 is formed in the backside of the substrate 513 (pixel forming region 512), and is composed of a p-type impurity region. The charge accumulation region 521 is composed of an n-type impurity region. In this light-receiving portion PD, the photodiodes are composed mainly of a p-n junction formed between the p-type impurity region constituting the dark current suppression regions 522 and 523, and the n-type impurity region constituting the charge accumulation region 521.

In the light-receiving portion PD, the signal charges in response to the amount of incidence light are generated and accumulated. In addition, the electrons caused by generation of the dark current in the substrate interface are absorbed in the holes which are a large number of carriers of the dark current suppression regions 522 and 523, so that the dark current is suppressed.

The pixel transistors Tr are constituted by source and drain regions formed the surface side of the substrate 513, which are not shown, and the gate electrode 528 formed on the surface of the substrate 513 through a gate insulating film 529. As described above, the pixel transistors Tr may include three pixel transistors Tr made of a transfer transistor, a reset transistor and an amplification transistor, and in addition, may include four pixel transistors Tr including the selective transistor. The source and drain regions, which are not shown, are formed by the n-type high-density impurity region formed at the surface side of the substrate 13, and the pixel transistors Tr according to the example of the embodiment function as an n channel MOS transistor.

In addition, an element isolation region 524, composed of the p-type high-density impurity region extending from the surface of the substrate 513 to the backside thereof, is formed between the pixels 2 adjacent to each other. Each of the pixels 2 is electrically isolated by this element isolation region 524. Further, a light-shielding portion 517 formed in a desired depth from the backside of the substrate 513 is formed in the element isolation region 524. The light-shielding portion 517 is formed, for example, in a lattice shape so as to surround each of the pixels 2, when seen in a plan view. This light-shielding portion 517 is constituted by a trench portion 519 having a desired depth which is formed the backside of the substrate 513, a high-dielectric material film 518 formed in the sidewall and the bottom surface of the trench portion 519, and a light-shielding film 520 which is buried in the trench portion 519 through the high-dielectric material film 518. In this case, the utmost surface of the light-shielding film 520 buried in the trench portion 519 is constituted in one surface with the backside of the substrate 513. As a material of the high-dielectric material film 518, for example, hafnium oxide ($HfO_2$), tantalum pentoxide ($Ta_2O_5$), and zirconium dioxide ($ZrO_2$) may be used. In addition, as a material of the light-shielding film 20, for example, tungsten (W), aluminum (Al) may be used.

The interconnection layer 526 is formed in the surface side of the substrate 513, and includes an interconnection 525 stacked in a plurality of layers (three layers in the example of the embodiment) through an interlayer insulating film 527. The pixel transistors Tr constituting the pixel 2 are driven through the interconnection 25 formed in the interconnection layer 526.

The support substrate 514 is formed in the surface opposite to the side facing the substrate 513 of the interconnection layer 526. This support substrate 514 is constituted in order to secure the strength of the substrate 513 by level difference of manufacture, and is formed from, for example, a silicon substrate.

The color filter layer 515 is formed in the backside of the substrate 13, and the color filter layers made of, for example, R (red), G (green) and B (blue) are formed for each pixel. In the color filter layer 515, light having a desired wavelength is transmitted, and the transmitted light is incident on the light-receiving portion PD within the substrate 513.

The on-chip lens 516 is formed in the surface opposite to the side facing the substrate 513 of the color filter layer 515. In the on-chip lens 516, the illuminated light is collected, and the collected light is incident on each light-receiving portion PD through the color filter layer 515 with good efficiency.

In the solid-state imaging device 1 configured as mentioned above, the light is illuminated from the backside of the substrate 513, and the light which transmits the on-chip lens 516 and the color filter layer 515 is photoelectric-converted by the light-receiving portion PD, so that the signal charge is generated. The signal charge generated by the light-receiving portion PD is output as a pixel signal by the vertical signal line formed by the desired interconnection 525 of the interconnection layer 526 through the pixel transistor Tr formed in the surface side of the substrate 513.

In the solid-state imaging device 1 according the example of the embodiment, the electrons are not moved by the barrier formed due to a potential of the element isolation region 524 by the element isolation region 524, between the pixels 2 adjacent to each other. That is, the electrical isolation between the pixels is made due to the concentration gradient of the impurity region formed within the substrate 513.

Further, the light which obliquely enters from the light incidence side is prevented from being incident on the adjacent pixel 2 by the light-shielding portion 517 buried and formed in the element isolation region 524. That is, the optical separation between the pixels is made by the light-shielding portion 517.

In addition, when the trench portion 519 is formed in the element isolation region 524, there is a possibility that pinning deviation is generated at the peripheral portion of the trench portion 519 due to the impurity activation caused by physical damage or ion irradiation in the sidewall and the bottom surface of the trench portion 519. With respect to this problem, in the example of the embodiment, the pinning deviation is prevented by forming the high-dielectric material film 518 having many fixed charges in the sidewall and the bottom surface of the trench portion 519.

With the solid-state imaging device 1 according to the example of the embodiment, since the light-shielding portion 517 buried in the element isolation region 524 is formed between the adjacent pixels, it is possible to prevent the oblique light incident on the light receiving surface from being incident on the light-receiving portion PD. Herewith, the light incident on the adjacent pixels 2 is shielded without being collected by the on-chip lens, and optical color mixing generated between the adjacent pixels is reduced. In addition, since the light having a large angle which is incident on the adjacent pixels 2 is shielded, among the diffracted light or the reflected light generated between the light receiving surface and the on-chip lens 516, generation of flare is reduced.

Further, with the solid-state imaging device 1 according to the example of the embodiment, since the light-shielding portion 517 is configured to be buried in the element isolation region 524, the light receiving surface of the backside of the substrate 513 is planarized, and the color filter layer 515 and the on-chip lens 516 formed in the backside of the substrate 513 approach the light receiving surface. Herewith, since the distance between the surface of the on-chip lens 516 which the light enters and the light receiving surface of the substrate 513 becomes closer, the light-collecting property is improved, and reduction in color mixing is achieved.

17.3 Manufacturing Method

FIG. 32 to FIG. 41 show a manufacturing process diagram of the solid-state imaging device 1 of the present embodiment, and describes the manufacturing method of the solid-state imaging device 1 of the present embodiment.

Figure 32:
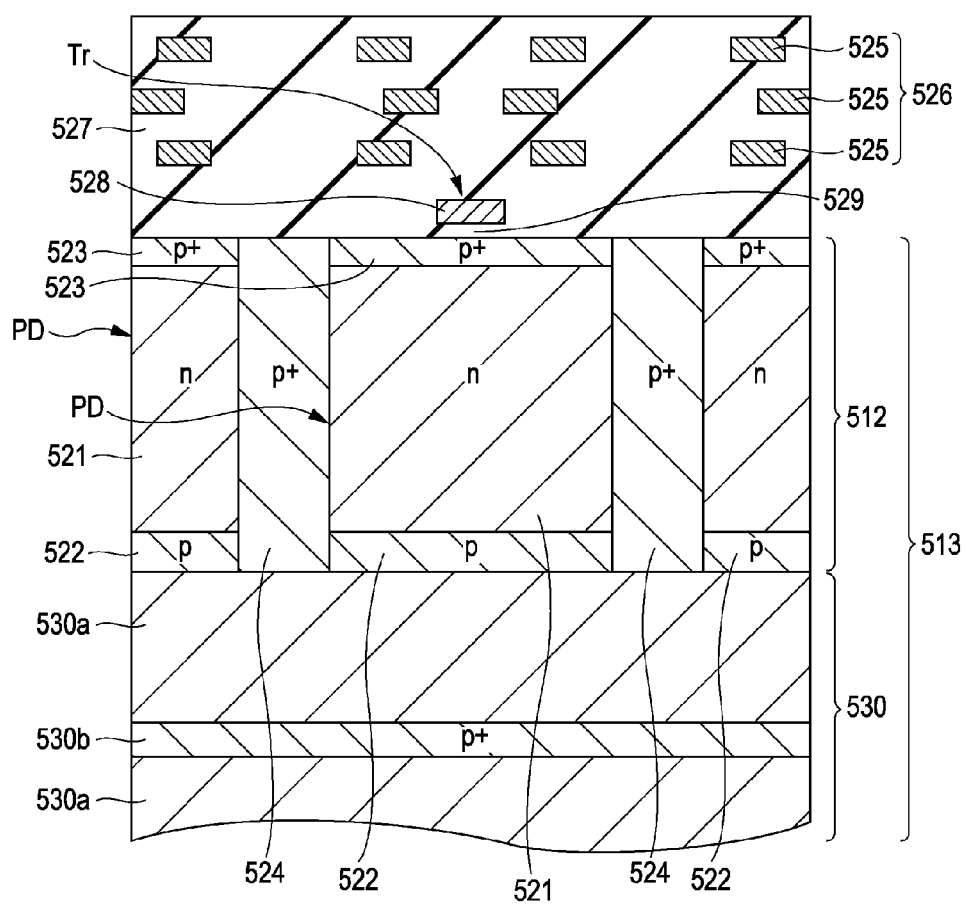
FIG. 32 is a manufacturing process diagram of the solid-state imaging device according to the sixteenth embodiment.

First, as shown in FIG. 32, a plurality of pixels 2 that includes the light-receiving portion PD and the pixel transistor Tr is formed on the substrate 513. The interconnection layer 526, which is composed of a plurality of layers of interconnections 525 formed through the interlayer insulating film 527, is formed on the surface side of the substrate 513. These pixels 2 and the interconnection layer 526 can be formed in a similar method to that of usual solid-state imaging device 1.

In the present embodiment, for example, the substrate 513 is provided that has the pixel forming region 512, which becomes a n-type surface region of 3 µm to 5 µm thickness, and a backside region 530 under the pixel forming region 512. Then, the light-receiving portion PD, the element isolation region 524, and the source/drain region (not shown) are formed in the pixel forming region 512 by ion implantation of desired impurity in a desired concentration from the surface side of the substrate 513. Then, the gate insulating film 529 composed of, for example, silicon oxide film is formed on the surface of the substrate 513, and then the gate electrode 528 composed of, for example, polysilicon, is formed in a desired region on the upper side of the gate insulating film 529. The process of forming the gate electrode 528 may be performed before the process of forming the light-receiving portion PD, the source/drain region and the like in the pixel forming region 512. In this case, the light-receiving portion PD and the source/drain region can be formed in the self-alignment using the gate electrode 528 as a mask. Alternatively, a sidewall composed of, for example, silicon oxide film, silicon nitride film, may be formed on the lateral side of the gate electrode 528.

In addition, the interconnection layer 526 can be formed by repeatedly performing the formation of the interlayer insulating film 527 composed of, for example, silicon oxide film, and the formation of the interconnection 525 composed of aluminum, copper and the like in a desired number of times after the formation of the gate electrode 28. At this time, the formation of a contact portion (not shown) that connects each interconnection to each other is also performed.

The backside region 530 is constituted in a structure where an undoped silicon layer 530a, an etching stopper layer 530b composed of p-type high-density impurity layer and the undoped silicon layer 530a are stacked in this sequence from the side of the pixel forming region 512. This etching stopper layer 530b can be formed by ion implantation of boron in high-density in a desired region of the undoped silicon layer 530a. Alternatively, a method may be used wherein the undoped silicon layer 530a is formed by the epitaxial growth method, and a p-type high-density impurity layer is formed in a desired region in the process of the formation. The backside region 530 of the present embodiment is constituted such that the thickness of the silicon layer 530a in the side contacting on the substrate 513 is about 2 µm to 5 µm, that of the etching stopper layer 530b is about 1 µm, and that of the silicon layer 530a formed on the etching stopper layer 530b is about 1 µm.

Figure 33:
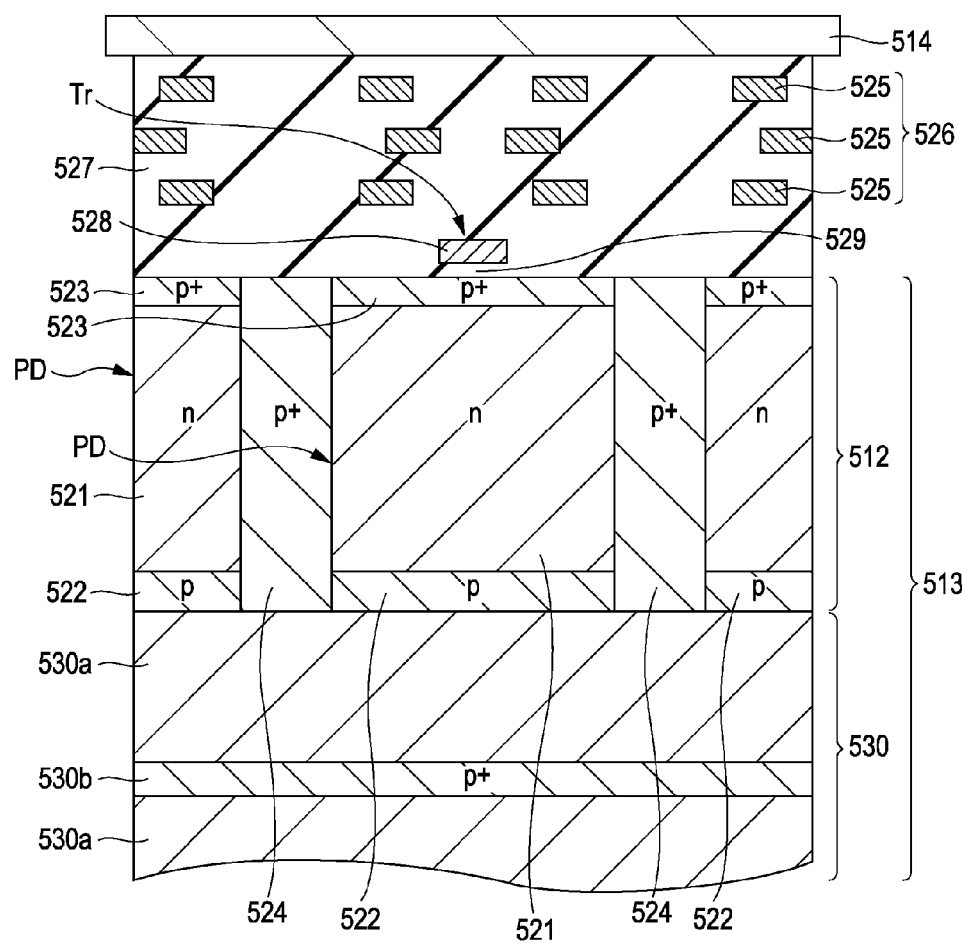
FIG. 33 is a manufacturing process diagram of the solid-state imaging device according to the sixteenth embodiment.

Next, as shown in FIG. 33, the support substrate 514 is anchored in the upper portion of the interconnection layer 526 by an organic adhesive or physical bonding by plasma irradiation.

Figure 34:
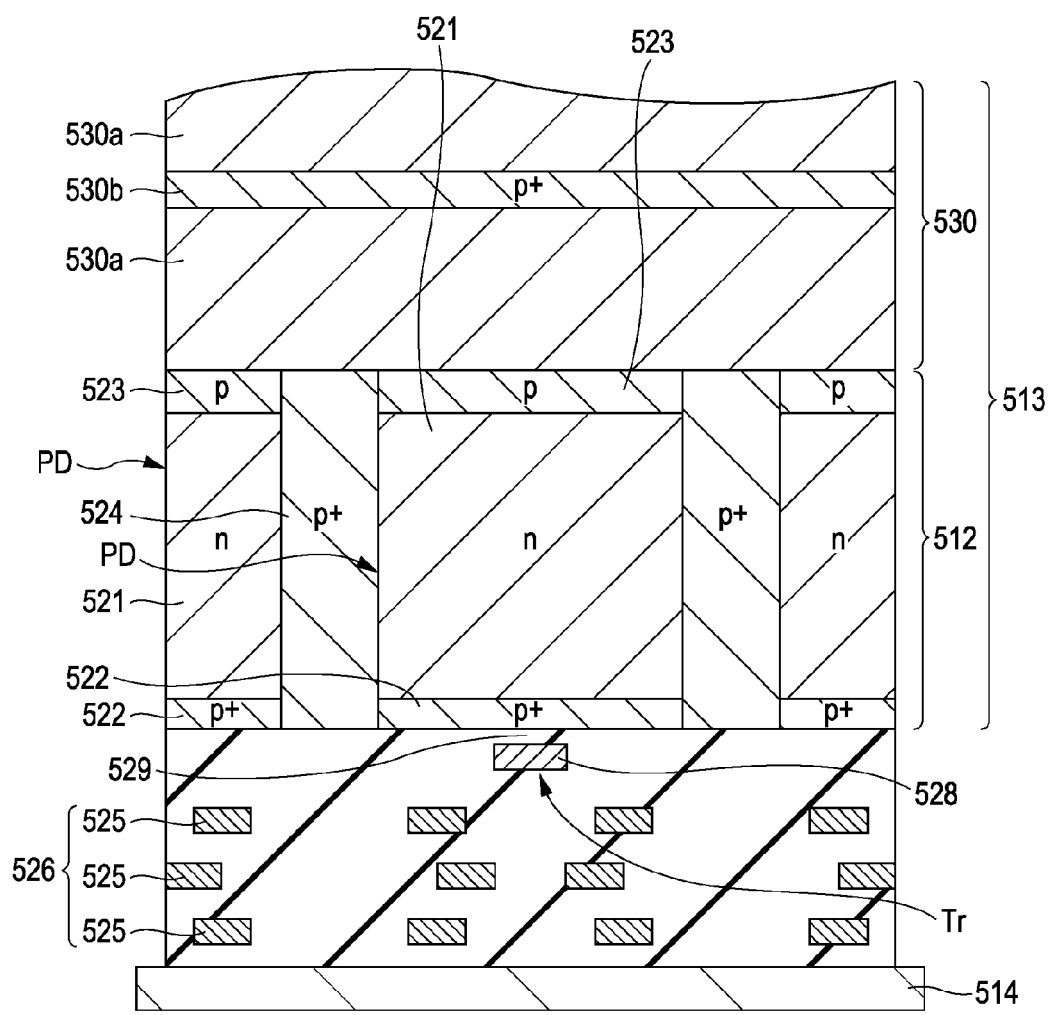
FIG. 34 is a manufacturing process diagram of the solid-state imaging device according to the sixteenth embodiment.

Then, as shown in FIG. 34, after the support substrate 514 is anchored, the element is inverted, and the upper surface of the backside region 530 is ground by a physical grinding method. At this time, the grinding is performed to an extent so as to not reach the etching stopper layer 530b.

Figure 35:
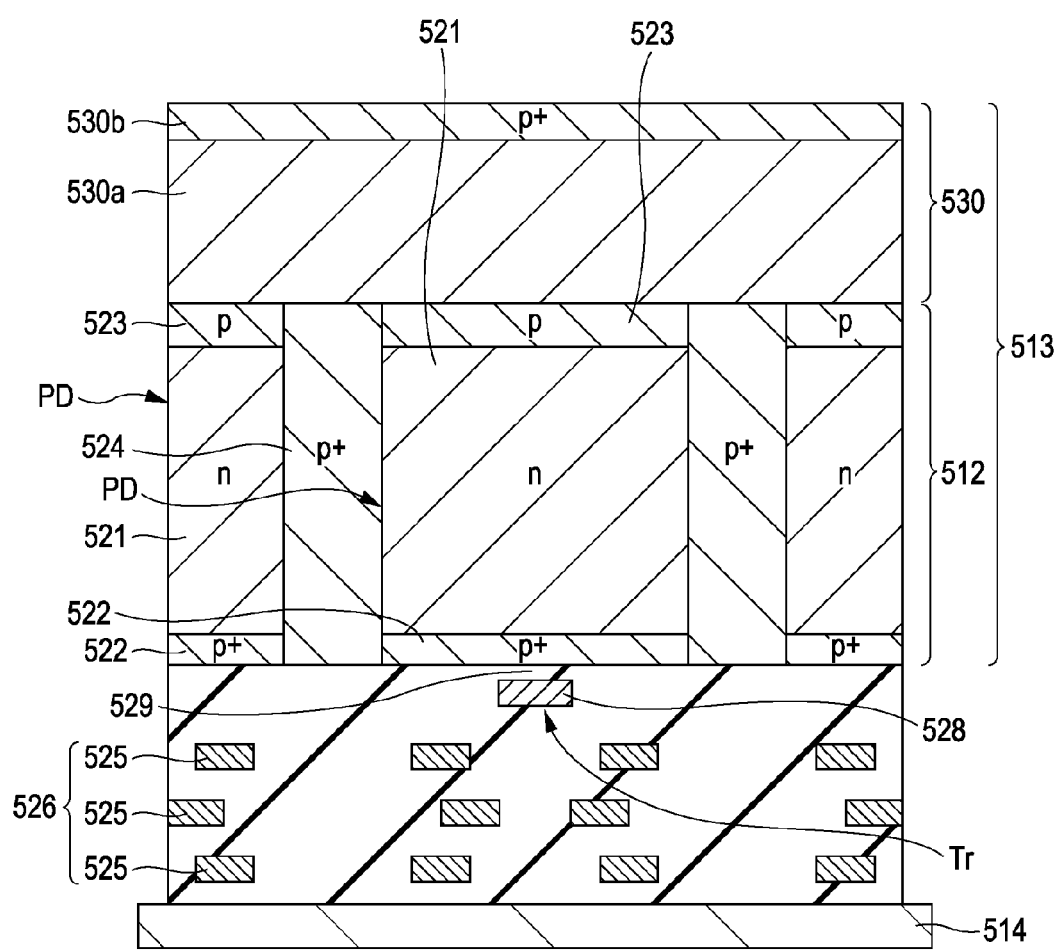
FIG. 35 is a manufacturing process diagram of the solid-state imaging device according to the sixteenth embodiment.

Next, the silicon layer 530a of the backside region 530 is etched by wet etching using arsenous acid. Thus, as shown in FIG. 35, the etching stops at the etching stopper layer 530b by the difference between the doping species of the undoped silicon layer 530a and the etching stopper layer 530b composed of the p-type high-density impurity layer. That is, only the silicon layer 530a, which is formed in the upper surface side of the backside region 530, is etched and removed.

Figure 36:
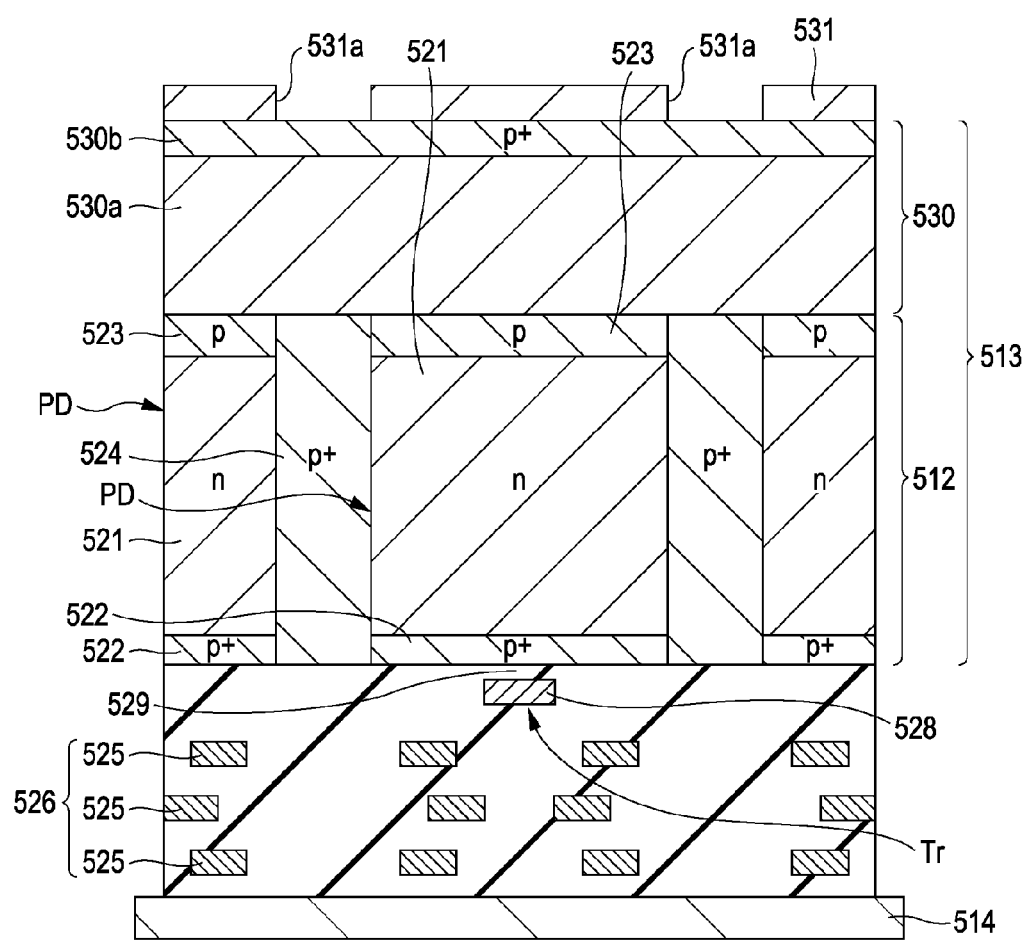
FIG. 36 is a manufacturing process diagram of the solid-state imaging device according to the sixteenth embodiment.

Next, as shown in FIG. 36, a photoresist layer 531 is formed in the upper portion of the backside region 530, and exposure and development are performed so as to form an aperture portion 531a in the region where the light-shielding portion 517 of the element isolation region 524 is formed. In this case, since the backside region 530 is etched and removed to the etching stopper layer 530b in the previous processes, the surface becomes smooth. Therefore, the surface of the photoresist layer 531 is also formed to be smooth, and thus exposure and development of the photoresist layer 531 are performed with a high degree of accuracy, which makes it possible to form a pattern of desired aperture portion 531a with better accuracy.

Next, a trench portion 519 that reaches desired depth from the backside of the pixel forming region 512, is formed through the backside region 530 by dry-etching using the photoresist layer 531 patterned in a desired shape as a mask as shown in FIG. 37F. The depth of the trench portion 519 may be formed in the depth as to shield the tilted light that is incident from the backside of the substrate 513 at the light receiving surface side as described above. In the present embodiment, the trench portion 519 is formed in the depth to the extent of, for example, 500 nm to 1000 nm from the backside of the substrate 513.

Figure 38:
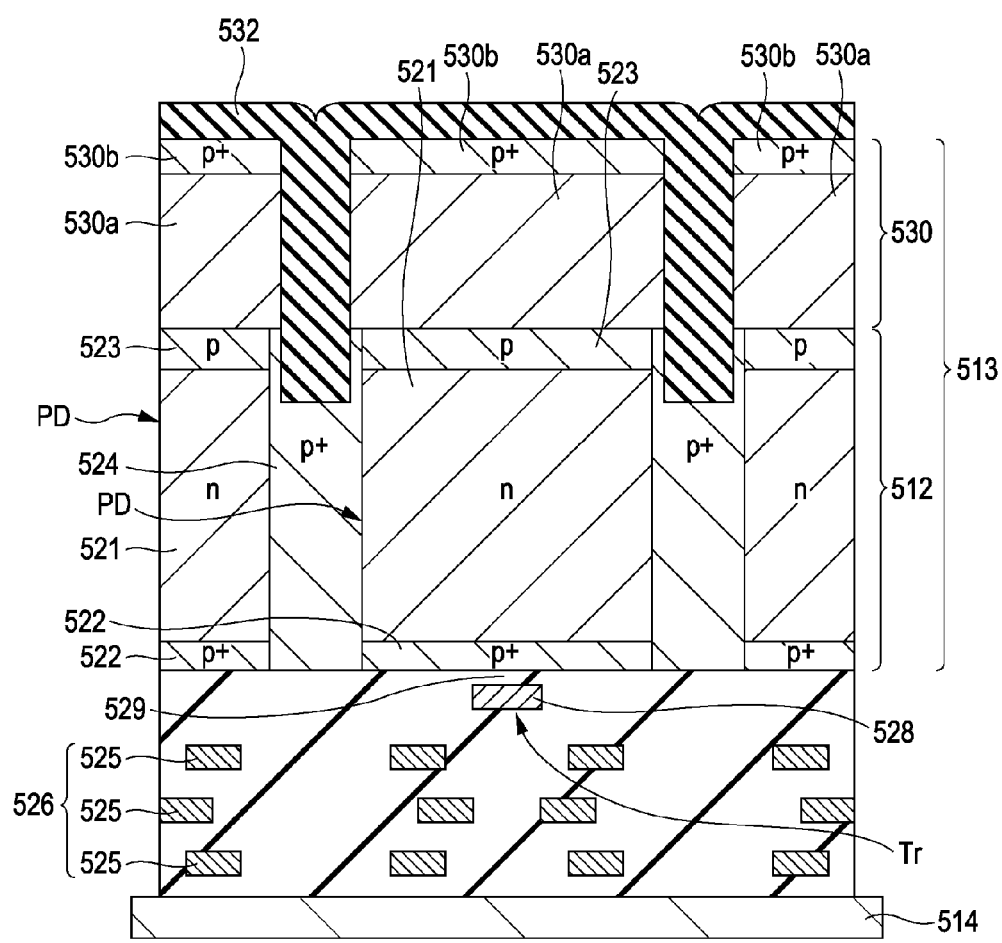
FIG. 38 is a manufacturing process diagram of the solid-state imaging device according to the sixteenth embodiment.

Next, as shown in FIG. 38, a burying film 532 composed of a silicon oxide film ($SiO_2$) or a silicon nitride film (SiN) is formed to bury the trench portion 519 using, for example, the CVD method.

Figure 39:
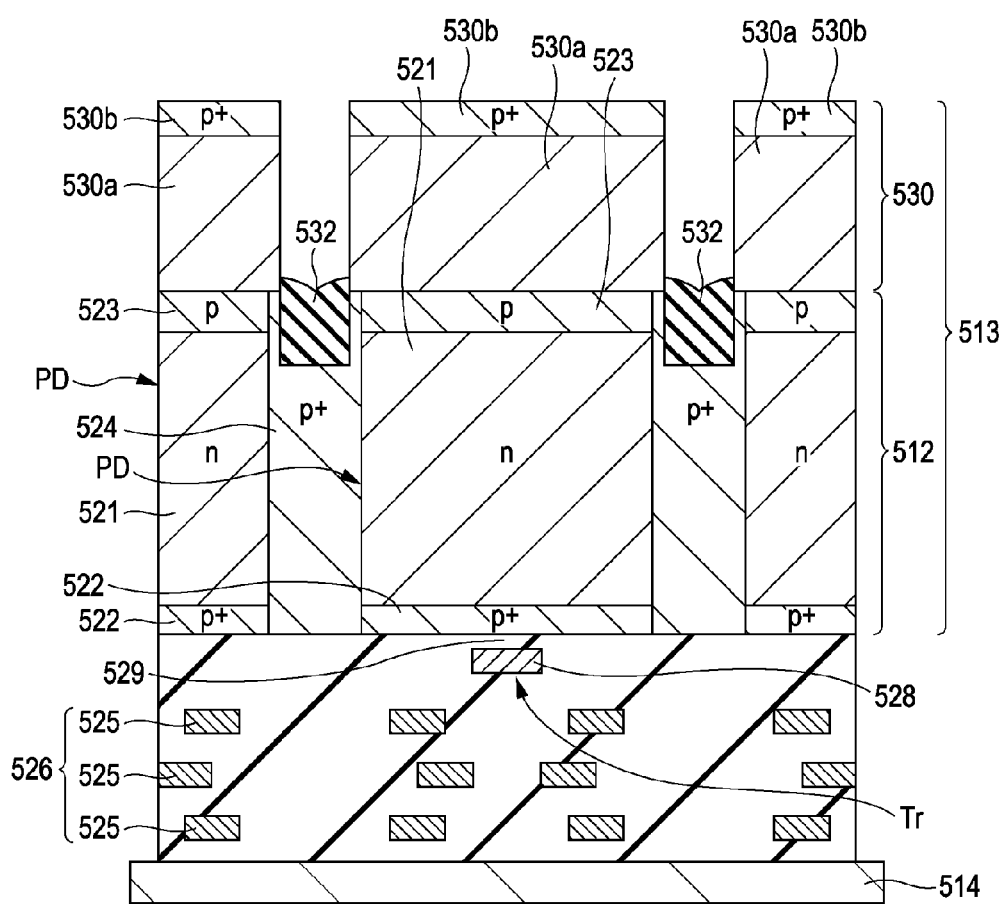
FIG. 39 is a manufacturing process diagram of the solid-state imaging device according to the sixteenth embodiment.

Next, as shown in FIG. 39, the burying film 532 is etched by etching it at a predetermined time with wet etching. At this time, the etching is finished in a state where the surface of the burying film 532 is projected in about 50 to 60 nm from the backside of the substrate 513.

Figure 40A:
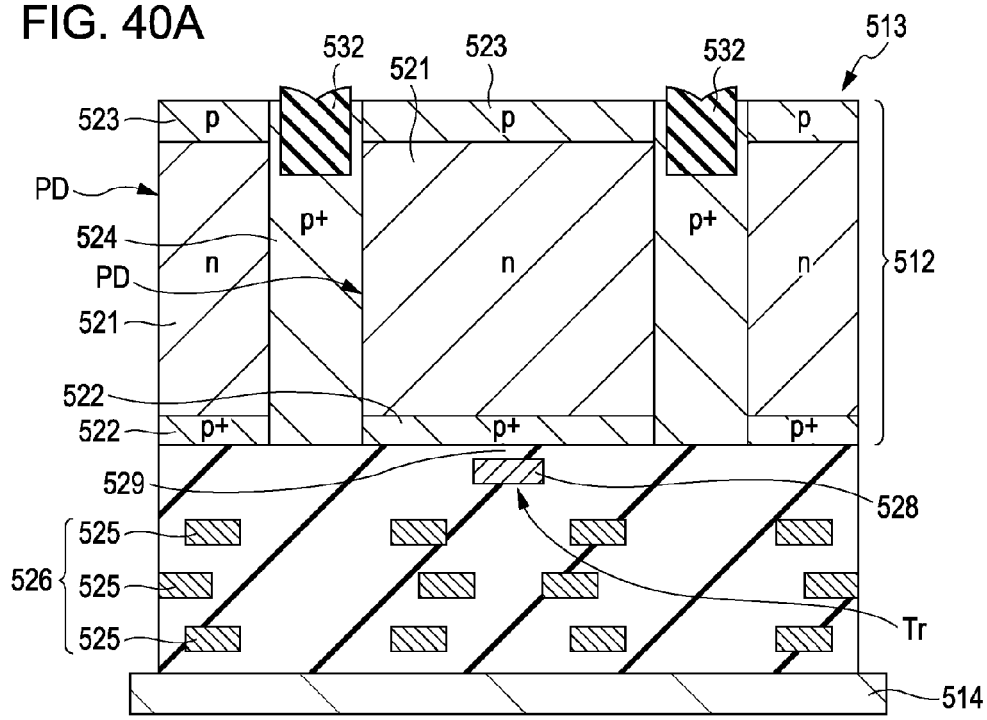
FIGS. 40A and 40B are manufacturing process diagrams of the solid-state imaging device according to the sixteenth embodiment.

Next, the backside region 530 is ground by the CMP method using the burying film 532 as a stopper, and the backside region 530 is made to have a thin wall. By this, the backside region 530 is removed as shown in FIG. 40A.

Figure 40B:
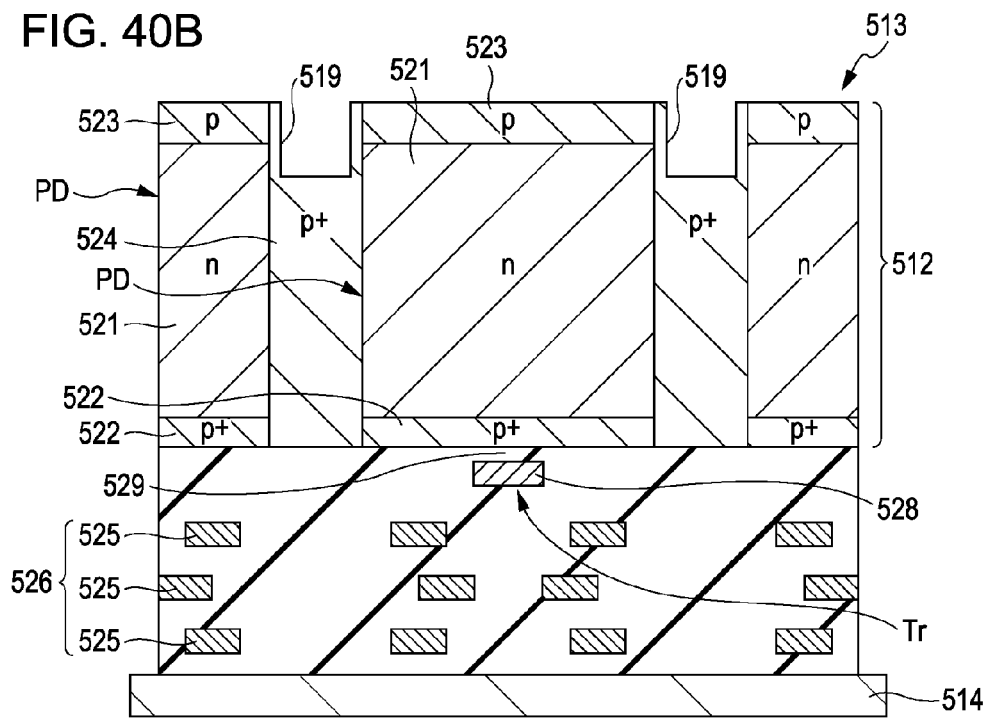

Next, the burying film 532 buried in the trench portion 519 is removed by wet etching as shown in FIG. 40B, and also the damaged layer is removed, which is generated in the previous processes such as the grinding process by the CMP method and the process of forming the trench portion 519. The chemical that removes the burying film 532 is hydrofluoric acid when the burying film 532 is $SiO_2$, or phosphoric acid when the burying film 532 is SiN. The damaged layer is preferably removed using an alkaline chemical such as ammonia water.

Next, as shown in FIG. 41A, the high-dielectric material film 518 is formed using the CVD method or the sputter method on the backside of the substrate 513 including the sidewall and the bottom surface of the trench portion 519. Subsequently, the light-shielding film 520 is formed using the CVD method on the whole surface including the trench portion 519 in which the high-dielectric material film 518 is formed, and the light-shielding film 520 is buried in the inside of the trench portion 519.

Next, as shown in FIG. 41B, the height of the light-shielding film 520 is adjusted by, for example, wet etching with acid chemical such as hydrochloric acid, sulfuric acid and the like. At this time, the height of the light-shielding film 520 is adjusted so that the surface of the light-shielding film 520 and the backside of the substrate 513 are in the same plane.

Then, a color filter layer 515 and the on-chip lens 516 are formed on the backside of the substrate 513 using usual method to complete the solid-state imaging device 1 of the present embodiment shown in FIG. 31.

As described above, the solid-state imaging device 1 of the present embodiment can be formed by a bulk substrate. A SOI (Silicon On Insulator) substrate is used in usual back-illuminated solid-state imaging device, whereas it can be formed by a bulk substrate, which is cheaper in cost than the SOI substrate, in the present embodiment. Therefore, the cost is reduced as there is no use of expensive SOI substrate.

In addition, in the solid-state imaging device 1 of the present embodiment, the substrate 513 is used as an example, which has the backside region 530 where the etching stopper layer 530b composed of the p-type high-density impurity layer is formed in the undoped the silicon layer 530a. However, the present embodiment is not limited to this, and alternatively, a substrate can be used that has various etching stopper layers. For example, SiC or SiGe layer may be also used as the etching stopper layer 530b.

In addition, the burying film 532, which is used as a stopper in the process of FIG. 38H, can be formed in the trench portion 19 in the manufacturing method of the solid-state imaging device 1 of the present embodiment. Thus, thinning of the backside region 530 is made easy in the process of FIG. 39I. Then, since thinning of the backside region 530 is made easy, the p-type high-density impurity layer, which is formed in the backside region 530, can be formed to be distant to some extent from the light-receiving portion PD formed on the substrate 513. Therefore, modulation of the carrier profile of the light-receiving portion PD of the pixel forming region 512, which occurs due to the heat in the diffusion process of the p-type high-density impurity layer that is the etching stopper layer 530b, can be suppressed.

In addition, the element isolation region 524, which is formed on the substrate 513, is formed by ion implantation of p-type impurity from the surface side of the substrate 513 in the manufacturing method of the solid-state imaging device 1 of the present embodiment. Therefore, it is difficult for a steep potential profile to be formed in the pixel forming region 512 in the deep position from the surface side (the backside of the substrate 513 in this case). Thus, on the backside of the substrate 513, there is a possibly that generated signal charge passes through the element isolation region 524 and leaks into the adjacent pixel 2, which causes color mixing or blooming. In the present embodiment, the light-shielding portion 517 is formed to be buried in the element isolation region 524 in the backside of the substrate 513. Therefore, the signal charge, which leaks into the adjacent pixel, can be physically shielded, and color mixing or blooming by transfer of the signal charge in the substrate 513 is suppressed in a region of the element isolation region 524 where element separating function is particularly weak.

18. Seventeenth Embodiment

Solid-State Imaging Device

Next, a solid-state imaging device in the seventeenth embodiment of the invention will be described. The solid-state imaging device of the present embodiment is a back-illuminated solid-state imaging device similar to the solid-state imaging device of the sixteenth embodiment. Thus, as overall constitution is similar to that of FIG. 7, explanation will not be repeated for the same ones.

Figure 42:
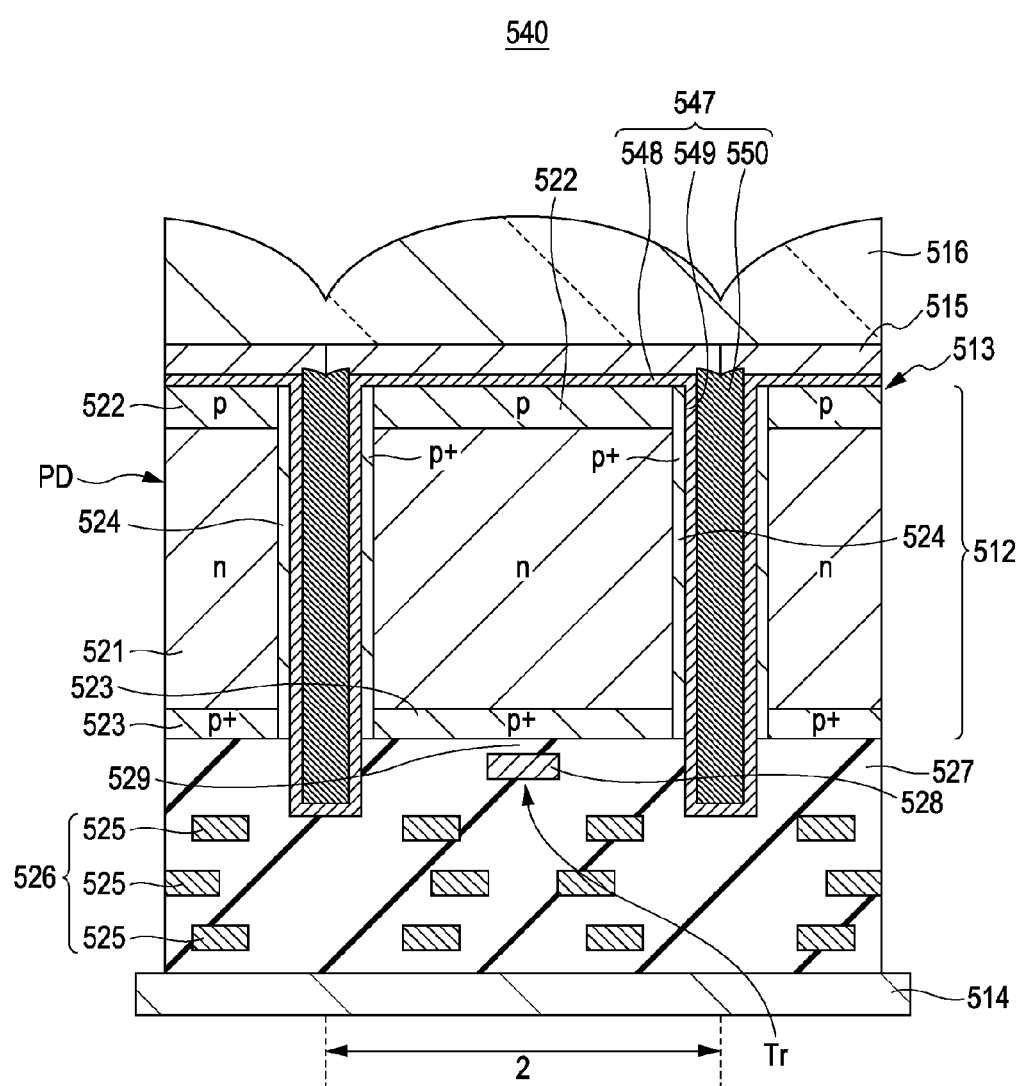
FIG. 42 is a cross-sectional configuration diagram in a pixel section of a solid-state imaging device according to a seventeenth embodiment of the invention.

FIG. 42 is a schematic cross-sectional configuration diagram of the main portion of the solid-state imaging device 540 in the present embodiment. The same symbols are assigned in FIG. 42 to the parts, which correspond to those in FIG. 31, and explanation will not be repeated therefor.

As shown in FIG. 42, in the solid-state imaging device 540 of the present embodiment, a light-shielding portion 547 is an example where it is formed to pass through the pixel forming region 512 where the light-receiving portion PD is formed. In the present embodiment shown in FIG. 42, the light-shielding portion 547 is an example where it is formed in the depth to reach the interconnection 525 of the first lower layer (the side of the substrate 513) of the interconnection layer 526. However, various constitutions are possible as long as the depth is such one that the interconnection layer 526 is reached.

Figure 37:
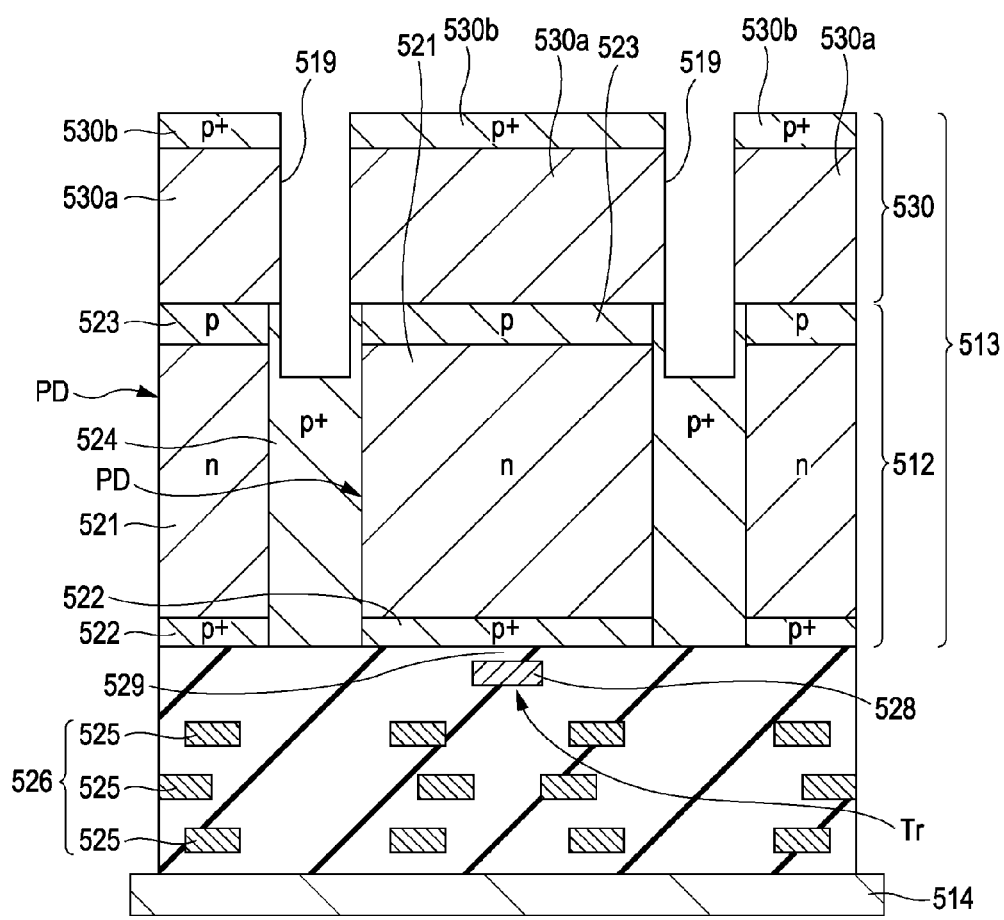
FIG. 37 is a manufacturing process diagram of the solid-state imaging device according to the sixteenth embodiment.

In the manufacturing method of the solid-state imaging device 540 of the present embodiment, the trench portion 549 is formed to pass through the substrate 513 in the depth to reach the interconnection 525, which is closest to the substrate 513 out of the interconnection of the interconnection layer 526 in the process of FIG. 37 shown in the sixteenth embodiment. Then, the light-shielding portion 547 can be formed by burying the high-dielectric material film 548 and the light-shielding film 550 into the trench portion 549 in a similar method to that of the solid-state imaging device 1 of the sixteenth embodiment. The materials that constitute the solid-state imaging device 540 of the present embodiment may be similar to those used in the sixteenth embodiment material.

In the solid-state imaging device 540 of the present embodiment, each pixel 2, which is formed on the substrate 513, is isolated by the light-shielding portion 547 even in a deep position from the light-incident side, by forming the light-shielding portion 547 in the depth to reach the interconnection layer 526. This allows more suppressing of the incidence of the tilted light to the adjacent pixel 2, and further reduces generation of flare or color mixing. In addition, each pixel 2 is isolated by the light-shielding portion 547 even in the inside of the substrate 513. Therefore, generation of blooming can be also suppressed due to the inflow of the generated excess signal charge to an adjacent pixel when the strong light is applied.

Furthermore, according to the solid-state imaging device 540 of the present embodiment, the light-shielding portion 547, which passes through the substrate 513 on which the light-receiving portion PD is formed, can be also used as a waveguide. That is, the incident light can be collected by the light-receiving portion PD in the substrate 513 by reflection of the incident light by the waveguide, and the light-collecting property is improved.

Other similar effects to those of the sixteenth embodiment are obtained.

In above-described sixteenth and seventeenth embodiments, examples have been described in which the present invention is applied to a CMOS type solid-state imaging device wherein the unit pixels, which detect the signal charges depending on the amount of the incident light as a physical amount, are disposed in a matrix shape. However, the invention is not limited to the application to the CMOS type solid-state imaging device. In addition, the invention is not limited to a general column type solid-state imaging device in which a column circuit is disposed for each pixel column of the pixel section in which pixels are formed in the two-dimensional matrix shape.

For example, the solid-state imaging device of the invention may be applied to the CCD type solid-state imaging device. In this case, the charge transfer portion of the CCD structure is constituted on the surface side of the substrate. Also in the case of the application to the CCD type solid-state imaging device, similar effects can be obtained to those of above-described sixteenth and seventeenth embodiment. In addition to this, incidence of the tilted light to the charge transfer portion can be suppressed by the constitution of the light-shielding portion, and thus generation of smear can be suppressed.

In addition, each pixel is mainly formed of the n-channel MOS transistor in above-described sixteenth and seventeenth embodiments. However, each pixel may be also formed of the p-channel MOS transistor. In this case, the conductivity type is inverted in each of the figures.

In addition, the invention is not limited to the application to the solid-state imaging device that detects the distribution of the incident light amount of the visible light and captures images, but may be also applied to a solid-state imaging device that detects distribution of the incident amount of infrared light or X ray, or particle and the like, and captures images. In addition, in a broad sense, the invention may be also applied to a general solid-state imaging device such as the fingerprint detection sensor that detects distribution of other physical amounts such as pressure and electrostatic capacity and captures images (a device that detects distribution of physical amount distribution).

Furthermore, the invention is not limited a solid-state imaging device that scans each unit pixel of the pixel section sequentially in the row unit, and reads pixel signal from each unit pixel. However, the invention may be also applied to the X-Y address type solid-state imaging device that selects any pixel in the pixel unit and reads signals from the selected pixel in the pixel unit.

In addition, the solid-state imaging device may be formed as a single chip, and may be also formed as a module shape that has image capturing function with the pixel section and the signal processing portion or optical system packaged as a whole.

In addition, the invention is not limited to the application to the solid-state imaging device, but may be also applied to an imaging device. Herein, the imaging device refers to an electronic apparatus that has image-capturing function such as a camera system, e.g., digital still camera or video camera, a cellular phone. In addition, the imaging device may be in the form of aforementioned module shape mounted to an electronic apparatus, i.e., camera module.

19. Eighteenth Embodiment

Electronic Apparatus

Next, an electronic apparatus in the eighteenth embodiment of the invention will be described. FIG. 43 is a schematic configuration diagram of an electronic apparatus 200 in the eighteenth embodiment of the invention.

The electronic apparatus 200 of the present embodiment is an example where the solid-state imaging device 1 in above-described sixteenth embodiment of the invention is a digital camera that has the function of capturing still image.

The electronic apparatus 200 in the present embodiment has the solid-state imaging device 1, an optical lens 210, a shutter device 211, a drive circuit 212 and a signal processing circuit 213.

The optical lens 210 forms an image of the image light (incident light) from a photographic subject on the image capturing surface of the solid-state imaging device 1. By this, the signal charges are accumulated in the solid-state imaging device 1 for a certain time.

The shutter device 211 controls the light irradiation period and the light shielding period in the solid-state imaging device 1.

The drive circuit 212 supplies drive signals that control the transfer operation of the solid-state imaging device 1 and the shutter operation of the shutter device 211. The signal transfer of the solid-state imaging device 1 is performed by the drive signal (timing signal) supplied from the drive circuit 212. The signal processing circuit 213 performs various types of the signal processing. The image signal on which the signal processing has been performed, is stored on a storage medium such as memory, or output onto a monitor.

In the solid-state imaging device 1 in the electronic apparatus 200 of the present embodiment, generation of flare or color mixing, and blooming is suppressed, and thus the image quality is improved.

As described above, the electronic apparatus 200, to which the solid-state imaging device 1 can be applied, is not limited to a camera, but may be applied to a digital still camera, and furthermore imaging device such as a camera module for a mobile device, for example, a cellular phone.

The present embodiment is constituted such that the solid-state imaging device 1 is used in an electronic apparatus. However, the solid-state imaging device in above-described seventeenth embodiment may be also used.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
    a semiconductor substrate having a pixel region and a peripheral region disposed outside of the pixel region, and a first side as a light incident side and a second side opposite the first side;
    a silicon oxide film disposed above the first side of the semiconductor substrate;
    a hafnium oxide film disposed on the silicon oxide film;

a light-shielding film disposed above the hafnium oxide film;
a titanium nitride layer disposed between the hafnium oxide film and the light-shielding film at the peripheral region in a cross-section view;
a plurality of photodiodes disposed in the semiconductor substrate in the pixel region;
a plurality of isolation regions, wherein a photodiode is disposed between a first isolation region and a second isolation region in the cross-section view; and
a metallic oxide film disposed on at least a portion of the first side of the semiconductor substrate, wherein the metallic oxide film extends continuously from the first isolation region to the second isolation region along the first side of the semiconductor substrate.

2. The imaging device according to claim 1, wherein the metallic oxide is selected from the group consisting of hafnium oxide, tantalum pentoxide, zirconium dioxide and combinations thereof.

3. The imaging device according to claim 1, wherein the metallic oxide is high-dielectric material film.

4. The imaging device according to claim 1, further comprising:
a plurality of transistors, wherein at least one transistor in the plurality of transistors is shared by at least first and second photodiodes in the plurality of photodiodes.

5. The imaging device according to claim 1, further comprising:
an insulating layer disposed between a color filter and the first side of the semiconductor substrate.

6. The imaging device according to claim 1, further comprising:
a planarization layer disposed between a color filter and the first side of the semiconductor substrate.

7. The imaging device according to claim 1, further comprising:
a light-shielding portion disposed between a color filter and the first side of the semiconductor substrate.

8. The imaging device according to claim 1, further comprising:
a plurality of transistors, wherein at least one of the transistors in the plurality of transistors is a shared transistor, and wherein the shared transistor is a reset transistor allowing charge to be selectively discharged from a floating diffusion to a circuit node.

9. The imaging device according to claim 1, further comprising:
a plurality of transistors, wherein at least one of the transistors in the plurality of transistors is a shared transistor, and wherein the shared transistor is an amplification transistor coupled to a floating diffusion such that a signal corresponding to a potential of the floating diffusion is output to a signal line.

10. The imaging device according to claim 9, wherein at least another one of the transistors in the plurality of transistors is a shared transistor, and wherein the shared transistor is a select transistor that selectively enables operation of the amplification transistor.

11. The imaging device according to claim 1, further comprising:
a plurality of transistors, wherein the second isolation region is disposed between at least one photodiode in the plurality of photodiodes and at least one shared transistor in the plurality of transistors.

12. The imaging device according to claim 11, wherein the second isolation region is a shallow trench isolation region.

13. The imaging device according to claim 1, further comprising:
a plurality of transistors; and
a vertical driving circuit, wherein the vertical driving circuit is configured to drive the transistors.

14. The imaging device according to claim 1, further comprising:
a plurality of on-chip lenses disposed adjacent the first side of the semiconductor substrate.

15. The imaging device according to claim 14, further comprising:
a color filter, wherein the color filter is disposed between the on-chip lenses and the first side of the semiconductor substrate.

16. The imaging device according to claim 15, wherein the color filter includes filters of at least two different colors selected from green, red, and blue.

17. The imaging device according to claim 1, further comprising:
a transparent planarization layer, disposed between a color filter and the first side of the semiconductor substrate, wherein the planaraization layer comprises organic material.

18. An imaging device comprising:
a semiconductor substrate having a pixel region and a peripheral region disposed outside of the pixel region, and a first side as a light incident side and a second side opposite the first side;
a silicon oxide film disposed above the first side of the semiconductor substrate;
a hafnium oxide film disposed on the silicon oxide film;
a light-shielding film disposed above the hafnium oxide film;
a titanium nitride layer disposed between the hafnium oxide film and the light-shielding film at the peripheral region in a cross-section view;
a plurality of photodiodes disposed in the semiconductor substrate in the pixel region;
a plurality of isolation regions, wherein an isolation region includes a p-type impurity region and is disposed between adjacent photodiodes in the cross-section view; and
a metallic oxide film that extends continuously from a first isolation region to a second isolation region along the first side of the semiconductor substrate.

19. The imaging device according to claim 18, wherein the metallic oxide is selected from the group consisting of hafnium oxide, tantalum pentoxide, zirconium dioxide and combinations thereof.

20. The imaging device according to claim 18, wherein the metallic oxide is high-dielectric material film.

21. The imaging device according to claim 18, further comprising:
a plurality of transistors, wherein at least one transistor in the plurality of transistors is shared by at least first and second photodiodes in the plurality of photodiodes.

22. The imaging device according to claim 18, further comprising:
an insulating layer disposed between a color filter and the first side of the semiconductor substrate.

23. The imaging device according to claim 18, further comprising:
a planarization layer disposed between a color filter and the first side of the semiconductor substrate.

24. The imaging device according to claim 18, further comprising:

a light-shielding portion disposed between a color filter and the first side of the semiconductor substrate.

25. The imaging device according to claim 18, further comprising:
a plurality of transistors, wherein at least one of the transistors in the plurality of transistors is a shared transistor, and wherein the shared transistor is a reset transistor allowing charge to be selectively discharged from a floating diffusion to a circuit node.

26. The imaging device according to claim 18, further comprising:
a plurality of transistors, wherein at least one of the transistors in the plurality of transistors is a shared transistor, and wherein the shared transistor is an amplification transistor coupled to a floating diffusion such that a signal corresponding to a potential of the floating diffusion is output to a signal line.

27. The imaging device according to claim 26, wherein at least another one of the transistors in the plurality of transistors is a shared transistor, and wherein the shared transistor is a select transistor that selectively enables operation of the amplification transistor.

28. The imaging device according to claim 18, further comprising:
a plurality of transistors, wherein the second isolation region is disposed between at least one photodiode in the plurality of photodiodes and at least one shared transistor in the plurality of transistors.

29. The imaging device according to claim 28, wherein the second isolation region is a shallow trench isolation region.

30. The imaging device according to claim 18, further comprising:
a plurality of transistors; and
a vertical driving circuit, wherein the vertical driving circuit is configured to drive the transistors.

* * * * *